(12) United States Patent
Shimada et al.

(10) Patent No.: US 7,090,957 B2
(45) Date of Patent: Aug. 15, 2006

(54) POLYMERIZABLE COMPOSITION AND PLANOGRAPHIC PRINTING PLATE PRECURSOR USING THE SAME

(75) Inventors: Kazuto Shimada, Shizuoka-ken (JP); Takahiro Goto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/658,429

(22) Filed: Sep. 10, 2003

(65) Prior Publication Data

US 2004/0062939 A1   Apr. 1, 2004

(30) Foreign Application Priority Data

Sep. 11, 2002 (JP) ............................. 2002-265466
Sep. 11, 2002 (JP) ............................. 2002-265467
Sep. 27, 2002 (JP) ............................. 2002-283912

(51) Int. Cl.
   *G03F 7/021* (2006.01)
(52) U.S. Cl. .................. 430/163; 430/175; 430/176; 430/281.1; 430/288.1; 430/302
(58) Field of Classification Search ............... 430/163, 430/175, 176, 281.1, 288.1, 302
   See application file for complete search history.

(56) References Cited

U.S. PATENT DOCUMENTS

| 4,046,577 | A |   | 9/1977  | Muzyczko et al. |           |
|-----------|---|---|---------|-----------------|-----------|
| 5,112,743 | A | * | 5/1992  | Kamiya et al.   | 430/175   |
| 5,278,022 | A | * | 1/1994  | Wade et al.     | 430/176   |
| 5,344,739 | A | * | 9/1994  | Kanda et al.    | 430/175   |
| 5,567,568 | A | * | 10/1996 | Nishioka        | 430/162   |
| 2002/0025489 | A1 |  | 2/2002 | Shimada et al. |           |
| 2002/0189476 | A1 | * | 12/2002 | Aoshima       | 101/453   |
| 2003/0186174 | A1 | * | 10/2003 | Nagase        | 430/325   |

FOREIGN PATENT DOCUMENTS

| JP | 8-272087 | 10/1996 |
| JP | 08-272087 A | 10/1996 |
| JP | 8-292558 | 11/1996 |
| JP | 08-292558 A | 11/1996 |
| WO | WO 94/23954 | 10/1994 |

\* cited by examiner

*Primary Examiner*—John S. Chu
(74) *Attorney, Agent, or Firm*—Sughrue Mion, PLLC

(57) ABSTRACT

The present invention provides a polymerizable composition comprising (A) a compound including a polymerizable unsaturated group and (B) a macromolecular compound including, at a side chain thereof, a structure represented by the following general formula (I). The present invention also provides a negative type planographic printing plate precursor responsive to an infrared laser, the precursor being superior in recording sensitivity and printing durability and using the polymerizable compound as a recording layer.

General Formula (I)

$$Z^- M^+$$

wherein $Z^-$ represents $COCOO^-$, $COO^-$, $SO_3^-$ or $SO_2$—$N^-$—$R$ where R represents a monovalent organic group and $M^{3O}$ represents an onium cation.

7 Claims, 4 Drawing Sheets

POLYMERIZABLE COMPOSITION AND PLANOGRAPHIC PRINTING PLATE PRECURSOR USING THE SAME

CROSS-REFERENCE TO RELATED APPLICATION

This application claims priority under 35 USC 119 from Japanese Patent Application Nos. 2002-265466, 2002-265467, and 2002-283912, the disclosures of which are incorporated by reference herein.

BACKGROUND OF THE INVENTION

1. Field of the Invention

The present invention relates to a polymerizable composition which is curable by exposure to heat or infrared rays and a planographic printing plate precursor using the polymerizable composition. Particularly, the present invention relates to a polymerizable composition (including a novel compound) being superior in curability and a negative type planographic printing plate precursor provided with a recording layer comprising the polymerizable composition and having high curability.

2. Description of the Related Art

The development of lasers in recent years has been remarkable. Particularly, as to solid lasers and semiconductor lasers (hereinafter may be referred to as "infrared laser" which radiate infrared whose wavelength is in a range of 760 to 1200 nm, high output and small-sized lasers are now easily available. In a planographic printing field, in particular, these infrared lasers are very useful as a recording light source when a printing plate is directly made by digital data of, for example, computers. Recently, there has been an increased demand for image recording materials consisting of a highly sensitive polymerizable composition, specifically, for negative type image recording materials whose solubility to a developer is greatly deteriorated by exposure to infrared rays.

Generally, negative type image recording materials which are recordable by exposure to infrared rays contain; a photothermal converting agent which absorbs infrared energy and converts the energy into heat; a polymerization initiator, generating radicals by the heat generated by this photothermal converting agent and; a polymerizable compound which is polymerized by the action of the generated radicals as a polymerization initiator. Such negative type image recording materials utilizes a recording system in which the recording layer (image recording materials) of the exposure portion is cured along with the initiation and progress of a polymerization reaction of this polymerizable compound, to form an image. A negative type image recording material like this has poorer image forming ability than a positive type image recording material in which the recording layer is solubilized by the energy of infrared light. Therefore, in order to promote a curing reaction by polymerization to form a strong image portion, such a negative type image recording material as described above is usually subjected to heat treatment prior to a developing step.

An image recording material comprising a photothermal converting agent, an acid generator, a resol resin and a novolac resin is described in U.S. Pat. No. 5,340,699. Such a negative type image recording material must also be subjected to heat treatment after exposing to an infrared laser for the formation of an image. Therefore, a negative type image recording material which needs no heat treatment after being exposed has been desired.

As a negative type recording material which needs no heat treatment, a thermal polymerization based image recording material using, as the polymerization initiator, a known polymerization initiator such as peroxides and azobisnitrile type compounds is known (see, for example Patent Document 1). When using these known azo compounds or peroxides or the like, although image forming ability is improved, there arises a problem that recording sensitivity and printing durability after developing are unsatisfactory, and in the case of using a highly sensitive polymerization initiator, there arises another problem that an undesirable polymerization curing reaction proceeds due to the influence of the storage environment, whereby contamination is likely to occur in the non-image portion of a print product.

Also, a recording material, which comprises a cyanine dye having a specific structure, an iodonium salt and an addition-polymerizable compound having an ethylenic unsaturated double bond and needs no heat treatment after image-wise exposure, is known (see, for example, Patent Document 2). This image recording material, however, has the problem that polymerization inhibition is caused by oxygen in air at the time of a polymerization reaction, leading to a reduction in sensitivity and insufficient strength of a formed image portion. A composition containing an ethylenic unsaturated compound and a polymerization initiator provided with an onium salt having a specific counter anion has been proposed, to solve these problems (see, for example, Patent Documents 3, 4 and 5). However, still higher printing durability and sensitivity are needed at present.

[Patent Document 1]
  Japanese Patent Application Laid-Open (JP-A) No. 8-108621

[Patent Document 2]
  Japanese Patent Publication (JP-B) No. 7-103171

[Patent Document 3]
  JP-A No. 2001-34742

[Patent Document 4]
  JP-A No. 2002-6482

[Patent Document 5]
  JP-A No. 2002-148790

On the other hand, among those which are selectively sensitive to infrared light, as the positive type image recording material whose solubility at an exposed portion (non-image portion) to an aqueous alkali solution is increased, a heat-responsive resist material making use of a phase change of a novolac resin is known (see, for example, Patent Document 6). However, the heat-responsive resist material is easily scratched and thus has a problem in its handling.

As a negative type image recording material having high scratch resistance, an image recording material which is provided with a recording layer containing an infrared absorber, an onium salt and a polymerizable compound and needs no preheating when an image is formed, has been proposed (see, for example, Patent Document 7). According to this technique, a certain degree of printing durability is obtained, even if preheating is not conducted. However, a negative image recording material of this type has a problem in that printing durability is deteriorated particularly when a cleaner is used, and thus printing durability thereof must be enhanced.

[Patent Document 6]
  JP-A No. 9-43847

[Patent Document 7]
JP-A No. 2001-133969

A compound having a COCOO group, which compound solves the above-mentioned problems in image forming materials using the conventional polymerizable composition, is known as a photo (polymerization) initiator. However, this polymerization initiator has insufficient sensitivity and therefore studies of enhancing the sensitivity thereof has been made. As the compound having a COCOO group, a polymer containing a COCOO unit is known (see, for example, Patent Document 8). The COCOO unit described herein has a COCOOH group or a structure such as COCOO—$NR_4^+$ and therefore has only insufficient sensitivity as a photoinitiator.

Also, an image formation method using a radical generator such as azo compounds and peroxides is also known (see, for example, Patent Document 9). However, the radical generator used herein has insufficient sensitivity and also has a problem concerning a long-term stability.

Also, a recording material which comprises a cyanine dye having a specific structure, an iodonium salt and an addition-polymerizable compound having an ethylenic unsaturated double bond and needs no heat treatment after image-wise exposure is known (see, for example, Patent Document 10). This image recording material, however, has a problem that polymerization inhibition is caused by oxygen in air at the time of a polymerization reaction, leading to a reduction in sensitivity and insufficient strength of a formed image portion.

To solve these problems, compositions containing a polymerization initiator provided with an onium salt having a specific carboxylic acid anion and an ethylenic unsaturated compound is known (see, for example, Patent Documents 11 and 12). These compositions, however, have problems concerning curability (high printing durability) and sensitivity. Therefore, a polymerization initiator which can generate radicals by light or heat in a highly sensitive manner, can rapidly cause a curing reaction and make the reaction proceed has been desired.

[Patent Document 8]
U.S. Pat. No. 40,465,778

[Patent Document 9]
JP-A No. 8-108621

[Patent Document 10]
JP-B No. 7-103171

[Patent Document 11]
JP-A No. 2001-34742

[Patent Document 12]
JP-A No. 2002-148790

SUMMARY OF THE INVENTION

An object of the present invention made in consideration of the above drawbacks of conventional technologies is to provide a novel macromolecular compound which can generate radicals by the action of light or heat in a highly sensitive manner and can rapidly cause and develop a curing reaction.

Another object of the invention is to provide, by using the above-mentioned macromolecular compound, a polymerizable composition which is useful as a recording layer of a negative type planographic printing plate precursor responsive to an infrared laser, has excellent image forming ability and can be cured in a highly sensitive manner.

A further object of the invention is to provide a planographic printing plate precursor which uses the above polymerizable composition as a recording layer and is superior in recording sensitivity and printing durability.

As a result of the keen study, the inventors of the present invention have found a polymerization initiator having a specific structure. The inventors have also found that the above three objects can be attained when a polymerizable composition curable, by exposure to heat or infrared rays, contains the above-described polymerization initiator having a specific structure. The invention is based on these discoveries.

Specifically, according to a first aspect of the invention, there is provided a polymerizable composition comprising:
(A) a compound including a polymerizable unsaturated group; and
(B) a macromolecular compound including, at a side chain thereof, a structure represented by the following general formula (I):

General Formula (I)

wherein $Z^-$ represents $COCOO^-$, $COO^-$, $SO_3^-$ or $SO_2$—$N^-$—R where R represents a monovalent organic group. $M^+$ represents an onium cation.

According to a second aspect of the invention, the macromolecular compound (B) including, at a side chain thereof, the structure represented by the general formula (I) preferably has a structural unit (II) represented by the following general formula (II):

wherein X represents a hydrogen atom, a monovalent organic group, a hydroxyl group, a urethane group, a urea group, a halogen atom, an amino group, an amide group, a sulfonyl group or a sulfonate group, Y represents a divalent organic connecting group, n denotes 0 or 1

$Z^-$ represents $COCOO^-$, $COO^-$, $SO_3^-$ or $SO_2$—$N^-$—R where R represents a monovalent organic group. $M^+$ represents an onium cation. $M^+$ may be selected from sulfonium, iodonium, diazonium and azinium.

It is preferable that the macromolecular compound (B) including, at a side chain thereof, the structure represented by the general formula (I), which is used in the polymerizable composition, has a weight-average molecular weight (Mw) of 1,000 to 50,000 (more preferably 2,000 to 40,000) and, from the viewpoint of the balance between reactivity and stability, includes $COCOO^-$ as $Z^-$.

The content of the component (B) in the polymerizable composition is preferably in the range of 0.5 to 50% by mass as a solid.

According to a third aspect of the invention, there is provided a planographic printing plate precursor comprising a recording layer formed on a substrate, the recording layer comprising a polymerizable composition containing (A) a compound having a polymerizable unsaturated group and (B) a macromolecular compound including, at a side chain thereof, a structure represented by the following general formula (I):

General Formula (I)

$Z^- M^+$ wherein $Z^-$ represents $COCOO^-$, $COO^-$, $SO_3^-$ or $SO_2$—$N^-$—R where R represents a monovalent organic group. $M^+$ represents an onium cation.

According to a fourth aspect of the invention, (C) a compound having a maximum absorption wavelength at 700 to 1200 nm is contained in the polymerizable composition. This results in more improved recording sensitivity and, as the compound (C) functions as a photothermal converting agent or as a sensitizer, images can be recoreded on the planographic printing plate precursor by using infrared laser.

Although an image can be formed by using a conventional onium salt which is generally used as a polymerization iniator, such a conventional compound, selected in consideration of a balance between image formation and stability, is not necessarily all decomposed during exposure and a portion of the onium salt compound may remain undecomposed. The presence of such an undecomposed onium salt compound as describe above, as a low molecular weight compound, in a film of a polymerizable composition may cause a decrease in film strength. If such a polymerizable composition is used in a recording layer, the printing durability of a planographic printing plate is deteriorated.

In the invention, a decrease in film strength due to the residual of an unreacted low molecular weight compound can be suppressed in an efficient manner by using, as an intiator, the macromolecular compound including, at a side chain thereof, a functional group capable of initiating polymerization. Therefore, film strength and further printing durability in the case of using the polymerizable composition as a recording layer of a planographic printing plate precursor can be maintained at a high level.

Also, coagulation of the polymerizable composition in the film are facilitated when the polymerization initiator has a structure of a macromolecular compound, although the action or mechanism therein is not known. It is therefore considered that in the case of using the compound (C) having a maximum absorption wavelength at 700 to 1200 nm, in the polymerizable composition of the invention, these dyes are easily interacted with the onium salt by using a dye having a charge such as a cyanine dye or an oxonol type dye together, and photothermal conversion efficiency is improved by the localization of the dye and the polymerization initiator, so that the decomposition efficiency of the polymerization initiator is improved whereby a more improved sensitivity is attained.

In short, the effect of the invention is outstandingly enhanced by combining the polymerizable composition with an infrared absorber.

The inventors of the invention have also found, as a result of earnest studies, that the aforementioned problems can be solved more efficiently by selecting a compound having a specific molecular weight as a radical generator.

According to a fifth aspect of the invention, there is provided a photo-sensitive composition comprising (A) a compound generating radicals by the action of light or heat, (B) a polymerizable compound and (C) an infrared absorbing compound, wherein (A) the compound generating radicals by the action of light or heat has a molecular weight in a range of 1,000 to 50,000 (inclusive of 1,000 and 50,000).

In a sixth aspect, the above macromolecular compound includes, at a side chain thereof, a structure represented by the following general formula (III):

General Formula (III)

$COCOO^- M^+$ wherein $M^+$ represents an onium cation selected from sulfonium, iodonium, diazonium and azinium.

In one preferred embodiment, the macromolecular compound having a structure represented by the general formula (III) has a structural unit represented by the following general formula (IV).

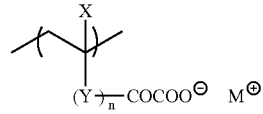

General formula (IV)

In the general formula (IV), the definitions of X and Y are the same as those in the above general formula (II) and explanations of X and Y are omitted.

The novel macromolecular compound according to the present aspect has an onium cation having a specific structure as the counter anion of the $COCOO^-$ unit. It is considered that the macromolecular compound is capable of initiating polymerization by light or heat, not only on a side of the polymer having the COCOO— unit but also on a side of the onium salt which is a counter ion. As a result, high sensitivity is attained.

Also, it is considered that when using an ionic dye or the like and an ionic polymer in combination, high sensitivity is attained due to an ionic interaction or the like.

The novel macromolecular compound according to the present aspect has a polymer structure and is capable of initiating polymerization. It is therefore considered that, even if a portion of the onium salt compound remains undecomposed during exposure, a decrease in film strength caused by a low-molecular-weight-onium salt compound residue can effectively be suppressed.

Moreover, the macromolecular compound has the advantage that, even if a portion which is not easily cured exists depending on a state of the temperature distribution after heating and/or a state of the transmittance of light, the strength of such a portion of the recording layer can be enhanced by using a polymer-type polymerization initiator.

It is to be noted that the term "light or heat" polymerization represents not only a polymerization reaction by either one of light and heat but also a polymerization by both of light and heat, depending on the application.

DETAILED DESCRIPTION OF THE INVENTION

Figure 1:
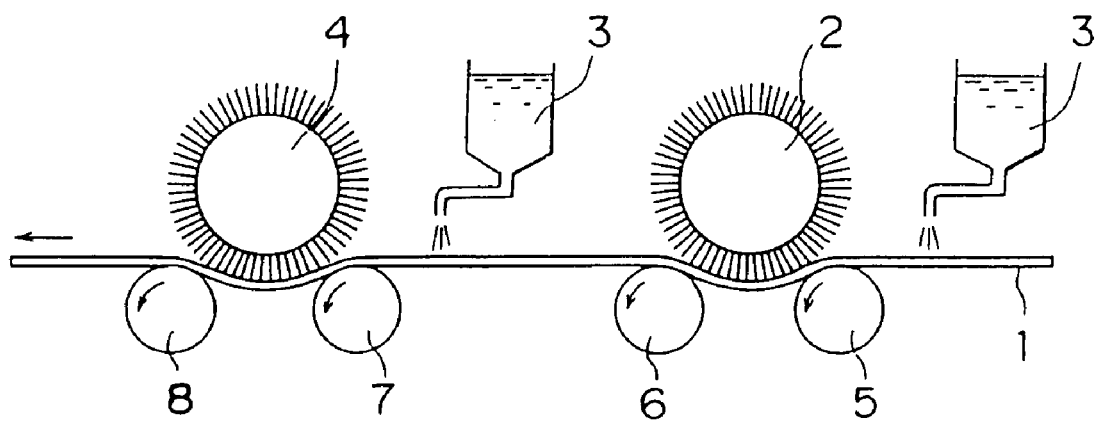
FIG. 1 is a side view showing the concept of a brush graining step used for mechanical surface roughing treatment in the production of a support of a planographic printing plate according to a second embodiment in the present invention.

I. The polymerizable composition according to first and second features of the present invention and the planographic printing plate precursor according to third and fourth features of the invention will be described in detail in the following first embodiment.

FIRST EMBODIMENT

The polymerizable composition of the present embodiment comprises:
(A) a compound having a polymerizable unsaturated group; and
(B) a macromolecular compound (specific polymer initiator) including, at a side chain thereof, a structure represented by the following general formula (I):

General Formula (I)

$Z^- M^+$ wherein $Z^-$ represents $COCOO^-$, $COO^-$, $SO_3^-$ or $SO_2$—$N^-$—R where R represents a monovalent organic group. $M^+$ represents an onium cation.

The structural components of the polymerizable composition of the present embodiment will be hereinafter explained sequentially.

((B) Macromolecular Compound Including, at a Side Chain Thereof, a Structure Represented by the General Formula (I))

The specific polymer initiator contained in the polymerizable composition of the present embodiment is a macromolecular compound including, at a side chain thereof, a structure represented by the following general formula (I).

General Formula (I)

$Z^- M^+$

In the general formula (I), $Z^-$ represents $COCOO^-$, $COO^-$, $SO_3^-$ or $SO_2$—$N^-$—R where R represents a monovalent organic group. Examples of the monovalent organic group include an alkyl group having 1 to 6 carbon atoms, carboxyl group, ester group, ether group, alkoxy group, thioether group, carbonyl group and aryl group. Among these groups, preferable examples include a methyl group, ethyl group, propyl group, ester group and carboxyl group. These monovalent organic groups may further have a substituent selected from a hydroxyl group, alkoxy group, aryloxy group, ester group, thioether group and carboxyl group.

$M^+$ represents an onium cation. $M^+$ is specifically a cation selected from sulfonium, iodonium, diazonium, azinium, phosphonium, ammonium and the like.

Here, azinium is compounds having an azine ring which is a six-membered ring containing a nitrogen atom in its structure, and includes pyridinium, diazinium and triazinium. Azinium contains one or more aromatic rings condensed with an azine ring and includes quinolinium, isoquinolinium, benzoazinium, naphthoazinium and the like. Specific examples of azinium include those described in, for example, U.S. Pat. No. 4,743,528, JP-A Nos. 63-138345, 63-142345 and 63-142346, JP-B No. 46-42363. Counter cations forming 1-methoxy-4-phenylpyridinium tetrafluoroborate N-alkoxypyridinium salts and the like are exemplified.

Also, preferable examples of the onium cation in the present embodiment include diazonium ions, iodonium ions and sulfonium ions represented by the following formulae (RI-1) to (RI-3).

General Formula (RI-1)

$Ar^{11}$—$N^+$≡$N^+$

General Formula (RI-2)

$Ar^{21}$—$I^+$—$Ar^{22}$

General formula (RI-3)

In the general formula (RI-1), $Ar^{11}$ represents an aryl group having 20 or less carbon atoms, which aryl group may have 1 to 6 substituents. Preferable examples of the substituent include an alkyl group having 1 to 12 carbon atoms, alkenyl group having 1 to 12 carbon atoms, alkinyl group having 1 to 12 carbon atoms, aryl group having 6 to 12 carbon atoms, alkoxy group having 1 to 12 carbon atoms, aryloxy group having 6 to 12 carbon atoms, halogen atom, alkylamino group having 1 to 12 carbon atoms, dialkylamino group having 1 to 12 carbon atoms, alkylamide or arylamide group having 12 or less carbon atoms, carbonyl group, carboxy group, cyano group, sulfonyl group, thioalkyl group having 12 or less carbon atoms and thioaryl group having 12 or less carbon atoms.

In the general formula (RI-2), $Ar^{21}$ and $Ar^{22}$ respectively represent an aryl group having 20 or less carbon atoms, which aryl group may have 1 to 6 substituents. When the aryl group has a substituent, examples of the substituent include an alkyl group having 1 to 12 carbon atoms, alkenyl group having 1 to 12 carbon atoms, alkinyl group having 1 to 12 carbon atoms, aryl group having 6 to 12 carbon atoms, alkoxy group having 1 to 12 carbon atoms, aryloxy group having 6 to 12 carbon atoms, halogen atom, alkylamino group having 1 to 12 carbon atoms, dialkylamino group having 1 to 12 carbon atoms, alkylamide or arylamide group having 12 or less carbon atoms, carbonyl group, carboxy group, cyano group, sulfonyl group, thioalkyl group having 12 or less carbon atoms and thioaryl group having 12 or less carbon atoms.

In the general formula (RI-3), $R^{31}$, $R^{32}$ and $R^{33}$, which may be of the same type or different types, and which each represent an aryl group, an alkyl group, an alkenyl group or an alkinyl group having 20 or less carbon atoms, which may have 1 to 6 substituents. $R^{31}$, $R^{32}$ and $R^{33}$ are preferably an aryl group from the viewpoint of reactivity and stability. Preferable examples of the substituent which can be introduced include an alkyl group having 1 to 12 carbon atoms, alkenyl group having 1 to 12 carbon atoms, alkinyl group having 1 to 12 carbon atoms, aryl group having 6 to 12 carbon atoms, alkoxy group having 1 to 12 carbon atoms, aryloxy group having 6 to 12 carbon atoms, halogen atom, alkylamino group having 1 to 12 carbon atoms, dialkylamino group having 1 to 12 carbon atoms, alkylamide or arylamide group having 12 or less carbon atoms, carbonyl group, carboxy group, cyano group, sulfonyl group, thioalkyl group having 12 or less carbon atoms, thioaryl group having 12 or less carbon atoms and hydroxyl group.

It is preferable that $R^{31}$, $R^{32}$ and $R^{33}$ are all aryl groups and, from the viewpoint of reactivity, at least one of them have a substituent having a Hammet's substituent constant (σ) larger than 0.

Among the aforementioned oniums, sulfonium cations represented by the following general formula are most preferable from the viewpoint of the balance between reactivity and stability. In the following general formula, $R^1$ represents an alkyl group having 1 to 8 carbon atoms or a halogen atom and $X^1$ and $X^2$ respectively represent a halogen atom.

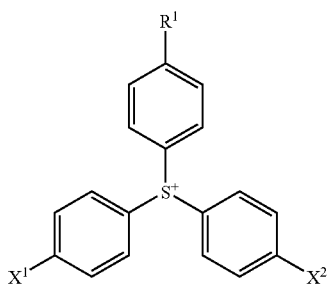

When such a structure is connected with the polymer, it is preferable that $Z^-$ be connected with the polymer. No particular limitation is imposed on the type of the polymer as the principal chain. The polymer may be any one of a urethane polymer, amide polymer, acrylic polymer, methacrylic polymer, styrene polymer, butyral polymer and novolac resin.

It is only necessary that at least a portion of the structural unit constituting the polymer principal chain has a side chain structure represented by the general formula (I).

The specific polymer initiator of the present embodiment may have a structural unit which does not have the side chain structure represented by the general formula (I). However, from the viewpoint of effecting an interaction with the dye, it is preferable that the structural unit having the side chain structure represented by the general formula (I) is contained in an amount of 50% by mol or more in the specific polymer intiator.

Among the structural units having the side chain structure represented by the general formula (I) constituting the specific polymer initiator of the present embodiment, structural units represented by the following general formula (II) are prferable from the viewpoint of reactivity and printing durability.

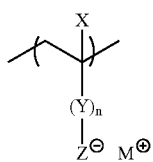

(II)

In the general formula (II), X represents a hydrogen atom, a monovalent organic group, a hydroxyl group, a urethane group, a urea group, a halogen atom, an amino group, an amide group, a sulfonyl group or a sulfonate group. When X represents a monovalent organic group, X is preferably an alkyl group having 1 to 6 carbon atoms, a carboxyl group, an ester group, an ether group, an alkoxy group, a thio ether group, a carbonyl group or an aryl group. Among these groups, preferable examples of X include a hydrogen atom, methyl group, ethyl group, propyl group, ester group and carboxyl group. The monovalent organic group may further have a substituent selected from a hydroxyl group, alkoxy group, aryloxy group, ester group, thioether group and carboxyl group.

Y represents a divalent organic connecting group and n denotes 0 or 1. When n is 0, $Z^-$ which is the side chain structure will be inevitably connected to the polymer principal chain as a single bond. Examples of Y include an ether group, alkyl group having 1 to 14 carbon atoms, alkenyl group, alkinyl group and aryl group. These organic connecting groups may be further substituted with an alkyl group, alkenyl group, alkinyl group, aryl group, alkoxy group, aryloxy group, sulfonate group, amide group, sulfonyl group, carbonyl group, carboxyl group, thioether group, hydroxyl group, urethane group, urea group, ester group, halogen atom, amino group or substitution group which is a combination of two to five groups among these groups.

$Z^-$ represents $COCOO^-$, $COO^-$, $SO_3^-$ or $SO_2$—$N^-$—R where R represents a monovalent organic group. This monovalent organic group represents the same monovalent organic group defined in connection with the description of X. $Z^-$ is preferably a $COCOO^-$ structure from the viewpoint of the balance between reactivity and stability.

$M^+$ represents an onium cation. $M^+$ is specifically a cation selected from sulfonium, iodonium, diazonium, azinium, phosphonium, ammonium and the like.

The specific polymer initiator according to the present embodiment may be constituted only of the structural unit having the side chain structure represented by the general formula (I) or the structural unit which is represented by the general formula (II) as a preferable example of the structural unit represented by the general formula (I). However, the specific polymer initiator may be a copolymer with other various known monomers. Examples of the monomer which may be copolymerized with the aforementioned structural unit include radical polymerizable structural units selected from acrylates, methacrylates, acrylamides, methacrylamides, styrenes, acrylonitriles, methacrylonitriles and the like.

Specific examples of the monomer include acrylates such as alkylacrylates (the alkyl group thereof preferably has 1 to 20 carbon atoms), (specifically, benzylacrylate, 4-biphenylacrylate, butylacrylate, sec-butylacrylate, t-butylacrylate, 4-t-butylphenylacrylate, 4-chlorophenylacrylate, pentachlorophenylacrylate, 4-cyanobenzylacrylate, cyanomethylacrylate, cyclohexylacrylate, 2-ethoxyethylacrylate, ethylacrylate, 2-ethylhexylacrylate, heptylacrylate, hexylacrylate, isobornylacrylate, isopropylacrylate, methylacrylate, 3,5-dimethyladamantylacrylate, 2-naphthylacrylate, neopentylacrylate, octylacrylate, phenetylacrylate, phenylacrylate, propylacrylate, tolylacrylate, amylacrylate, tetrahydrofurfurylacrylate, 2-hydroxyethylacrylate, 3-hydroxypropylacrylate, 2-hydroxypropylacrylate, 4-hydroxybutylacrylate, 5-hydroxypentylacrylate, allylacrylate, 2-aryloxyethylacrylate, propargylacrylate and the like);

methacrylates such as alkylmethacrylates (the alkyl group thereof preferably has 1 to 20 carbon atoms) (e.g., benzylmethacrylate, 4-biphenylmethacrylate, butylmethacrylate, sec-butylmethacrylate, t-butylmethacrylate, 4-t-butylphenylmethacrylate, 4-chlorophenylmethacrylate, pentachlorophenylmethacrylate, 4-cyanophenylmethacrylate, cyanomethylmethacrylate, cyclohexylmethacrylate, 2-ethoxyethylmethacrylate, ethylmethacrylate, 2-ethylhexylmethacrylate, heptylmethacrylate, hexylmethacrylate, isobornylmethacrylate, isopropylmethacrylate, methylmethacrylate, 3,5-dimethyladamantylmethacrylate, 2-naphthylmethacrylate, neopentylmethacrylate, octylmethacrylate, phenetylmethacrylate, phenylmethacrylate, propylmethacrylate, tolylmethacrylate, amylmethacrylate, tetrahydrofurfurylmethacrylate, 2-hydroxyethylmethacrylate, 3-hydroxypropylmethacrylate, 2-hydroxypropylmethacrylate, 4-hydroxybutylmethacrylate, 5-hydroxypentylmethacrylate, allylmethacrylate, 2-aryloxyethylmethacrylate and propargylmethacrylate);

acrylamides such as acrylamide and N-alkylacrylamides (e.g., N-methylacrylamide, N-ethylacrylamide, N-propylacrylamide, N-isopropylacrylamide, morpholylacrylamide, piperidylacrylamide, N-butylacrylamide, N-sec-butylacrylamide, N-t-butylacrylamide, N-hexylacrylamide, N-cyclohexylacrylamide, N-phenylacrylamide, N-naphthylacrylamide, N-hydroxymethylacrylamide, N-hydroxyethylacrylamide, N-allylacrylamide, N-propargylacrylamide, 4-hydroxyphenylacrylamide, 2-hydroxyphenylacrylamide, N,N-dimethylacrylamide, N,N-diethylacrylamide, N,N-dipropylacrylamide, N,N-diisopropylacrylamide, N,N-dibutylacrylamide, N,N-di-sec-butylacrylamide, N,N-di-t-butylacrylamide, N,N-dihexylacrylamide, N,N-dicyclohexylacrylamide, N,N-phenylacrylamide, N,N-dihydroxyethylacrylamide, N,N-diallylacrylamide and N,N-dipropargylacrylamide);

methacrylamides such as methacrylamide and N-alkylmethacrylamides (e.g., N-methylmethacrylamide, N-ethylmethacrylamide, N-propylmethacrylamide, N-isopropylmethacrylamide, morpholylmethacrylamide, piperidylmethacrylamide, N-butymethacrylamide, N-sec-butylmethacrylamide, N-t-butylmethacrylamide, N-hexylmethacrylamide, N-cyclohexylmethacrylamide, N-phenylmethacrylamide, N-naphthylmethacrylamide, N-hydroxymethylmethacrylamide, N-hydroxyethylmethacrylamide, N-allylmethacrylamide, N-propargylmethacrylamide, 4-hydroxyphenylmethacrylamide, 2-hydroxyphenylmethacrylamide, N,N-dimethylmethacrylamide, N,N-diethylmethacrylamide, N,N-dipropylmethacrylamide, N,N-diisopropylmethacrylamide, N,N-dibutylmethacrylamide, N,N-di-sec-butylmethacrylamide, N,N-di-t-butylmethacrylamide, N,N-dihexylmethacrylamide, N,N-dicyclohexylmethacrylamide, N,N-phenylmethacrylamide, N,N-dihydroxyethylmethacrylamide, N,N-diallylmethacrylamide and N,N-dipropargylmethacrylamide);

styrenes such as styrene and alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene), halogen styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene), acrylonitrile and methacrylonitrile.

Among these polymerizable structural units, those preferably used are methacrylates, acrylamides, methaxrylamides and styrenes and those which are particularly preferably used are benzylmethacrylate, t-butylmethacrylate, 4-t-butylphenylmethacrylate, pentachlorophenylmethacrylate, 4-cyanophenylmethacrylate, cyclohexylmethacrylate, ethylmethacrylate, 2-ethylhexylmethacrylate, isobornylmethacrylate, isopropylmethacrylate, methylmethacrylate, 3,5-dimethyladamantylmethacrylate, 2-naphthylmethacrylate, neopentylmethacrylate, phenylmethacrylate, tetrahydrofurfurylmethacrylate, 2-hydroxyethylmethacrylate, 3-hydroxypropylmethacrylate, 2-hydroxypropylmethacrylate, allylmethacrylate;

acrylamide, N-methylacrylamide, N-isopropylacrylamide, morpholylacrylamide, piperidylacrylamide, N-t-butylacrylamide, N-cyclohexylacrylamide, N-phenylacrylamide, N-naphthylacrylamide, N-hydroxymethylacrylamide, N-hydroxyethylacrylamide, N-allylacrylamide, 4-hydroxyphenylacrylamide, 2-hydroxyphenylacrylamide, N,N-dimethylacrylamide, N,N-diisopropylacrylamide, N,N-di-t-butylacrylamide, N,N-dicyclohexylacrylamide, N,N-phenylacrylamide, N,N-dihydroxyethylacrylamide, N,N-diallylacrylamide;

methacrylamide, N-methylmethacrylamide, N-isopropylmethacrylamide, morpholylmethacrylamide, piperidylmethacrylamide, N-t-butylmethacrylamide, N-cyclohexylmethacrylamide, N-phenylmethacrylamide, N-naphthylmethacrylamide, N-hydroxymethylmethacrylamide, N-hydroxyethylmethacrylamide, N-allylmethacrylamide, 4-hydroxyphenylmethacrylamide, 2-hydroxyphenylmethacrylamide, N,N-dimethylmethacrylamide, N,N-diisopropylmethacrylamide, N,N-di-t-butylmethacrylamide, N,N-dicyclohexylmethacrylamide, N,N-phenylmethacrylamide, N,N-dihydroxyethylmethacrylamide, N,N-diallylmethacrylamide;

styrene, methylstyrene, dimethylstyrene, trimethylstyrene, isopropylstyrene, butylstyrene, cyclohexylstyrene, chloromethylstyrene, trifluoromethylstyrene, ethoxymethylstyrene, acetoxymethylstyrene, methoxystyrene, 4-methoxy-3-methylstyrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene).

These monomers may be used singly or in combinations of two or more. The content of these copolymer components preferably used is 0 to 90% by mol and particularly preferably 0 to 50% by mol. If the content exceeds 50% by mol, reactivity tends to be deteriorated.

The specific polymer initiator according to the present embodiment may be copolymerized with a radical polymerizable structural unit having an acid group in order to improve various abilities such as removability of a non-image portion at the time of using the initiator for the recording layer of a planographic printing plate precursor. Examples of such an acid group include carboxylic acid, sulfonic acid, phosphoric acid group and phenolic hydroxyl group. Particularly preferable examples include carboxylic acid and phenolic hydroxyl group. Examples of the radical polymerizable compound containing carboxylic acid include acrylic acid, methacrylic acid, itaconic acid, crotonic acid, incrotonic acid, maleic acid and p-carboxystyrene. Among these compounds, acrylic acid, methacrylic acid and p-carboxystyrene are particularly preferable.

Examples of the radical polymerizable compound having a phenolic hydroxyl group include 4-hydroxystyrene.

These compounds may be used singly or in combinations of two or more. The content of the copolymer components to be used is preferably 0 to 50% by mol. The content is particularly preferably 0 to 30% by mol from the view point of suppression of a damage to image strength, which damage is caused by alkali-water development when these copolymer components for the recording layer of a planographic printing plate precursor are used. If the content of the structural unit having an acid group exceeds 50% by mol, image strength tends to be deteriorated by alkali-water developing.

The weight average molecular weight (Mw) of the specific polymer initiator (B) of the present embodiment is preferably 1,000 to 100,000, more preferably in the range of 1,000 to 50,000 and most preferably in the range of 2,000 to 40,000. When the molecular weight is 1,000 or less, the effect of improving printing durability by increasing the molecular weight of the initiator high will be insufficient. Whereas when the molecular weight exceeds 100,000, developing inferior tends to be caused.

Specific examples (I-1) to (IV-6) of the specific polymer initiator (B) according to the present embodiment will be given as shown below. The present invention, however, is not limited to these examples. The value described on the side of each structural unit represents polymerization mol ratio wherein the value 100 assigned to a structural unit means that the initiator is a homopolymer constituted only of that structural unit.

(I-1)

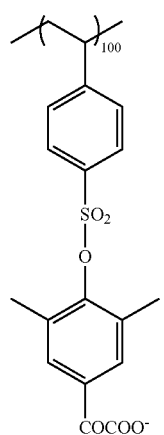
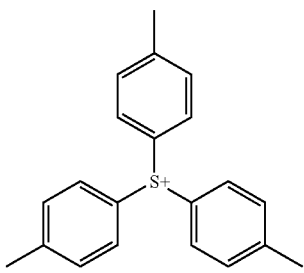

(I-2)

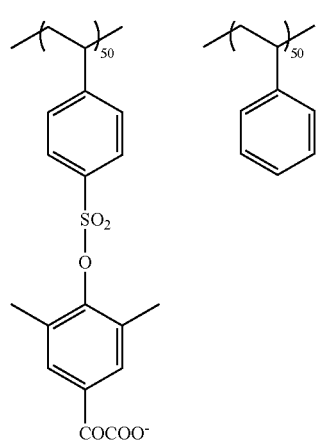

-continued (I-3)

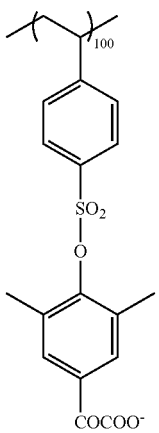

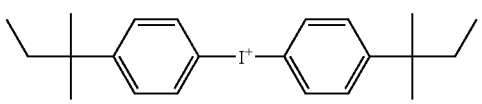

(I-4)

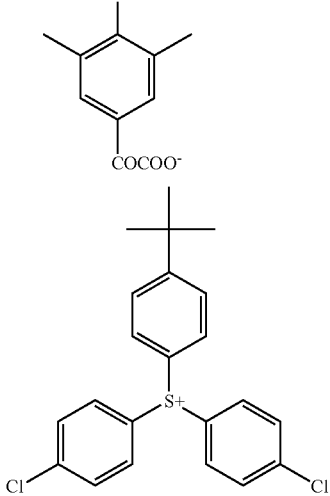

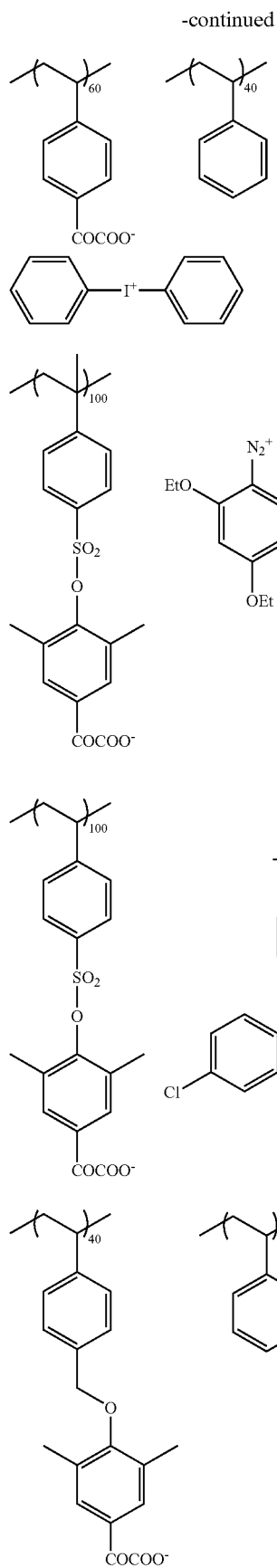
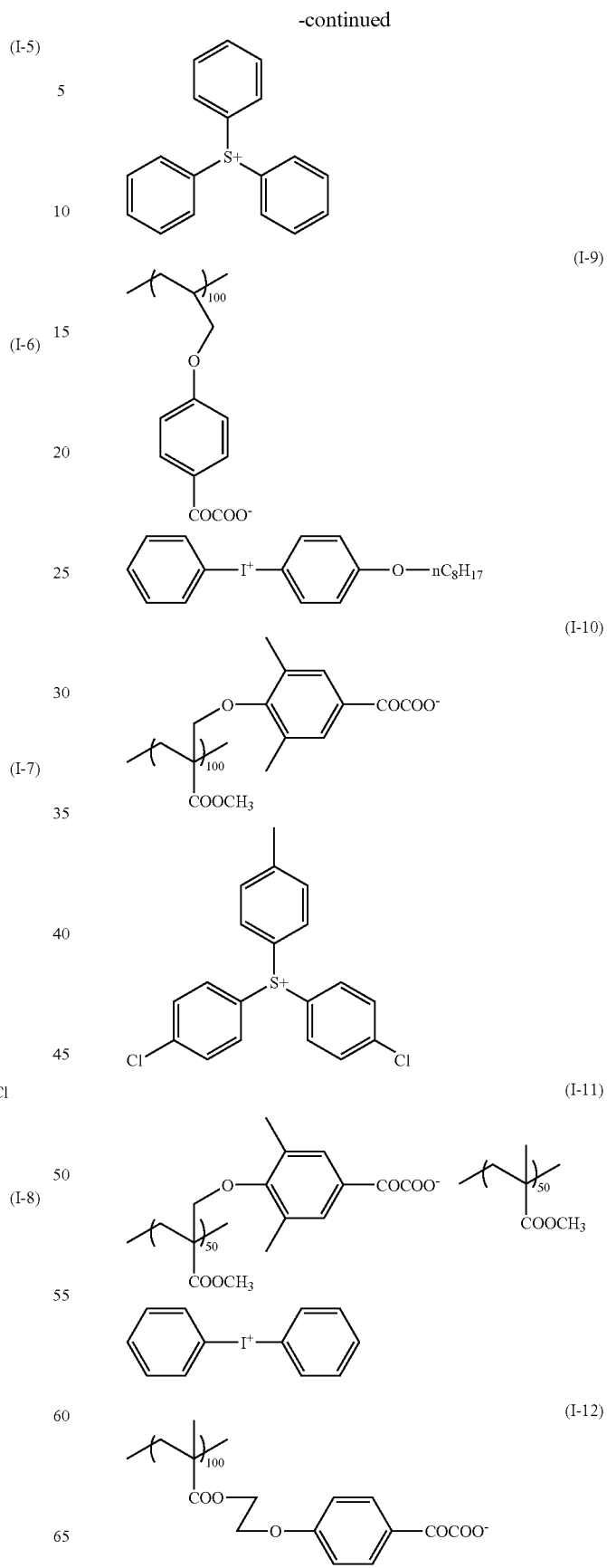

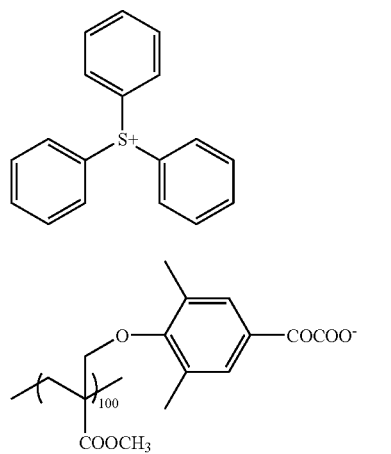
(I-13)
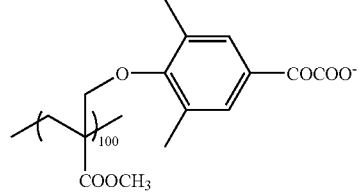
(I-14)
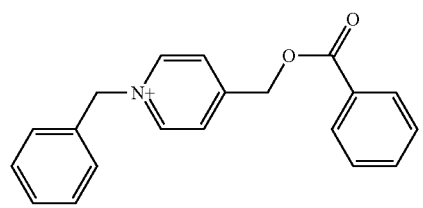
(I-15)
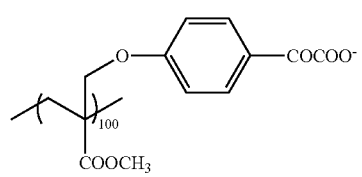
(I-16)
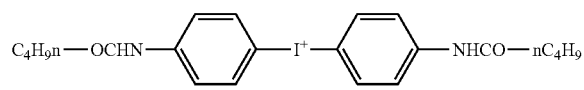
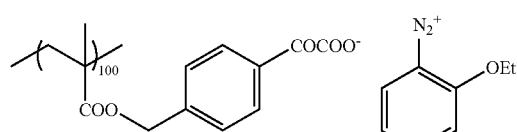
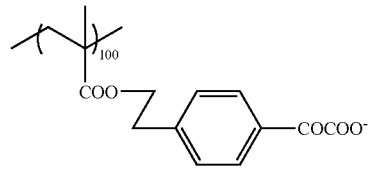
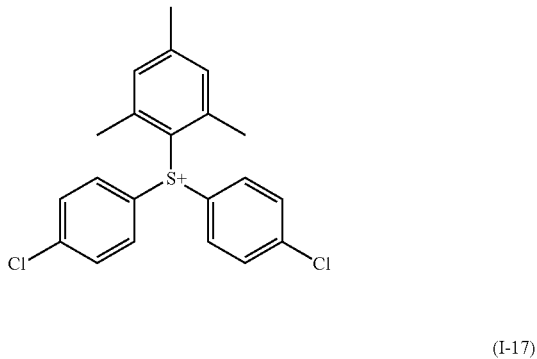
(I-17)
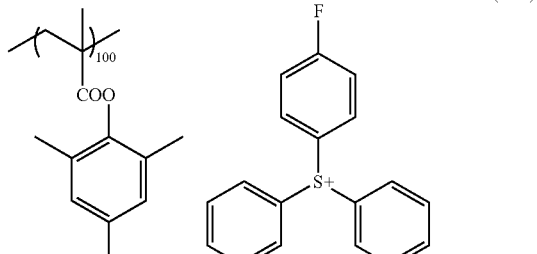
(I-18)
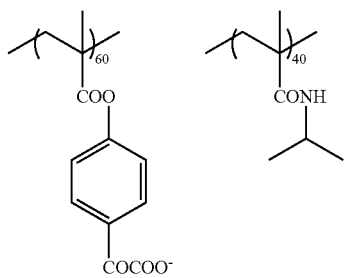
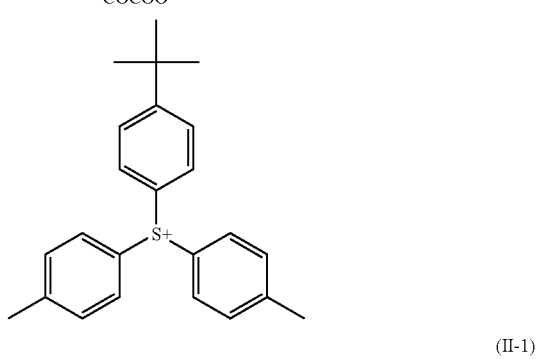
(II-1)
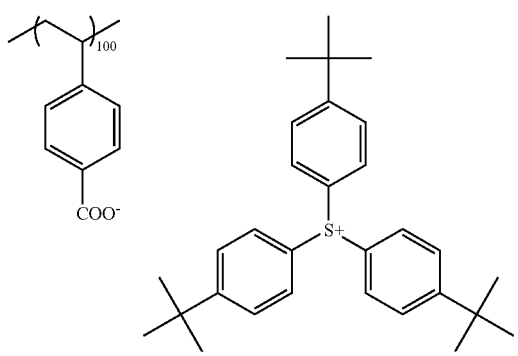

-continued
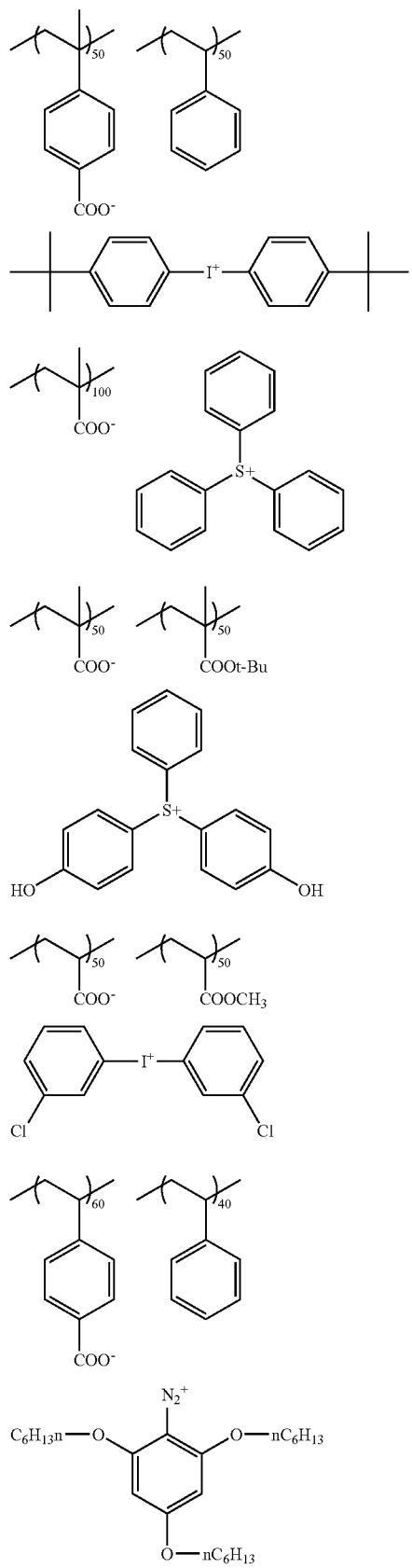
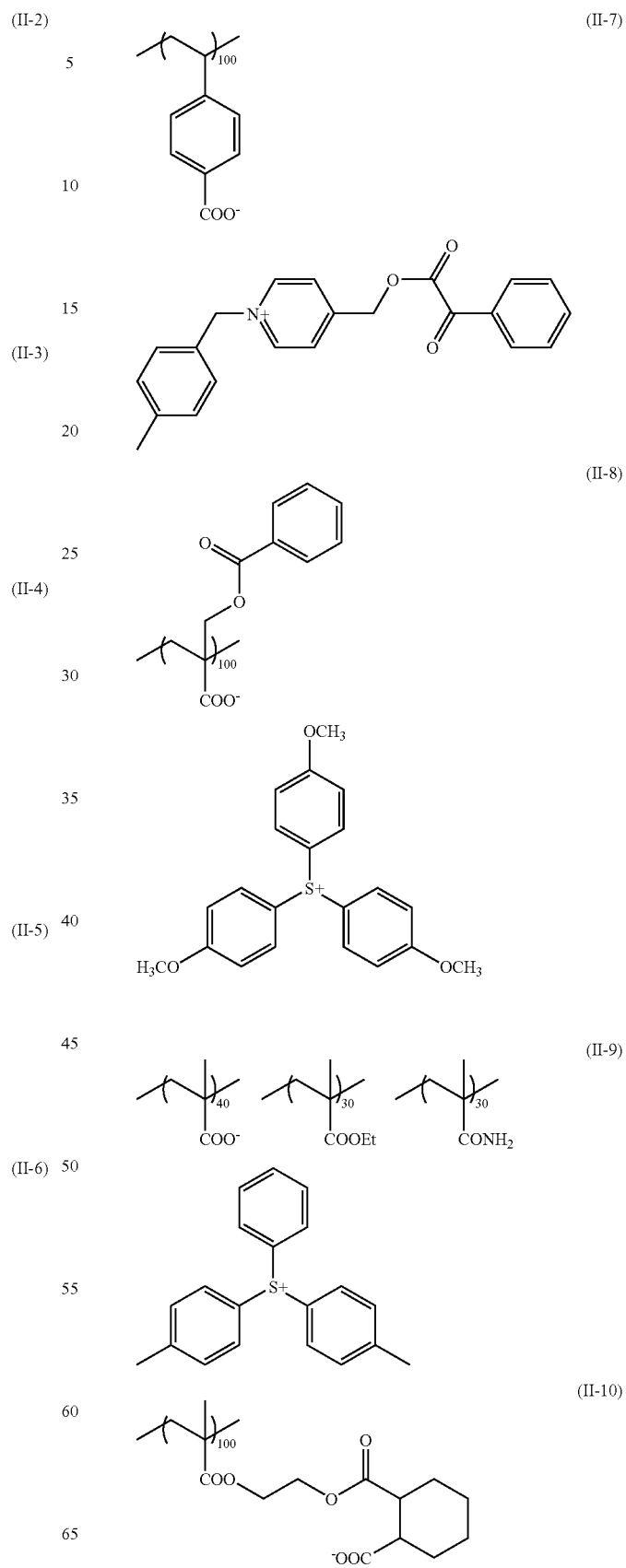

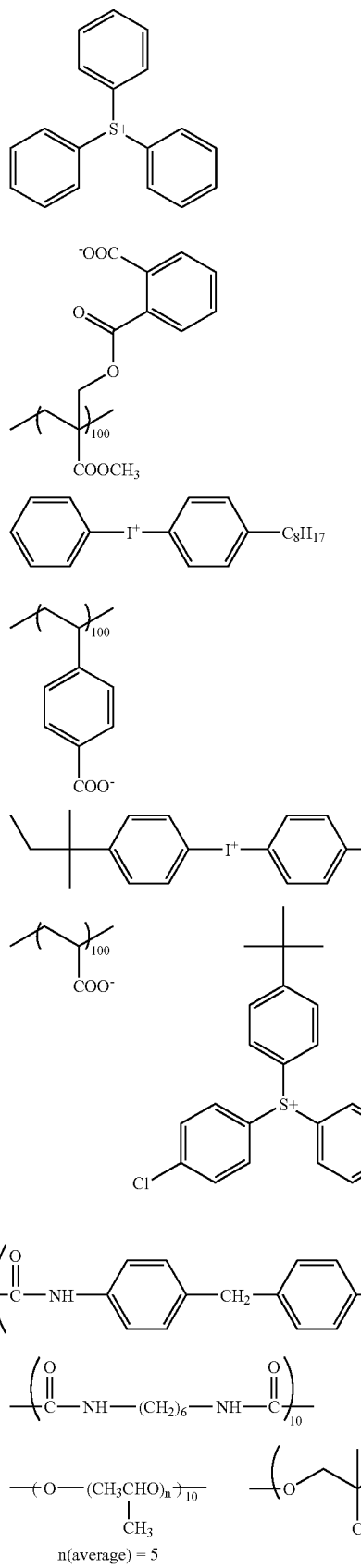
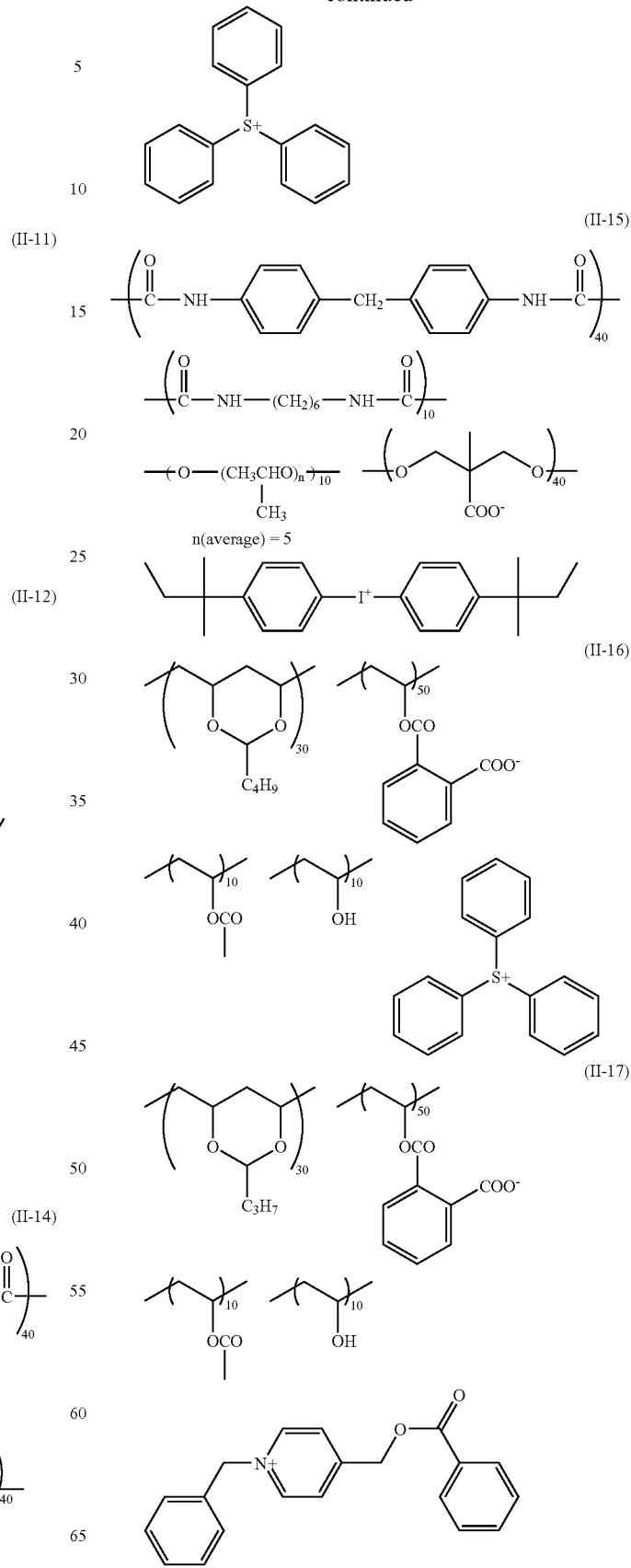

-continued (III-1)

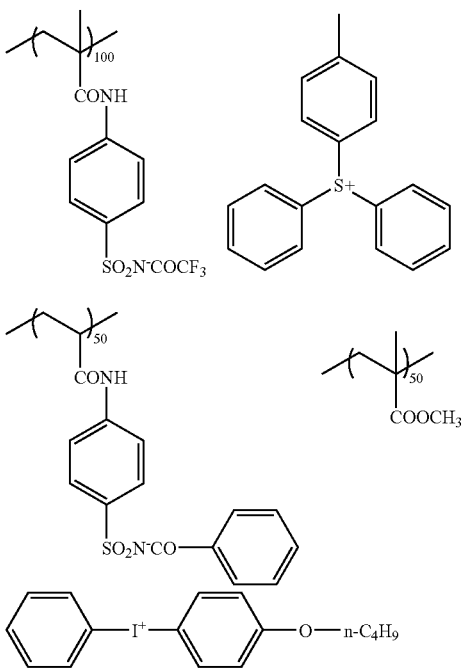

(III-2)

The specific polymer initiator (B) according to the present embodiment can be easily synthesized using a known method. A specific example (I-1) will be described as a synthesis example.

(Synthesis of Specific Polymer Initiator (I-1))

133 g of aluminum chloride is mixed with 350 ml of nitrobenzene at room temperature and the mixture is kept at 0 to 10° C. 136.5 g of ethylchloroformate is added dropwise to the mixture at 0 to 10° C. in 15 minutes. After the resulting mixture is stirred for 15 minutes, 116.1 g of 2,6-dimethylphenol is dissolved in 150 ml of nitrobenzene and the solution is added dropwise to the mixture in 30 minutes with keeping the solution at 0 to 10° C. The resulting mixture is stirred at 0 to 10° C. for 2 hours and then at room temperature for 1 hour. 60 ml of concentrated hydrochloric acid is mixed with 2 L of ice water, into which the reaction solution is then poured slowly. After extracting the reaction solution with 1500 ml of ethyl acetate, the organic phase is dried by sodium sulfate to concentrate. Then, nitrobenzene is distilled under reduced pressure to obtain a solid. This solid is reslurried using 300 ml of diisopropyl ether and filtered to obtain the following solid (A) in an amount of 149 g (yield: 66.8%).

(A)

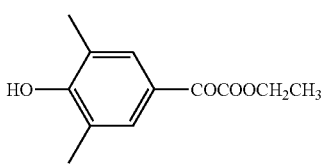

111 g of the above solid (A) is dissolved in 80 g of pyridine and the mixture is cooled to 0 to 10° C. 152 g of p-styrenesulfonyl chloride is added dropwise to the mixture. After the dropping is finished, the resulting mixture is stirred at 0 to 10° C. for 2 hours and at room temperature for 2 hours. 80 ml of concentrated hydrochloric acid is mixed with 2 L of ice water, into which the reaction solution diluted with 150 ml of acetone is poured slowly, and then a solid is precipitated. The solid is then subjected to filtration and the residue is reslurried using 300 ml of methanol to obtain the following solid (B) in an amount of 151 g (yield: 77.5%). [NMR of the solid (B)] 300 MHz (CDCl$_3$) [δ: 1.43(t 3H J=7.2 Hz), 2.20 (s 6H), 4.45 (q 2H J=7.2 Hz), 5.52 (d 1H J=10.8 Hz), 5.96 (d 1H J=17.4), 6.79 (dd 1H J=10.8 17.4), 7.60 (d 2H J=8.1), 7.71 (s 1H), 7.93 (d 2H J=8.1)]

(B)

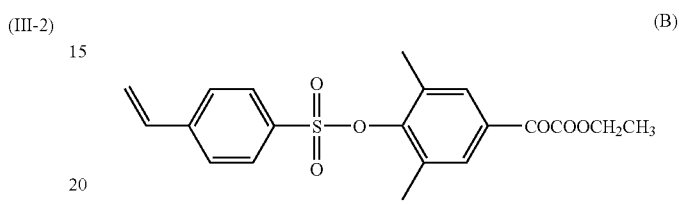

31.07 g of the above solid (B) is dissolved in 64 g of methyl ethyl ketone and the mixture is stirred at 70° C. in a nitrogen atmosphere. 0.64 g of a polymerization initiator V-65 manufactured by Wako Pure Chemical Industries, Ltd., is added to the mixture, followed by stirring for 2 hours, 0.32 g of V-65 is further added, followed by stirring for 2 hours and 0.16 g of V-65 is further added, followed by stirring for 2 hours. After the resulting mixture is cooled to room temperature, it is poured into 1 kg of a hexane solution containing 5% of 2-propanol to obtain 27 g of a polymer body. 7 g of the polymer is dissolved in 30 ml of DMAc and 70 ml of 1-methoxy-2-propanol. An aqueous solution containing 70 ml of water and 1.02 g of potassium hydroxide is added dropwise to the mixture at room temperature, followed by stirring for 2 hours and the resulting mixture is poured into a mixed solution of 500 ml of ice water and 20 ml of concentrated hydrochloric acid to precipitate a solid of carboxylic acid, which is then subjected to filtration and drying to obtain a polymer (C) having a COCOOH unit.

(C)

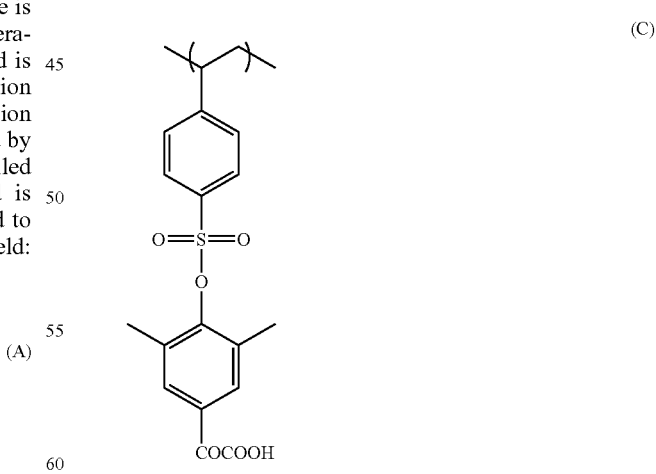

1.42 g of a sulfonium salt as shown below is dissolved in 50 ml of methanol, into which 0.72 g of silver oxide is added and the mixture is stirred at room temperature for 4 hours. After stirred, the mixture is subjected to filtration. The filtrate is subjected to filtration using a 0.1 μm filter. A solution containing the above polymer (C), 50 ml of acetone and 10 ml of methanol is added dropwise to the filtrate. After the addition is finished, the filtrate is concentrated to precipitate a semisolid. The semisolid is washed with ethyl acetate and diisopropyl ether to obtain a specific polymer initiator (I-1). The molecular weight of the specific polymer initiator (I-1) is measured by a TSK-GEL α-column manufactured by Tosoh Corporation to find that Mw=6300. The result of elemental analysis is as follows: [Found (actual value): C, 63.5; H, 5.1; O, 13.3. Calc. (theoretical value): C, 63.7; H, 4.9; O, 13.1].

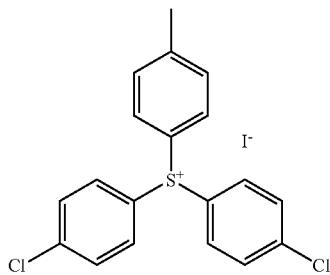

Various specific polymer initiators (B) can be synthesized using the same method as above or known acid group-containing polymers.

The content of the specific polymer initiator (B) contained in the whole solid of the polymerizable composition of the present embodiment is preferably 0.5 to 50% by mass, more preferably 3 to 30% by mass and most preferably 5 to 20% by mass.

A triazine compound, borate compound, azo compound, peroxide, lophine dimer, acylphosphine compound and the like which are known as polymerization initiators may be added to the polymerizable composition of the present embodiment, if necessary, to the extent that the effect of the invention is not lessened. These compounds may be added to the polymerizable composition in an amount ranging from 0 to 30% by mass, preferably 0 to 10% by mass with respect to the specific polymer initiator (B).

((A) Compound Having a Polymerizable Unsaturated Group)

The polymerizable composition of the present embodiment contains a compound (hereinafter referred to as a polymerizable compound as desired) having a polymerizable unsaturated group which enters into a polymerization reaction by the action of a radical as a polymerization initiator, generated from the specific polymer initiator (B).

The polymerizable compound used in the present embodiment is preferably an addition polymerizable compound having at least one ethylenic unsaturated double bond and is preferably selected from compounds having at least one and more preferably two or more terminal ethylenic unsaturated bonds. Such a compound group is widely known in the industrial fields of the art and may be used in the invention without any particular limitation. Such a group includes monomers, prepolymers, specifically, compounds having chemical forms such as dimers, trimers and oligomers or mixtures or copolymers of these compounds.

Examples of the monomers or the copolymers of these monomers include unsaturated carboxylic acids (e.g., acrylic acid, methacrylic acid, itaconic acid, crotonic acid, isocrotonic acid and maleic acid), esters or amides of these acids. Esters of unsaturated carboxylic acids and aliphatic polyvalent alcohol compounds and amides of unsaturated carboxylic acids and aliphatic polyvalent amine compounds are preferably used. Addition reaction products between unsaturated carboxylates or amides having a nucleophilic substituent such as a hydroxyl group, amino group and mercapto group and monofunctional or polyfunctional isocyanates or epoxies, as well as and dehydrated condensed reaction products between the same unsaturated carboxylates or amides and monofunctional or polyfunctional carboxylic acids, are also preferably used.

Also, addition reaction products between unsaturated carboxylates or amides having an electrophilic substituent such as an isocyanate group and epoxy group and monofunctional or polyfunctional alcohols, amines or thiols, and substitution reaction products between unsaturated carboxylates or amides having a dissociable substituent such as a halogen group and tosyloxy group and monofunctional or polyfunctional alcohols, amines or thiols are preferable. Also, as other examples, a compound group obtained by substituting unsaturated phosphinic acids, styrenes or vinyl ethers for the aforementioned unsaturated carboxylic acids may be used.

Specific examples of the acrylates as the monomers of esters of aliphatic polyhydric alcohol compounds and unsaturated carboxylic acids include ethylene glycol diacrylate, triethylene glycol diacrylate, 1,3-butanedioldiacrylate, tetramethylene glycol diacrylate, propylene glycol diacrylate, neopentyl glycol diacrylate, trimethylolpropanetriacrylate, trimethylolpropanetri(acryloyloxypropyl) ether, trimethylolethanetriacrylate, hexanedioldiacrylate, 1,4-cyclohexanedioldiacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer.

Examples of the methacrylates include tetramethylene glycol dimethacrylate, triethylene glycol dimethacrylate, neopentyl glycol dimethacrylate, trimethylolpropanetrimethacrylate, trimethylolethanetrimethacrylate, ethylene glycol dimethacrylate, 1,3-butanedioldimethacrylate, hexanedioldimethacrylate, pentaerythritol dimethacrylate, pentaerythritol trimethacrylate, pentaerythritol tetramethacrylate, dipentaerythritol dimethacrylate, dipentaerythritolhexamethacrylate, sorbitol trimethacrylate, sorbitol tetramethacrylate, bis[p-(3-methacryloxy-2-hydroxypropoxy)phenyl]dimethylmethane and bis-[p-(methacryloxyethoxy)phenyl]dimethylmethane.

Examples of the itaconates include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of the crotonates include ethylene glycol dicrotonate, tetramethylene glycol dicrotonate, pentaerythritol dicrotonate and sorbitol tetradicrotonate.

Examples of the isocrotonate include ethylene glycol diisocrotonate, pentaerythritol diisocrotonate and sorbitol tetraisocrotonate.

Examples of the maleate include ethylene glycol dimaleate, triethylene glycol dimaleate pentaerythritol dimaleate and sorbitol tetramaleate.

Given as examples of other esters which are preferably used are aliphatic alcohol type esters as described in each publication of JP-B No. 46-27926, JP-B No. 51-47334 and JP-A No. 57-196231, esters having an aromatic type skeleton as described in JP-A No. 59-5240, JP-A No. 59-5241 and JP-A No. 2-226149 and esters having an amino group as described in JP-A No. 1-165613.

Moreover, these ester monomers may be used as mixtures.

Also, specific examples of the monomers of the amides of aliphatic polyvalent amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide and xylylenebismethacrylamide.

Examples of other preferable amide type monomers may include those having a cyclohexylene structure as described in JP-B No. 54-21726.

Urethane type addition polymerizable compounds produced using an addition reaction between an isocyanate and a hydroxyl group are also preferable. Specific examples of such a compound include vinylurethane compounds having two or more polymerizable vinyl groups in one molecule and produced by adding a vinyl monomer having a hydroxyl group represented by the following general formula (2) to a polyisocyanate compound having two or more isocyanate groups in one molecule as described in JP-B No. 48-41708.

(2)

In the general formula (2), R and R' respectively represent a H atom or $CH_3$.

Urethaneacrylates as described in JP-A No. 51-37193, JP-B Nos. 2-32293 and 2-16765, urethane compounds having an ethylene oxide type skeleton as described in each publication of JP-B Nos. 58-49860, 56-17654, 62-39417and 62-39418 are also preferable.

Moreover, the use of addition polymerizable compounds having an amino structure or a sulfide structure in each molecule as described in JP-A Nos. 63-277653, 63-260909 and 1-105238 makes it possible to obtain a heat-sensitive composition having a very high curing reaction speed.

Other examples may include polyfunctional acrylates or methacrylates such as polyester acrylates and epoxyacrylates obtained by reacting epoxy resins with (meth)acrylic acids as described in JP-A No. 48-64183, JP-B No. 49-43191 and JP-B No. 52-30490. Specific unsaturated compounds as described in each publication of JP-B Nos. 46-43946, 1-40337 and 1-40336 and vinylphosphonic acid type compounds as described in JP-A No. 2-25493 may also be exemplified. Also, in some cases, a structure containing a perfluoroalkyl group as described in JP-A No. 61-22048 is preferably used. Furthermore, those reported as photocurable monomers or oligomers in Journal of Japan Adhesive Association Vol. 20, No. 7, pp300–308 (1984) may also be used.

With regard to these polymerizable compounds, the details of the methods of application as to the structure of each compound, whether these compounds are used singly or in combinations and the amount of these compounds, may be arbitrarily determined in accordance with the final design of the performance of a sensitive material. For example, these conditions are selected from the following point of view. A structure having an unsaturated group in a larger amount per molecule is preferable from the viewpoint of sensitizing speed. In many cases, polymerizable compounds having two or more functions are preferable. Also, in order to improve the strength of an image portion, namely a cured film, polymerizable compounds having three or more functions are preferable and polymerizable compounds having three or more functions of an acrylate unit are most preferable. Moreover, a method using a combination of polymerizable compounds being different from each other in the number of functions and the types of polymerizablegroups (e.g., a combination of any of an acrylate, methacrylate, styrene type compound or vinyl ether type compound) to thereby control both of the light-sensitivity and the strength is effective. Mcromolecular compounds and highly hydrophobic compounds may not be so preferable in terms of developing speed and precipitation in a developer, although these compounds are superior in light-sensitizing speed and film strength.

These polymerizable compounds may be used either singly or in combinations of two or more.

As to the compounding ratio of the polymerizable compound according to the invention, a larger ratio is more advantageous in terms of sensitivity. However, if the ratio is excessively large, undesirable phase separation may becaused, and a problem in a production process (for example, production inferiors resulted from the transfer and adhesion of a sensitive component) and a problem that precipitation from a developer (in the case of using this polymerizable compound for a planographic printing plate precursor) may arise. From these points of view, the amount of the component (A) in the polymerizable composition of the invention is preferably 20 to 70% by mass and more preferably 25 to 50% by mass based on all the solid, which is also the same to the case of using the polymerizable compound for the recording layer of a planographic printing plate precursor.

Also, in the case of using the polymerizable composition of the invention for the recording layer of a planographic printing plate precursor, the selection and method of using the addition polymerizable compound are important factors for the compatibility with and dispersibility in other components (e.g., the above specific polymer initiator (B) and colorants and binders as will be described later) in the recording layer. For example, there is a case where the compatibility can be improved by using a low purity compound and use of two or more addition polymerization compounds in combination.

((C) Compound Having the Maximum Absorption Wavelength at 700 to 1200 nm)

The polymerizable composition of the invention preferably contains, from the viewpoint of improving curability, a compound (hereinafter referred to as an infrared absorber) having a maximum absorption wavelength at 700 to 1200 nm. As the infrared absorber used in the present embodiment, an infrared absorbing dye or pigment having an absorption maximum at a wavelength of 700 to 1200 nm is preferable from the viewpoint of adaptability to an easily available high-output laser. The addition of such a compound (C) to the polymerizable compound makes it possible to use the polymerizable compound for forming an image by infrared laser, when the resultig polymerizable compound is used for the recording layer of a planographic printing plate precursor.

As such an infrared absorbing dye, commercially available dyes and known dyes described in documents such as "Dye Handbook" (edited by Organic Synthetic Chemical Association, published in 1970) may be used. Examples of these dyes include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squalilium dyes, pyrylium salts, metal thiorate complexes, oxonol dyes, diimonium dyes, aminium dyes and croconium dyes.

Preferable examples of these dyes may include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, squalilium dyes described in JP-A No. 58-112792 and cyanine dyes described in the specification of U.K. patent No. 434,875.

Also, a near-infrared absorption sensitizer described in the specification of U.S. Pat. No. 5,156,938 is preferably used. Substituted arylbenzo(thio)pyrylium salts described in the specification of U.S. Pat. No. 3,881,924, trimethinethiapyrylium salts described in JP-A No. 57-142645 (specification of U.S. Pat. No. 4,327,169), pyrylium type compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts and the like described in the specification of U.S. Pat. No. 4,283,475 and pyrylium compounds disclosed in each publication of JP-B Nos. 5-13514 and 5-19702 are also preferably used.

Other preferable examples as the dye may include near-infrared absorbing dyes described as the formulae (I) and (II) in the specification of U.S. Pat. No. 4,756,993.

Particularly preferable examples among these dyes include cyanine dyes, phthalocyanine dyes, oxonol dyes, squalilium dyes, pyrylium salts, thiopyrylium dyes and nickel thiorate complexes. Moreover, dyes represented by the following formulae (a) to (e) are desirable because these dyes are superior in photothermal conversion efficiency. Particuraly, cyanine dyes represented by the following general formula (a) is most preferable because these dyes imparts high polymerization activity when used in the recording layer in the present embodiment and are superior in stability and economy.

General formula (a)

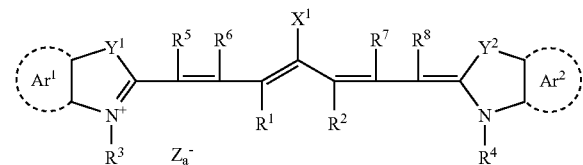

In the general formula (a), $X^1$ represents a hydrogen atom, a halogen atom, —$NAr_2$, $X^2$-$L^1$ or a group shown below, where Ar represents an aromatic hydrocarbon group having 6 to 18 carbon atoms, which may be substituted with a halogen atom, alkyl group, aryl group, alkenyl group, alkinyl group, cyano group, carboxyl group, nitro group, amide group, ester group, alkoxy group or amino group. Also, $X^2$ represents an oxygen atom or a sulfur atom and $L^1$ represents a hydrocarbon group having 1 to 12 carbon atoms, an aromatic ring having a heteroatom or a hydrocarbon group having 1 to 12 carbon atoms and containing a heteroatom. Here, the heteroatom represents N, S, O, a halogen atom or Se.

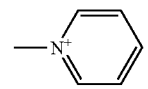

$R^1$ and $R^2$ respectively represent a hydrocarbon group having 1 to 12 carbon atoms. It is preferable that $R^1$ and $R^2$ respectively represent a hydrocarbon group having 2 or more carbon atoms from the viewpoint of the preserving stability of a recording layer coating solution. Further, it is particularly preferable that $R^1$ and $R^2$ be combined with each other to form a five-membered or six-membered ring.

$Ar^1$ and $Ar^2$, which may be the same or different, respectively represent an aromatic hydrocarbon group which may have a substituent. Preferable examples of the aromatic hydrocarbon group include a benzene ring and naphthalene ring. Also, preferable examples of the substituent include hydrocarbon groups having 12 or less carbon atoms, halogen atoms and alkoxy groups having 12 or less carbon atoms. $Y^1$ and $Y^2$, which may be of the same type or different types, each represent a sulfur atom or a dialkylmethylene group having 12 or less carbon atoms. $R^3$ and $R^4$, which may be of the same type or different types, each represent a hydrocarbon group having 20 or less carbon atoms, which group may have a substituent. Preferable examples of the substituent include alkoxy groups having 12 or less carbon atoms, carboxyl groups and sulfo groups. $R^5$, $R^6$, $R^7$ and $R^8$, which may be of the same type or different types, each represent a hydrogen atom or a hydrocarbon group having 12 or less carbon atoms. A hydrogen atom is preferable from the viewpoint of the availability of raw material. $Za^-$ represents a counter anion. When any one of $R^1$ to $R^8$ is substituted with a sulfo group, $Za^-$ is not needed. Preferable examples of $Za^-$ are a halogen ion, perchloric acid ion, tetrafluoroborate ion, hexafluorophosphate ion and sulfonic acid ion from the viewpoint of the preserving stability of a recording layer coating solution. A perchloric acid ion, hexafluorophosphate ion and arylsulfonic acid ion are particularly preferable.

Specific examples of the cyanine dye preferably used in the present embodiment may include, besides those exemplified below, those described in Paragraph Nos. [0017] to [0019] of JP-A No. 2001-133969, Paragraphs Nos. [0012] to [0038] of JP-A No. 2002-40638 and Paragraph Nos. [0012] to [0023] of JP-A No. 2002-23360.

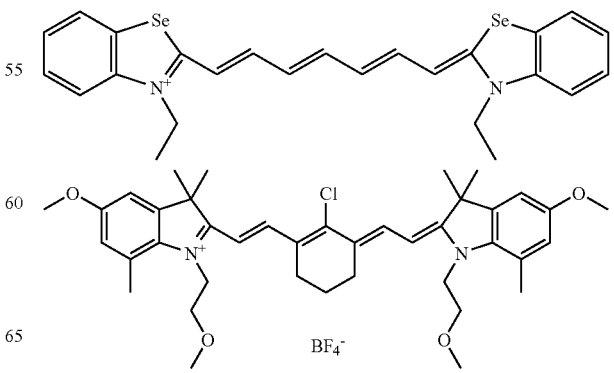

-continued

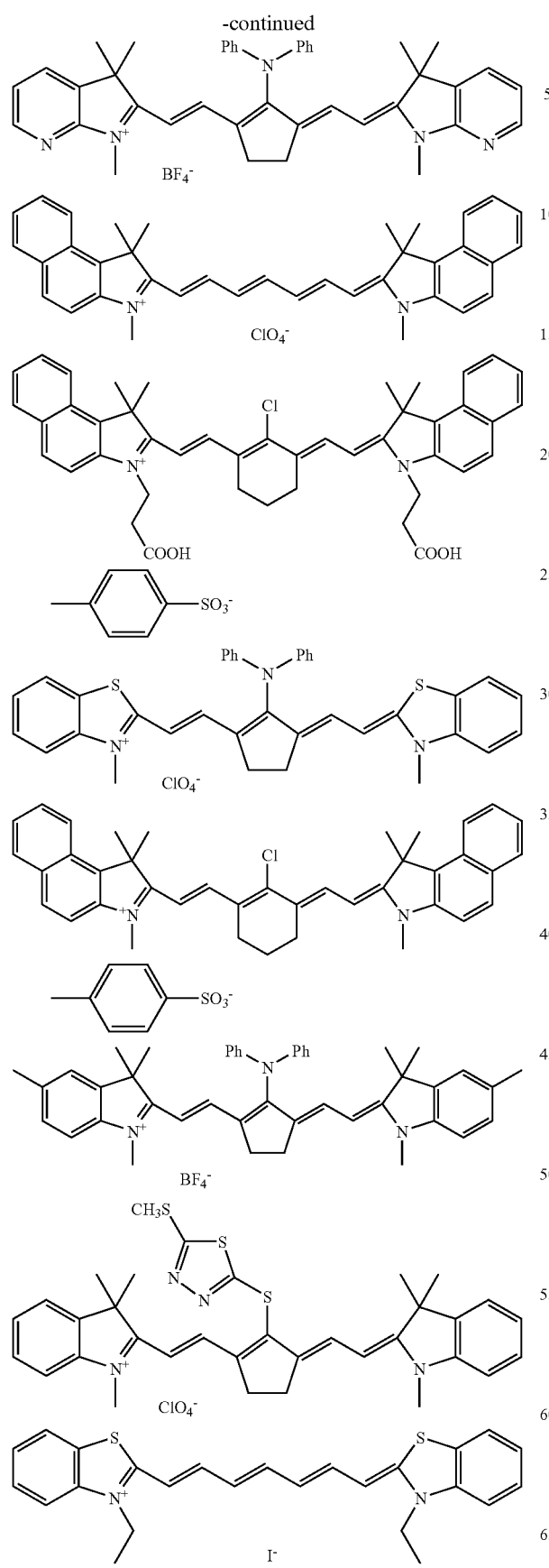
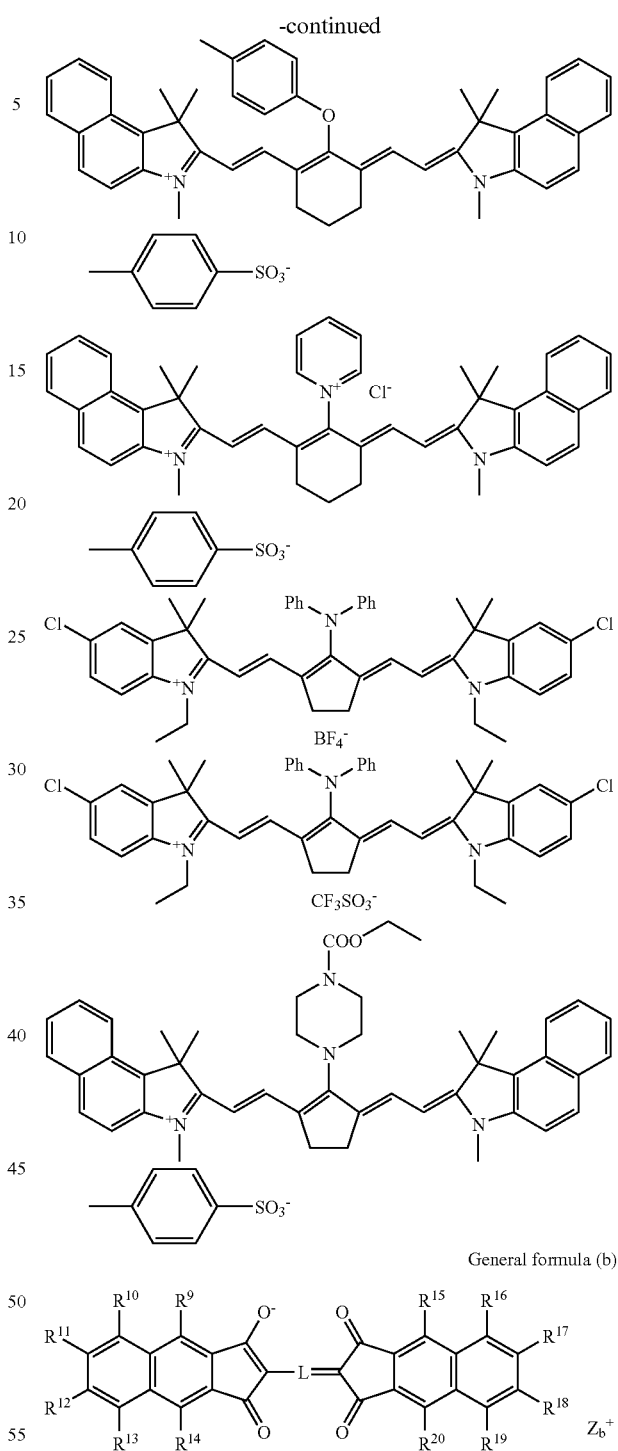

General formula (b)

In the general formula (b), L represents a methine chain having 7 or more conjugate carbon atoms wherein the methine chain may have substituents, these substituents maybe combined with each other to form a cyclic structure. $Z_b^+$ represents a counter cation. Preferable examples of the counter cation include ammonium, iodonium, sulfonium, phosphonium, pyridinium and alkali metal cations (Ni$^+$, K$^+$ and Li$^+$). $R^9$ to $R^{14}$ and $R^{15}$ to $R^{20}$ respectively represent a hydrogen atom or a substituent selected from a halogen atom, a cyano group, an alkyl group, an aryl group, an alkenyl group, an alkinyl group, a carbonyl group, a thio group, a sulfonyl group, a sulfinyl group, an oxy group and an amino group, or a substituent which is a combinations of two or three of these groups. These substituents may be combined with each other to form a ring structure. Here, those represented by the above general formula (b) wherein L represents a methine chain having 7 conjugate carbon atoms and all of $R^9$ to $R^{14}$ and $R^{15}$ to $R^{20}$ represent hydrogen atoms are preferable from the viewpoint of availability and effects.

Specific examples of the dye represented by the general formula (b) which is preferably used in the present embodiment may include those exemplified below.

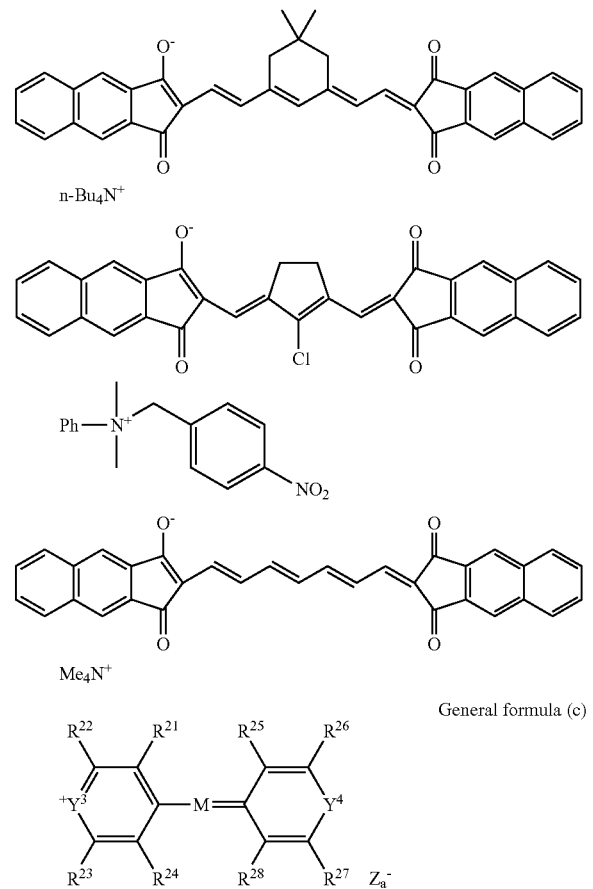

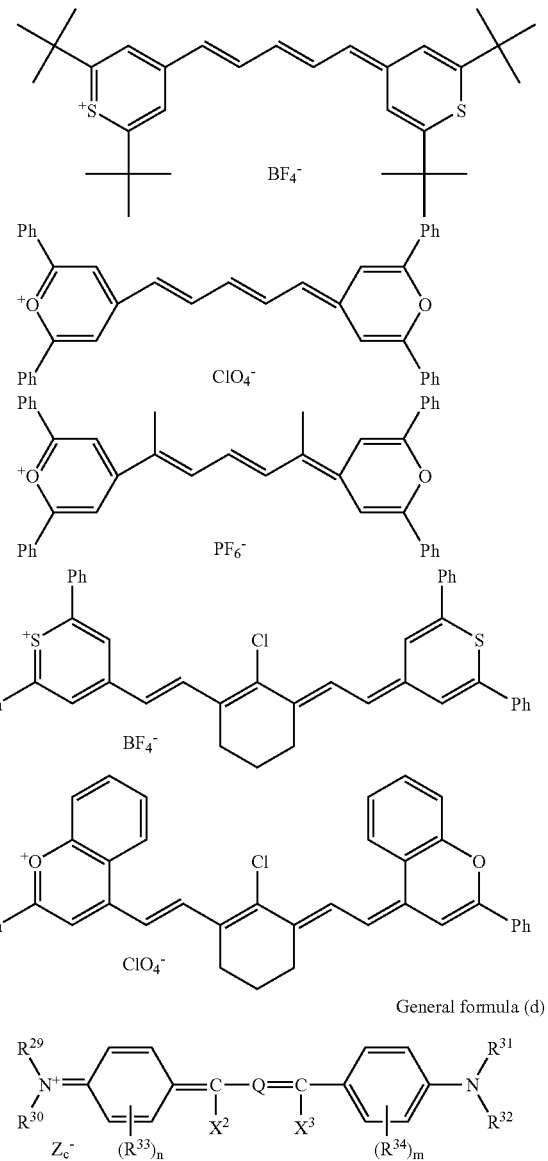

General formula (c)

In the general formula (c), $Y^3$ and $Y^4$ respectively represent an oxygen atom, a sulfur atom, a selen atom or a tellurium atom. M represents a methine chain having 5 or more conjugate carbon atoms. $R^{21}$ to $R^{24}$ and $R^{25}$ to $R^{28}$, which may be of the same type or different types, each represent a hydrogen atom, a halogen atom, a cyano group, an alkyl group, an aryl group, an alkenyl group, an alkinyl group, a carbonyl group, a thio group, a sulfonyl group, a sulfinyl group, an oxy group or an amino group. Also, in the general formula, $Z_a^-$ represents a counter anion and is defined as in the general formula (a).

Specific examples of the dye which may be preferably used and is represented by the general formula (c) in the present embodiment include those exemplified below.

General formula (d)

In the general formula (d), $R^{29}$ to $R^{31}$ respectively represent a hydrogen atom, an alkyl group or an aryl group. $R^{33}$ and $R^{34}$ respectively represent an alkyl group, a substituted oxy group or a halogen atom. n and m independently denote an integer from 0 to 4. $R^{29}$ and $R^{30}$ or $R^{31}$ and $R^{32}$ may be combined with each other to form a ring and also, $R^{29}$ and/or $R^{30}$ and $R^{33}$, or $R^{31}$ and/or $R^{32}$ and $R^{34}$ may be combined with each other to form a ring. Moreover, in the case where $R^{33}$ or $R^{34}$ is present in plural, $R^{33}$s or $R^{34}$s may be combined among them to form a ring. $X^2$ and $X^3$ respectively represent a hydrogen atom, an alkyl group or an aryl group. At least one of $X^2$ and $X^3$ represents a hydrogen atom or an alkyl group. Q is a trimethine group or a pentamethine group which may have a substituent and may form a cyclic structure in combination with a divalent organic group. $Z_c^-$ represents a counter anion and is defined as in the general formula (a).

Specific and preferable examples of the dye which is represented by the general formula (d) in the present embodiment include those exemplified below.

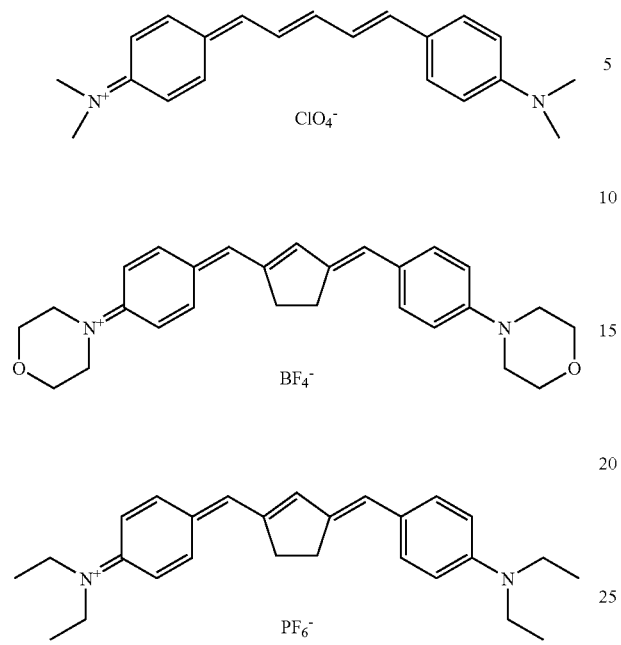

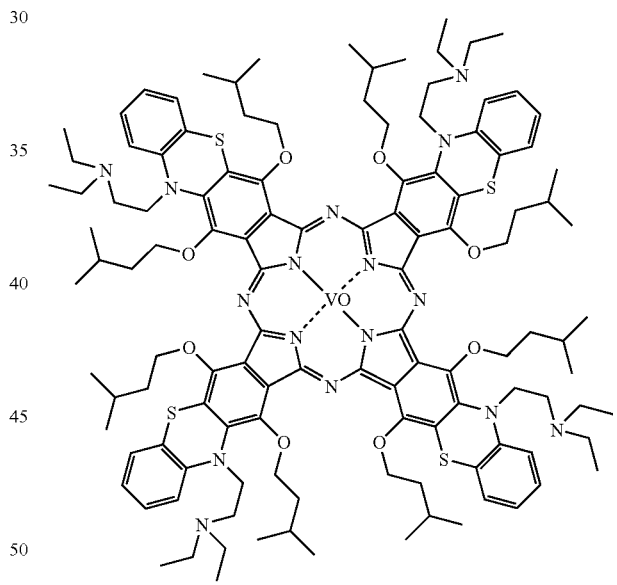

In the general formula (e), $R^{35}$ to $R^{50}$ independently represent a hydrogen atom, a halogen atom, a cyano group, an alkyl group, an aryl group, an alkenyl group, an alkinyl group, a hydroxyl group, a carbonyl group, a thio group, a sulfonyl group, a sulfinyl group, an oxy group, an amino group or an onium salt structure which may have a substituent. M represents two hydrogen atoms or a metal atom, a halo metal group or an oxy metal group. Examples of the metal atom include the IA, IIA, IIIB or IVB group atom and transition metals of the first, second or third period in the periodic chart and lanthanoid elements. Among these materials, copper, magnesium, iron, zinc, cobalt, aluminum, titanium and vanadium are preferable.

Specific and preferable examples of the dye which is represented by the general formula (e) in the present embodiment include those exemplified below.

Examples of the pigment used as the component (C) in the present embodiment include commercially available pigments and pigments described in Color Index (C. I.) Handbook, "Latest Pigment Handbook" (edited by Japan Pigment Technology Society, published in 1977), "Latest Pigment Applied Technology" (CMC Shuppan, published in 1986) and "Printing Ink Technology" (CMC Shuppan, published in 1984).

Examples of the pigment include black pigments, yellow pigments, orangepigments, brownpigments, redpigments, violet pigments, blue pigments, green pigments, fluorescent pigments, metal powder pigments, and others including polymer bound dyes. Specifically, as the pigment, insoluble azo pigments, azo lake pigments, condensed azo pigments, chelate azo dyes, phthalocyanine type pigments, anthraquinone type pigments, perylene or perinone type pigments, thioindigo type pigments, quinacridone type pigments, dioxazine type pigments, isoindolinone type pigments, quinophthalone type pigments, dyeing lake pigments, azine pigments, nitroso pigments, nitro pigments, natural pigments, fluorescent pigments, inorganic pigments, carbon black may be used. Among these pigments, carbon black is preferable.

These pigments can be used either without being surface-treated or with being surface-treated. As the surface treating methods, a method of coating the surface with a resin or wax, a method of sticking a surfactant and a method of binding a reactive material (e.g., a silane coupling agent, epoxy compound and polyisocyanate) with the surface of a pigment are considered. The aforementioned surface treating methods are described in "Quality and Application of Metal Soaps" (Saiwai Shobo), "Printing Ink Technology" (CMC Shuppan, published in 1984) and "Latest Pigment Apply Technology" (CMC Shuppan, published in 1986).

The particle diameter of the pigment is preferably in the range of 0.01 to 10 μm, more preferably in the range of 0.05 to 1 μm and particularly preferably in the range of 0.1 to 1 μm. When the particle diameter of the pigment is less than 0.01 μm, this is undesirable from the viewpoint of the stability of a dispersion in an image recording layer coating solution whereas when the particle diameter exceeds 10 μm, this is undesirable from the viewpoint of the uniformity of an image recording layer.

As a method of dispersing the pigment, known dispersing technologies used for the production of ink and toners may be used. Examples of a dispersing machine include a ultra-violet dispersing machine, sand mill, attritor, pearl mill, super mill, ball mill, impeller, disperser, KD mill, colloid mill, dynatron, three-roll mill and pressure kneader. The details of these machines are described in "Latest Pigment Apply Technology" (CMC Shuppan, published in 1986).

The infrared absorbers used in the present embodiment may be used either singly or in combinations of two or more.

As the infrared absorber used in the present embodiment, dyes such as a cyanine dye and oxonol type dye, which have an electric charge, are preferable because these dyes easily interact with an onium salt which is the counter cation of the initiator (B) and thereby image formation characteristics are improved.

Cyanine dyes shown in the general formula (a) are more preferable from the viewpoint of sensitivity. Among cyanine dyes represented by the general formula (a), cyanine dyes represented by the general formula (a) wherein $X^1$ is a diarylamino group or $X^2$-$L^1$ are preferable and such cyanine dyes having a diarylamino group are more preferable.

Also, cyanine dyes having an electron attractive group or a heavy atom-containing substituent at indolenine parts of both terminals are preferable and those described in, for example, the specification of JP-A No. 2001-6323 are preferably used.

The infrared absorber used for the polymerizable composition in the present embodiment is added preferably in an amount of 0.5 to 20% by mass, and more preferably in an amount of 1 to 10% by mass, in the whole solid, as in the case of using the infrared absorber for the recording layer of a planographic printing plate precursor. When the amount is excessively smaller than this range, the effect of the addition, namely, the effect of improving sensitivity to a change in characteristics by exposure is obtained only insufficiently, so that there is a tendency that only insufficient light-sensitivity is obtained. On the contrary, when the amount is excessively large, the uniformity and strength of the film tend to be deteriorated. Therefore, these cases are both undesirable.

(Application to a Planographic Printing Plate Precursor)

Next, application of the polymerizable composition of the present embodiment to a recording layer of a planographic printing plate precursor will be described.

A planographic printing plate precursor according to the present embodiment comprises a recording layer containing at least the aforementioned polymerizable compound (A), the aforementioned specific polymer initiator (B) and, preferably, further the infrared absorber (C) provided on a support and may be provided with other layers such as an intermediate layer and protective layer, if nesecessary.

(Recording Layer)

The recording layer having an image formation function provided in the planographic printing plate precursor according to the present embodiment will be described. The recording layer of the planographic printing plate precursor according to the present embodiment comprises the components (A), (B), and the component (C) as desired and preferably further comprises the binder polymer (D)

The above component (B) in the recording layer of the planographic printing plate precursor according to the present embodiment particularly functions as a polymerization initiator for initiating and promoting the polymerization of the polymerizable compound which is the component (A).

As the polymerizable compound (A) used for the recording layer of the planographic printing plate precursor, the same compound as that described in detail in the above-mentioned component (A) may be used. As to which compound to be selected as the compound (A), the aforementioned requirements therefore should be taken into account. Further, a specific structure may be selected for the purpose of improving the adhesiveness of a support, an overcoat layer and the like which will be described later.

As to a method of using the polymerizable compound, an appropriate structure, formulation and amount of the polymerizable compound can be optionally selected in consideration of the level of polymerization inhibition with respect to oxygen, resolution, fogging characteristics, a change in refractive index, surface adhesiveness and the like. In some cases, a specific layer structure/coating method such as undercoating and over-coating may be employed.

The above component (C) is added to the same recording layer together with other components (compositions) used for the recording layer, but may be added to a layer formed separately from the recording layer.

The component (C) is preferabley a compound which ensures that, when the recording layer of a negative-type planographic printing plate precursor is formed, optical density at the absorption maximum of the recording layer in a wavelength range from 700 nm to 1200 nm falls between 0.1 to 3.0. When the optical density is deviated from this range, the sensitivity tends to be deteriorated. The optical density is determined by the amount of the component (A) which has been added and the thickness of the recording layer and therefore, desired optical density is obtained by controlling the conditions of the both. The optical density of the recording layer may be measured using a usual method. Examples of the measuring method include: a method in which a recording layer, having a thickness which has been appropriately set such that the coating amount thereof after being dried is within a range required for a planographic printing plate, is formed on a transparent or white support, to measure optical density using a transmission type optical densitometer; and a method in which a recording layer is formed on a reflective support such as an aluminum support, to measure reflection density.

(D) Binder Polymer

In the planographic printing plate precursor according to the present embodiment, it is preferable to further use a binder polymer in the recording layer. It is preferable that the recording layer contains a linear organic macromolecular polymer as the binder polymer. Any typd of a liner organic macromolecular polymer may basically be used as such the "linear organic macromolecular polymer". A linear organic macromolecular polymer which is soluble to water or weak-alkali water or can be swelled therein and which enables water developing or weak-alkali water developing is preferably selected. The linear organic macromolecular polymer may appropriately be selected and used, in accordance with the application, e.g., not only as an agent for forming a film of the composition but also as a water, weak-alkali water or organic solvent developer. For example, the use of a water-soluble organic macromolecular polymer enables water developing. Examples of the linear organic macromolecular polymer include addition polymers having a carboxylic acid group at the side chain, for example, those described in JP-A No. 59-44615, JP-B No. 54-34327, JP-B No. 58-12577, JP-B No. 54-25957, JP-A No. 54-92723, JP-A No. 59-53836 and JP-A No. 59-71048, namely, methacrylic acid copolymers, acrylic acid copolymers, itaconic acid copolymers, crotonic acid copolymers, maleic acid copolymers and partially esterified maleic acid copolymers. Similarly, examples of the linear organic macromolecular polymer include acidic cellulose derivatives having a carboxylic acid group at the side chain. Besides the above compounds, those obtained by adding a cyclic acid anhydride to an addition polymer having a hydroxyl group are useful.

Among these compounds, [benzyl(meth)acrylate/(meth) acrylic acid/other addition polymerizable vinyl monomer as required] copolymers, allyl(meth)acrylate/(meth)acrylic acid/other addition polymerizable vinyl monomer as required] copolymers, polymers having an acryl group as described in the example of JP-A No. 2000-131837 are superior in the balance between film strength, sensitivity and developing ability and are therefore preferable.

Also, acid group-containing urethane type binder polymers as described in each publication of JP-B Nos. 7-12004, 7-120041, 7-120042 and 8-12424, JP-A Nos. 63-287944, 63-287947 and 1-271741 and Japanese Patent Application No. 10-116232 have very high strength and are therefore advantageous in light of printing durability and adaptability to low exposure light.

Also, binders having an amide group as described in JP-A No. 11-171907 have excellent developing ability and film strength and are therefore preferable.

Furthermore, besides the above compounds, polyvinyl pyrrolidone, polyethylene oxide and the like are useful as the water-soluble linear organic polymer. In order to improve the strength of a cured film and alcohol-soluble nylon, a polyether of 2,2-bis-(4-hydroxyphenyl)-propane and epichlorohydrin and the like are useful. These linear organic macromolecular polymer may be mingled in a desired amount in the whole composition. However, when the amount exceeds 90% by mass, this produces an undesirable effect on the strength of an image to be formed. The amount is preferably 30 to 85% by mass. The ratio by mass of the polymerizable compound (B) to the linear organic macromolecular polymer is preferably designed to be in the range of 1/9 to 7/3.

As the binder polymer in the present embodiment, those which are substantially insoluble in water but soluble in an aqueous alkali solution are used. This ensures that any of organic solvents which are environmentally undesirable is not used or, at least, the amount of organic solvents to be used can be limited to a very small level. The acid value (acid content per 1 g of a polymer, expressed by the number of chemical equivalents) and molecular weight of the binder polymer like this are properly selected from the viewpoint of image strength and developing characteristics. The acid value is preferably 0.4 to 3.0 meq/g and the molecular weight is preferably in the range of 3000 to 500,000. It is more preferable that the acid value be in the range of 0.6 to 2.0 and the molecular weight be in the range of 10,000 to 300,000.

(E) Other Components

Other components suitable to the use and production method of a planographic printing plate precursor may be further appropriately added to the composition constituting the recording layer of the planographic printing plate precursor. Preferable examples of these additives will be shown hereinbelow.

(E-1) Cosensitizer

The sensitivity can be more improved by using a certain additive (hereinafter referred to as a cosensitizer). Although such a mechanism of an action on the improvement in sensitivity is not clear, most part of the mechanism is presumably based on the following chemical process. Specifically, it is inferred that various intermediate active species (radicals and cations) generated during the course of a photo-reaction initiated by a thermal polymerization initiator and the succeeding addition polymerization reaction are reacted with the cosensitizer to generate new active radicals. These new active radicals may be roughly classified into (a) a type which can be reduced to produce active radicals, (b) a type which can be oxidized to produce active radicals and (c) a type which are reacted with a less active radical and is converted into a more active radical or acts as a chain transfer agent. However, there is, in many cases, no common opinion as to which type individual compounds belong to which of these types.

(a) Compounds Which are Reduced to Generate Active Radicals

Compounds having a carbon-halogen bond: it is considered that a carbon-halogen bond is cleft reducibly to generate active radicals. Specifically, for example, trihalomethyl-s-triazines and trihalomethyloxadiazoles are preferably used.

Compounds having a nitrogen-nitrogen bond: it is considered that a nitrogen-nitrogen bond is cleft reducibly to generate active radicals. Specifically, hexaarylbiimidazoles are preferably used.

Compounds having an oxygen-oxygen bond: it is considered that an oxygen-oxygen bond is cleft reducibly to generate active radicals. Specifically, organic peroxides are preferably used.

Onium compounds: it is considered that a carbon-hetero bond or an oxygen-nitrogen bond is cleft reducibly to generate active radicals. Specifically, diaryliodonium salts, triarylsulfonium salts and N-alkoxypyridinium (azinium) salts are preferably used.

Ferrocene, iron arene complexes: these compounds can produce active radicals reducibly.

(b) Compounds Which are Oxidized to Generate Active Radicals

Alkylate complexes: it is considered that a carbon-hetero bond is oxidatively cleft to generate active radicals. Specifically triarylalkyl borates are preferably used.

Alkylamine compounds: it is considered that a C—X bond on carbon adjacent to nitrogen is oxidatively cleft to generate active radicals. As X, a hydrogen atom, carboxyl group, trimethylsilyl group and benzyl group are preferable. Specific examples of the alkylamine compound include ethanolamines, N-phenylglycines and N-trimethylsilylmethylanilines.

Sulfur-containing or tin-containing compounds: Compounds obtained by replacing the nitrogen atom of the above amines with a sulfur atom or a tin atom can create active radicals by the same action. Also, compounds having a S—S bond are known to sensitize due to a S—S cleavage.

α-Substituted methylcarbonyl compounds: these compounds can generate active radicals by a cleavage of the bond between carbonyl and α-carbon which the cleavage is caused by oxidation. Compounds obtained by converting the carbonyl of the above α-substituted methylcarbonyl compounds into an oxime ether exert the same action. Specific examples of these compounds may include 2-alkyl-1-[4-(alkylthio)phenyl]-2-morpholinopronone-1s and oxime ethers obtained by reacting the above compounds with hydroxyamines and then etherfying N—OH.

Sulfinates: these compounds can generate active radicals reducibly. Specific examples of these sulfinates may include sodium arylsulfinate.

(c) Compounds which are reacted with a radical, to be converted into a highly active radical or function as a chain transfer agent: for instance, a compound group having SH, PH, SiH or GeH in its molecule is used. The compound group donates hydrogen to a less active radical to generate radicals or can produce radicals by oxidizing it, followed by deprotonation. Specific examples of the compound group include 2-mercaptobenzimidazoles.

More specific examples of these cosensitizers are described, for example, in JP-A No. 9-236913 as additives for improving sensitivity. These sensitizers maybe applied in the present embodiment.

These cosensitizers may be used either singly or in combinations of two or more. The amount of these cosensitizers to be used is 0.05 to 100 mass parts, preferably 1 to 80 mass parts and more preferably 3 to 50 mass parts based on 100 mass parts of the aforementioned polymerizable compound (B).

(E-2) Polymerization Inhibitor

Also, in addition to the above basic components of the present embodiment, it is preferable to add a small amount of a thermopolymerization preventive agent to prevent unnecessary thermal polymerization of the polymerizable compound during production and storage of the composition used for the recording layer. Suitable examples of the thermopolymerization preventive agent include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine cerous salt. The amount of the thermopolymerization preventive agent to be added is preferably about 0.01% by mass to about 5% by mass based on the mass of the whole composition. Also, when a higher fatty acid derivative such as behenic acid or behenic acid amide or the like is optionally added, to prevent polymerization inhibition due to oxygen in production of a planographic printing plate precursor, the higher fatty acid derivative may be localized on the surface of the recording layer during the course of drying after applying the fatty acid to a support or the like. The amount of the higher fatty acid derivative is preferably about 0.5% by mass to about 10% by mass based on the whole composition.

(E-3) Colorants

Moreover, in the planographic printing plate precursor according to the present embodiment, dyes or pigments may be added with the intention of coloring the recording layer. This can improve so-called plate inspection characteristics such as visibility after plate-making and adaptability to an image density measuring instrument. Because many dyes deteriorate the sensitivity of photopolymerization type recording layer, particularly pigments are preferably used as the colorant. Specific examples of these pigments include pigments such as phthalocyanine type pigments, azo type pigments, carbon black and titanium oxide and dyes such as Ethyl Violet, Crystal Violet, azo type dyes, anthraquinone type dyes and cyanine type dyes. The amount of the dye and pigment to be added is preferably about 0.5% by mass to about 5% by mass based on the whole composition.

(E-4) Other Additives

Moreover, in the planographic printing plate precursor according to the present embodiment, known additives such as inorganic fillers for improving the qualities of a cured film, other plasticizers and a fat sensitizer capable of improving inking characteristics of the surface of the recording layer may be added.

Examples of the aforementioned plasticizer include dioctyl phthalate, didodecyl phthalate, triethylene glycol dicaprylate, dimethyl glycol phthalate, tricrezyl phosphate, dioctyl adipate, dibutyl sebacate and triacetyl glycerol. When using a binder, the plasticizer may be added in an amount of 10% by mass or less based on the total mass of the compound having an ethylenic unsaturated double bond and the binder.

Also, a UV initiator, thermal crosslinking agent and the like for strengthening the effects of heating/exposing after developing may be added for the purpose of improving the film strength (printing durability) which will be described later.

Besides the above, the planographic printing plate precursor may be provided with additives and intermediate layers for improving the adhesion between the recording layer and the support and for improving the developing removability of an unexposed recording layer. For example, the addition or undercoating of compounds, such as a compound having a diazonium structure and a phosphonic compound, which have a relatively strong interaction with the substrate make it possible to improve adhesiveness and to enhance printing durability. Meanwhile, the addition or undercoating of hydrophilic polymers such as a polyacrylic acid and polysulfonic acid make it possible to improve the developing characteristics of a non-image portion and resistance to contamination.

As to the planographic printing plate precursor according to the present embodiment, the aforementioned recording layer coating solution and solutions prepared by dissolving coating solution components of desired layers such as a protective layer and resin intermediate layers as will be described later by using a solvent are applied to a proper support, whereby the planographic printing plate precursor can be produced.

Examples of the solvent to be used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl acetate, propylene glycol monoethyl ether acetate, 3-methoxydipropyl acetate, N,N-dimethylformamide, dimethylsulfoxide, γ-butyrolactone, methyl lactate and ethyl lactate. These solvents may be used either singly or by mixing. The concentration of a solid in the coating solution is appropriately 2 to 50% by mass.

It is desirable to properly select the amount of the recording layer to be applied to the support according to use in consideration of the influences of the sensitivity of the recording layer, developing characteristics, the strength of an exposed film and printing durability. When the coating amount is excessively small, only insufficient printing durability is obtained whereas when the coating amount is excessively large, sensitivity is deteriorated, a long time is taken for exposure and also a long time is required for developing treatment and therefore these cases are undesirable. The amount of the recording layer to be applied in the planographic printing plate precursor according to the present embodiment is generally in a range of about 0.1 to about 10 g/m$^2$ and more preferably in the range of 0.5 to 5 g/m$^2$ as mass after the film is dried.

(Protective Layer)

The planographic printing plate precursor according to the present embodiment is usually subjected to exposure to light in the atmosphere, and it is therefore desirable to form a protective layer further on the recording layer. The protective layer prevents low-molecular weight compounds such as oxygen and basic materials, which are present in the atmosphere and inhibit an image forming reaction caused by exposure in the recording layer, from mingling with the recording layer and enabling exposure in the atmosphere. Therefore, preferable characteristics required for the protective layer are: low permeability with respect to low molecular weight compounds such as oxygen; high transmittance for the light used for exposure; good adhesion to the recording layer; and easy removality in a developing step after exposure.

Various attempts have been made with regards to the protective layer and are described in detail in the specification of U.S. Pat. No. 3,458,311 and JP-A No. 55-49729. As materials which may be used for the protective layer, for example, water-soluble macromolecular compounds having relatively high crystallinity are preferably used. Specifically, water-soluble polymers such as polyvinyl alcohols, polyvinyl pyrrolidones, acidic celluloses, gelatins, gum arabic and polyacrylic acids are known. The use of polyvinyl alcohols among these compounds as a major component brings about the best results on basic properties such as oxygen-shutting ability and developing removing ability. The polyvinyl alcohol used for the protective layer may be partly substituted with an ester, ether and acetal as far as it contains an unsubstituted vinyl alcohol unit which provides the protective layer with oxygen-shutting ability and water-solubility. Also, a part of the polyvinyl alcohol may have other polymer components in the same manner.

As specific examples of the polyvinyl alcohol, those in which 71 to 100% thereof is hydrolyzed and which have a molecular weight ranging from 300 to 2400 maybe given. Specific examples of the polyvinyl alcohol include products manufactured by Kuraray Co., Ltd., such as PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8.

The component (selection of PVA and the uses of additives), amount and the like of the protective layer are selected in consideration of fogging characteristics, adhesiveness and scratching resistance besides oxygen-shutting ability and developing removing ability.

Generally, the higher the hydrolysis rate of PVA to be used (the higher the content of an unsubstituted vinyl alcohol unit in the protective layer is) and the higher the film thickness is, the higher the oxygen-shutting ability is, which is advantageous in view of sensitivity. However, when the oxygen-shutting ability is made extremely high, this brings about such a problem that an unnecessary polymerization reaction arises during production and live storage and also, unnecessary fogging and thickening of image lines are caused when imagewise exposure is carried out. Also, the adhesion of the protective layer to the image portion and scratching resistance are remarkably important in light of the handling of the plate. In short, if a hydrophilic layer consisting of a water-soluble polymer is laminated on a lipophilic polymer layer, peeling of a film due to an inferior adhesion tends to arise and the peeled portion causes defects such as film curing inferior due to polymerization inhibition by oxygen.

To deal with this problem, various proposals have been made to improve the adhesion between these two layers. In, for example, each specification of U.S. Pat. Nos. 292,501 and 44,563, there is the description that an acrylic emulsion or a water-insoluble vinylpyrrolidone/vinyl acetate copolymer is contained in an amount of 20 to 60% by mass in a hydrophilic polymer primarily containing a polyvinyl alcohol and the resulting solution is laminated on a polymer layer thereby obtaining sufficient adhesiveness. These known technologies may be all applied to the protective layer in the present embodiment. The details of a method of applying such a protective layer are described in, for example, the specification of U.S. Pat. No. 3,458,311 and JP-A No. 55-49729.

Moreover, other functions can be provided to the protective layer. For example, a safe light aptitude can be more improved without deteriorating sensitivity by adding colorants (e.g., water-soluble dyes) which are superior in transmittance for light having a wavelength used for exposure and also can efficiently absorb light having a wavelength which does not contribute to the formation of an image are added.

Also, as the protective layer in the planographic printing plate precursor according to the present embodiment, a protective layer having an oxygen permeability of $1\times10^{-15}$ {cm$^3$ (STP)·cm/cm$^2$·sec·cmHg} as described in JP-A No. 2000-347398 is preferably used.

(Resin Intermediate Layer)

In the planographic printing plate precursor according to the present embodiment, a resin intermediate layer comprising an alkali-soluble polymer may be disposed between the recording layer and the support, if desired.

A recording layer as an infrared-responsive layer, which reduces solubility to an alkali developer by exposure, is disposed on the surface to be exposed or in the vicinity of the surface, so that sensitivity to an infrared laser is enhanced. Also, the above-mentioned resin intermediate layer is provided between the support and the infrared-responsive recording layer and functions as an insulation layer, so that the heat generated by the exposure to an infrared laser is not diffused to the support and is used efficiently to thereby attain high sensitization.

Also, in the exposed portion, the recording layer which has been made alkali-developer-non-permeable by exposure functions as a protective layer of the resin intermediate layer. Therefore, developing stability is improved, an image having high discrimination is formed and stability with time is likely to be secured. In the unexposed portion, an uncured binder component is rapidly dissolved and dispersed in a developer. Also, since the resin intermediate layer present adjacent to the support comprises an alkali-soluble polymer, the resin intermediate layer has high solubility to a developer. Even if a developer whose efficacy has deteriorated is used, the intermediate layer is still rapidly dissolved without generating residual film, whereby good developing characteristics are reliably obtained.

(Support)

No particular limitation is imposed on the support to be used for the planographic printing plate precursor according to the present embodiment insofar as it is a dimensionally stable plate material. Examples of the support material include paper, paper on which plastics (e.g., a polyethylene, polypropylene and polystyrene) are laminated, metal plates (e.g., aluminum, zinc and copper), plastic films (e.g., cellulose diacetate, cellulose triacetate, cellulose propionate, cellulose butyrate, butyric acid cellulose butyrate, cellulose nitrate, polyethylene terephthalate, polyethylene, polystyrene, polypropylene, polycarbonate and polyvinylacetal). The support materials may be sheets consisting of a single component such as a resin film or a metal plate or laminates consisting of two or more materials. For example, paper or plastic films on which metals as mentioned above are laminated or deposited and laminated sheets among different types of plastic films are included as examples of the support material.

As the support material, a polyester film or an aluminum plate is preferable. Among these materials, an aluminum plate which is dimensionally stable and relatively inexpensive is particularly preferable. Preferable aluminum plates are a pure aluminum plate and an alloy plate containing aluminum as a major component and a minute amount of different elements. Further, plastic films on which aluminum is laminated or deposited may be used. Examples of these different elements include silicon, iron, manganese, copper, magnesium, chromium, zinc, bismuth, nickel and titanium. The content of these different elements in the alloy is 10% by mass at most. Particularly preferable aluminum in the invention is pure aluminum. However, because it is difficult to produce completely pure aluminum from a limitation on refining technologies, aluminum containing different elements a little may be used. The aluminum plate applied to the invention is not specified in its composition and aluminum plates consisting of conventionally known and commonly used materials may be used appropriately.

The thickness of the aluminum plate is about 0.1 to 0.6 mm, preferably 0.15 to 0.4 mm and particularly preferably 0.2 to 0.3 mm.

Before roughing the aluminum plate, degreasing treatment using, for example, a surfactant, organic solvent or an aqueous alkali solution is carried out to remove roll oil from the surface.

The roughing treatment of the surface of the aluminum plate is carried out using various methods, for example, a method in which the surface is roughened mechanically, a method in which the surface is dissolved and roughened electrochemically and a method in which the surface is selectively dissolved chemically. As the mechanical method, known methods such as a ball abrasive method, brush abrasive method, blast abrasive method and buff abrasive method may be used. Also, the electrochemical surface roughing method include a method using a.c. current or d.c. current in a hydrochloric acid or nitric acid electrolyte. Also, a method which is a combination of the both may be utilized as disclosed in JP-A No. 54-63902.

The aluminum plate which is surface-roughened in this manner may be subjected to anodic oxidation treatment through alkali-etching treatment and neutralizing treatment as desired to raise the moisture retentivity and wear resistance of the surface. As the electrolyte used for the anodic oxidation treatment of the aluminum plate, various electrolytes capable of forming a porous oxide film may be used and sulfuric acid, phosphoric acid, oxalic acid, chromic acid or a mixed acid of these acids may be used in general. The concentration of these electrolytes is determined according to the type of electrolyte.

Although the process condition of the anodic oxidation cannot be specified as a whole because it varies depending on the type of electrolyte, the condition is properly in the following ranges in general: concentration of an electrolyte, 1 to 80% by mass; solution temperature, 5 to 70° C.; current density, 5 to 60 A/dm$^2$; voltage, 1 to 100 V; and electrolytic time, 10 seconds to 5 minutes.

The amount of the anodic oxide film is properly in the range of 1.0 g/m$^2$ or more and more preferably in the range of 2.0 to 6.0 g/m$^2$. When the amount of the anodic oxide film is less than 1.0 g/m$^2$, unsatisfactory printing durability is obtained and a non-image portion is easily scratched and the so-called "flaw dirt" which is a phenomenon that ink adheres to the flaw portion during printing tends to arise.

Incidentally, such anodic oxidation treatment is carried out to treat the side of the support of a planographic printing plate which side is used for printing: however, an anodic oxide film 0.01 to 3 g/m$^2$ in thickness is usually formed on the backface because a line of electric force is turned around the backside.

The hydrophilic treatment of the surface of the support is carried out after the above anodic oxidation treatment. Conventionally known treating methods are used as this hydrophilic treatment. Examples of such hydrophilic treatment include an alkali metal silicate (for example, an aqueous sodium silicate solution) method as described in each specification of U.S. Pat. Nos. 2,714,066, 3,181,461, 3,280,734 and 3,902,734. In this method, the support is treated by dipping it or electrolytically treated in an aqueous sodium silicate solution. Other than above, for example, a treating method using potassium fluorozirconate as disclosed in the publication JP-B No. 36-22063 and a treating method using a polyvinylphosphonic acid as disclosed in each specification of U.S. Pat. Nos. 3,276,868, 4,153,461 and 4,689,272 are used.

Among these treatments, particularly preferable hydrophilic treatment in the invention is silicate treatment. This silicate treatment will be described hereinbelow.

The anodic oxide film of the aluminum plate processed by the aforementioned treatments is dipped in an aqueous solution containing an alkali metal silicate in an amount of 0.1 to 30% by mass and preferably 0.5 to 10% by mass and having a pH value of 10 to 13 (at 25° C.), for example, at a temperature in a range of 15 to 80° C. for 0.5 to 120 seconds. If the pH of the alkali metal silicate solution is less than 10, the solution is gelled whereas if the pH is higher than 13.0, the oxide film is dissolved. As the alkali metal silicate to be used in the invention, sodium silicate, potassium silicate, lithium silicate or the like is used. Examples of a hydroxide to be used to raise the pH of the aqueous alkali metal silicate solution include sodium hydroxide, potassium hydroxide and lithium hydroxide. It is to be noted that alkali earth metal salts or IVB group metal salts may be contained in the above processing solution. Examples of the alkali earth metal salt include water-soluble salts, for example, nitrates such as calcium nitrate, strontium nitrate, magnesium nitrate, barium nitrate, sulfates, hydrochlorides, phosphates, acetates, oxalates and borates. Examples of the IVB group metal salts may include titanium tetrachloride, titanium trichloride, titanium fluoride potassium, titanium oxalate potassium, titanium sulfate, titanium tetraiodide, chlorinated zirconium oxide, zirconium dioxide, zirconium oxychloride and zirconium tetrachloride. These alkali earth metal salts or IVB group metal salts may be used either singly or in combinations of two or more. The amount of these metal salts is preferably in the range of 0.01 to 10% by mass and more preferably in the range of 0. 05 to 5.0% by mass.

The surface of the aluminum plate is made more hydrophilic by the silicate treatment, so that ink scarcely adheres to a non-image portion during printing and therefore resistance to contamination is improved.

A backcoat layer is formed on the backface of the support, if necessary. As such a backcoat, a coating layer comprising a metal oxide obtained by hydrolyzing or polymerization-condensing an organic macromolecular compound as described in JP-A-5-45885 or an organic or inorganic metal compound as described in JP-A-6-35174 is preferably used.

Among these coating layers, coating layers comprising a metal oxide obtained from alkoxy compounds of silicon such as $Si(OCH_3)_4$, $Si(OCH_2H_5)_4$, $Si(O_3H_7)_4$ and $Si(OCH_4H_9)_4$ are particularly preferable because these alkoxy compounds are inexpensive and easily available and the coating layer of a metal oxide obtained therefrom is superior in resistance to developing.

(Exposure)

The planographic printing plate precursor according to the present embodiment can be produced in the above manner. The planographic printing plate precursor is imagewise-exposed by using a solid laser or a semiconductor laser which radiates infrared rays having a wavelength from 760 nm to 1200 nm. In the present embodiment, although developing treatment may be carried out immediately after laser radiation, heat treatment may be carried out between the laser radiation step and the developing step. The heat treatment is preferably carried out under the condition of the temperature ranging from 80° C. to 150° C. and the treating time ranging from 10 seconds to 5 minutes. This heat treatment ensures that the laser energy required for recording can be reduced during laser radiation.

(Developing)

The planographic printing plate precursor according to the present embodiment is developed using preferably water or an aqueous alkaline solution, generally after it is imagewise-exposed by using an infrared laser.

In the present embodiment, although developing treatment may be carried out immediately after laser radiation, heat treatment may be carried out between the laser radiation step and the developing step. The heat treatment is preferably carried out under the condition of the temperature ranging from 80° C. to 150° C. and the treating time ranging from 10 seconds to 5 minutes. This heat treatment ensures that the laser energy required for recording can be reduced during laser radiation.

As the developer, an aqueous alkali solution is preferable. As examples of a preferable pH range, a pH range from 10.5 to 12.5 is given. It is more preferable to carry out developing treatment using an aqueous alkali solution having a pH ranging from 11.0 to 12.5. If one having a pH less than 10.5 is used as the aqueous alkaline solution, there is a tendency that the contamination of a non-image portion is easily caused, whereas if an aqueous solution having a pH exceeding 12.5, there is a possibility that the strength of an image portion is reduced.

In the case of using an aqueous alkali solution as the developer, conventionally known aqueous alkali solution may be used as the developer and replenishing solution for the planographic printing plate precursor according to the present embodiment. Examples of the alkali agents include inorganic alkali salts such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. Also, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine are used.

These alkali agents are used either singly or in combinations of two or more.

Moreover, it is known that in the case of developing using an automatic developing machine, the same developer or an aqueous solution (replenishing solution) having a higher alkali strength than the developer is added to the developer, whereby a large number of planographic printing plate precursor can be treated without exchanging the developer in the developing tank for a long period of time. In the present embodiment, this make-up system is also preferably applied.

Various surfactants and organic solvents may be contained in the developer and the replenishing solution, as required for promoting or suppressing developing ability, dispersing developing residues and raising the affinity of the printing plate image portion to ink.

The surfactant is added to the developer in an amount ranging from preferably 1 to 20% by mass and more preferably 3 to 10% by mass. If the amount of the surfactant to be added is less than 1% by mass, the effect of improving developing characteristics is insufficient whereas if the surfactant is added in an amount exceeding 20% by mass, defects such as a reduction in strength such as the wear resistance of an image tend to occur.

Preferable examples of the surfactant include anionic, cationic, nonionic and amphoteric surfactants. Specific examples of these surfactants include sodium salts of lauryl alcohol sulfate, ammonium salts of lauryl alcohol sulfate, sodium salts of octyl alcohol sulfate, alkylaryl sulfonates such as sodium salts of isopropylnaphthalenesulfonic acid, sodium salts of isobutylnaphthalenesulfonic acid, sodium salts of polyoxyethylene glycol mononaphthylethyl sulfate, sodium salts of dodecylbenzenesulfonic acid and sodium salts of methanitrobenzenesulfonic acid, higher alcohol sulfates having 8 to 22 carbon atoms such as disodium alkylsulfates, aliphatic alcohol phosphates such as sodium salts of cetyl alcohol phosphate, sulfonates of alkylamides such as $C_{17}H_{33}CON(CH_3)CH_2CH_2SO_3Na$, sulfonates of dibasic aliphatic esters such as sodium sulfosuccinic acid dioctyl ester and sodium sulfosuccinic acid dihexyl ester, ammonium salts such as lauryltrimethylammonium chloride and lauryltrimethylammonium methosulfate, amine salts such as stearamidoethyldiethylamine acetate, polyhydric alcohols such as fatty acid monoesters of glycerol and fatty acid monoesters of pentaerythritol and polyethylene glycol ethyls such as polyethylene glycol mononaphthylethyl and polyethylene glycol mono(nonylphenol)ethyl.

Preferable examples of the organic solvent include those having a solubility of about 10% by mass or less in water and the organic solvent is more preferably selected from organic solvents having a solubility of 5% by mass or less in water. Examples of these organic solvents include 1-phenylethanol, 2-phenylethanol, 3-phenylpropanol, 1,4-penylbutanol, 2,2-phenylbutanol, 1,2-phenoxyethanol, 2-benzyloxyethanol, o-methoxybenzylalcohol, m-methoxybenzylalcohol, p-methoxybenzylalcohol, benzyl alcohol, cyclohexanol, 2-methylcyclohexanol, 4-methylcyclohexanol and 3-methylcyclohexanol. The content of the organic solvent is preferably 1 to 5% by mass based on the total amount of the developer when used. The amount of the organic solvent to be used is closely related to the amount of the surfactant to be used. It is preferable to increase the amount of the surfactant along with an increase in the amount of the organic solvent. This reason is that if a large amount of the organic solvent is used in the condition that the amount of the surfactant is small, the organic solvent is not dissolved and therefore, it is no longer expected to secure good developing characteristics.

Moreover, additives such as an antifoaming agent and a water softener may be contained in the developer and the replenishing solution, if necessary. Examples of the water softener may include polyphosphates such as $Na_2P_2O_7$, $Na_5P_3O_3$, $Na_3P_3O_9$, $Na_2O_4P(NaO_3P)PO_3Na_2$ and Calgon (sodium polymethaphosphate), aminopolycarboxylic acids such as ethylenediaminetetraacetic acid and its potassium or sodium salt; diethylenetriaminepentaacetic acid and its potassium or sodium salt; triethylenetetraminehexaacetic acid and its potassium or sodium salt; hydroxyethylethylenediaminetriacetic acid and its potassium or sodium salt; nitrilotriacetic acid and its potassium or sodium salt; 1,2-diaminocyclohexanetetraacetic acid and its potassium or sodium salt; and 1,3-diamino-2-propanoltetraacetic acid and its potassium or sodium salt; and organic phosphonic acids such as 2-phosphonobutanetricarboxylic acid-1,2,4 and its potassium or sodium salts, 2-phosphonobutanetricarboxylic acid-2,3,4 and its potassium or sodium salt; 1-hydroxyethane-1,1-diphosphonic acid and its potassium or sodium salt; and aminotri(methylenephosphonic acid) and its potassium or sodium salt. Such a water softener may be contained in an amount ranging generally from 0.01 to 5% by mass and more preferably from 0.01 to 0.5% by mass in the developer when used, though its optimum amount varies depending on the hardness and amount of hard water to be used.

Moreover, when developing the planographic printing plate precursor by using an automatic developing machine, the developer is fatigued corresponding to the amount of the throughput. A replenishing solution or a fresh developer may be used to recover the capacity. In this case, the replenishing solution or the fresh developer is preferably replenished using a method as described in the specification of U.S. Pat. No. 4,882,246.

Examples of such a developer containing a surfactant, an organic solvent and a reducing agent include a developer composition comprising benzyl alcohol, an anionic surfactant, an alkali agent and water as described in JP-A No. 51-77401, a developer composition comprising an aqueous solution containing benzyl alcohol, an anionic surfactant and a water-soluble sulfite as disclosed in JP-A No. 53-44202 and a developer composition comprising an organic solvent having a solubility of 10% by mass or less in water at normal temperature, an alkali agent and water as described in JP-A No. 55-155355. These developer compositions are also preferably used in the present embodiment.

The printing plate developed using the developer and replenishing solution as aforementioned is subjected after-treatment performed using rinsing water, a rinsing solution containing surfactants and the like and a protective gum solution containing gum arabic and a starch derivative. For the after-treatment of the printing plate precursor using the polymerizable composition of the present embodiment, these treatments are used in various combinations.

In plate-making and printing fields in recent years, an automatic developing machine for printing plate materials has been widely used for rationalization and standardization of plate-making works. This automatic developing machine usually consists of a developing section and an after treating section, comprising a unit for carrying a printing plate material, vessels for each processing solution and a spraying unit, wherein each processing solution which is pumped up is sprayed from a spray nozzle while carrying the exposed printing plate horizontally to carry out developing treatment. Also, a method has been known recently in which a printing plate precursor is carried by an in-liquid guide roll with dipping it in a processing solution vessel filled with a processing solution. In such an automatic treatment, the treatment may be carried out with supplying a replenishing solution to each processing solution corresponding to throughput and operation time. Also, electric conductivity may be sensed by a sensor to supply the replenishing solution automatically.

Also, a so-called non-returnable treating system may be applied in which treatment is carried out using a substantially unused process solution.

The planographic printing plate obtained in the above manner may be subjected to a printing step after a protective gum is applied thereto, if necessary. In the case of intending to obtain a planographic printing plate having higher printing durability, the planographic printing plate is subjected to burning treatment.

When the planographic printing plate is subjected to burning, it is preferable to treat it using a surface regulating solution as described in each publication of JP-B Nos. 61-2518 and 55-28062 and JP-A Nos. 62-31859 and 61-159655 before burning.

As the method of burning, a method in which a sponge or absorbent cotton impregnated with the surface regulating solution is used to apply this solution to the planographic printing plate or the printing plate is dipped in a pat filled with the surface regulating solution to apply the solution to the printing plate and a method of applying the solution by using an automatic coater may be applied. Making the coating amount uniform by using a squeegee or squeegee roller after coating gives better results.

The planographic printing plate which has been processed by burning treatment may be subjected appropriately to conventionally performed treatments such as washing and gum application. In the case of using a surface regulating solution containing a water-soluble macromolecular compound and the like, a so-called protective gum treatment such as gum application may be omitted.

The planographic printing plate precursor obtained by such treatments is placed in an offset printer and used for printing a number of copies.

EXAMPLES

The present invention will be further explained by way of examples, which, however, are not intended to be limiting of the invention. It is to be noted that in examples of the patent application of this case, a planographic printing plate precursor using the polymerizable composition of the invention for the recording layer is evaluated and the results of the evaluation are regarded as the rating of the polymerizable composition of the invention.

Examples 1 to 12 and Comparative Examples 1 and 2

[Production of a Substrate]

An aluminum plate (Material 1050) 0.3 mm in thickness was washed with trichloroethylene to degrease thereof. Then, the surface the aluminum plate was roughened using a nylon brush and a 400 mesh pumice-water suspension and then etched. After washed with water, the plate was dipped in 20% nitric acid for 20 seconds and then washed with water. The etching amount of the roughened surface at this stage was about 3 g/m$^2$.

Next, the plate was treated in 7% sulfuric acid as an electrolyte at a current density of 15 A/dm$^2$ to form 3 g/m$^2$ of a d.c. electrode oxide film, then washed with water and dried to produce a substrate (A).

The substrate (A) was treated using an aqueous 2% by mass sodium silicate solution at 25° C. for 15 seconds, followed by washing with water to produce a substrate (B).

(Formation of an Intermediate Layer)

Next, a liquid composition (sol solution) for a SG method was prepared in the following procedures.

<Composition of the Sol Solution>

| | |
|---|---|
| Methanol | 130 g |
| Water | 20 g |
| 85% by mass phosphoric acid | 16 g |
| Tetraethoxysilane | 50 g |
| 3-Methacryloxypropyltrimethoxysilane | 60 g |

The above compounds were mixed with each other and the mixture was stirred. After about 5 minutes, an exothermic phenomenon was observed. After the reaction was run for 60 minutes, the content was transferred to another container, to which was then added 3000 g of methanol to obtain a sol solution.

This sol solution was diluted with methanol/ethylene glycol (=9/1, mass ratio) and applied to the substrate (A) produced in the above manner such that Si amount thereof on the substrate was 3 mg/m$^2$, followed by drying at 100° C. for one minute, to obtain a substrate (C).

(Formation of a Photo-sensitive Layer (Recording Layer))

Any one of the substrates (A) to (C) produced in the above manner was used as a support, whose surface was then coated with a photo-sensitive layer coating solution having the following composition, followed by drying at 125° C. for one minute, to form 1.4 g/m$^2$ of a photo-sensitive layer. As a result, planographic printing plate precursors of Examples 1 to 12 and Comparative Examples 1 and 2 were obtained.

The types of supports to be used are shown in Table 1.

<Composition of the Photo-sensitive Layer Coating Solution>

| | |
|---|---|
| Polymerizable compound: Component (A) (compound described in Table 1) | 1.00 g |
| Binder polymer: Component (D) (compound described in Table 1) | 1.10 g |
| Infrared absorber: Component (C) (compound described in Table 1) | 0.09 g |
| Specific polymer initiator: Component (B) (compound described in Table 1) | 0.185 g |
| Fluorine based nonionic surfactant (F-177P, manufactured by Dainippon Ink and Chemicals, Incorporated) | 0.025 g |
| Dye obtained by using a paratoluenesulfonic acid as a counter anion of Victoria Pure Blue BOH | 0.04 g |
| Cyclohexanone | 10 g |
| Methanol | 7 g |
| 1-Methoxy-2-propanol | 8 g |

TABLE 1

| | Substrate | Polymerization initiator Compound | Molecular weight | Infrared absorber | Addition polymerizable compound | Binder | Developer | Printing durability | Rota-tions | | Printing durability | Rota-tions |
|---|---|---|---|---|---|---|---|---|---|---|---|---|
| Example 1 | A | II-3 | 37,000 | DX-1 | M-2 | B-1 | D-1 | 185 | 135 | Example 13 | 185 | 135 |
| Example 2 | B | I-4 | 21,500 | DX-2 | M-2 | B-2 | DN-3C | 210 | 145 | Example 14 | 210 | 145 |
| Example 3 | A | II-7 | 5,800 | DX-3 | M-2 | B-1 | D-1 | 160 | 130 | Example 15 | 160 | 130 |
| Example 4 | A | III-3 | 6,400 | DX-4 | M-1 | B-2 | DP-4 | 150 | 125 | Example 16 | 150 | 125 |
| Example 5 | B | IV-2 | 20,000 | DX-2 | M-1 | B-2 | DN-3C | 170 | 130 | Example 17 | 170 | 130 |
| Example 6 | C | IV-1 | 5,000 | DX-3 | M-2 | B-1 | DP-4 | 160 | 125 | Example 18 | 160 | 125 |
| Example 7 | A | II-17 | 3,300 | DX-4 | M-1 | B-1 | D-1 | 150 | 125 | Example 19 | 150 | 125 |
| Example 8 | B | I-9 | 8,000 | DX-1 | M-1 | B-2 | DN-3C | 190 | 140 | Example 20 | 190 | 140 |
| Example 9 | C | I-7 | 15,000 | DX-2 | M-2 | B-2 | DP-4 | 205 | 145 | Example 21 | 210 | 145 |
| Example 10 | C | I-7 | 9,500 | DX-2 | M-2 | B-1 | DP-4 | 210 | 150 | Example 22 | 210 | 150 |
| Example 11 | A | I-1 | 6,300 | DX-1 | M-1 | B-1 | D-1 | 220 | 160 | Example 23 | 220 | 160 |
| Example 12 | A | II-13 | 6,300 | DX-2 | M-1 | B-2 | D-1 | 180 | 135 | Example 24 | 180 | 135 |
| Comparative Example 1 | A | HA | — | DX-2 | M-1 | B-2 | D-1 | 100 | 95 | Comparative Example 3 | 100 | 95 |
| Comparative Example 2 | B | HB | — | DX-2 | M-1 | B-2 | DN-3C | 100 | 85 | Comparative Example 4 | 100 | 95 |

The weight average molecular weight (Mw) of the specific polymer initiator (B) used in the present examples is described together.

The polymerizable compounds M-1 and M-2 in Table 1 are as follows.

M-1: Dipentaerythritol monohydroxypentaacrylate (SR399, manufactured by Satomer)

M-2: Tris(acryloxyethyl)isocyanurate (Aronix M-315, manufactured by Toagosei Co., Ltd.)

The binder polymers B-1 and B-2 used in the present examples are as follows.

B-1: Macromolecular compound having the following structure as described in Japanese Patent Application No. 2000-249569.

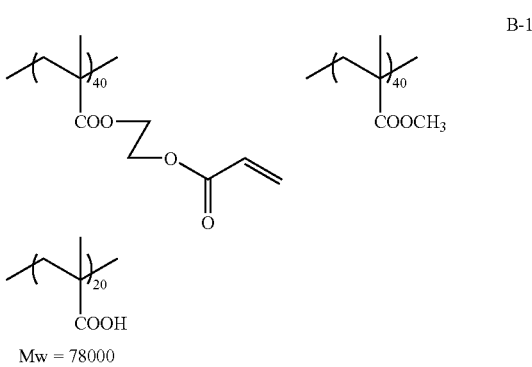

B-1

Mw = 78000

B-2: Allylmethacrylate/acrylamide/methacrylic acid (65/15/20 Mw=100,000 to 120,000)

Each structure of the infrared absorbers DX-1, DX-2, DX-3 and DX-4 used in the present examples is shown below.

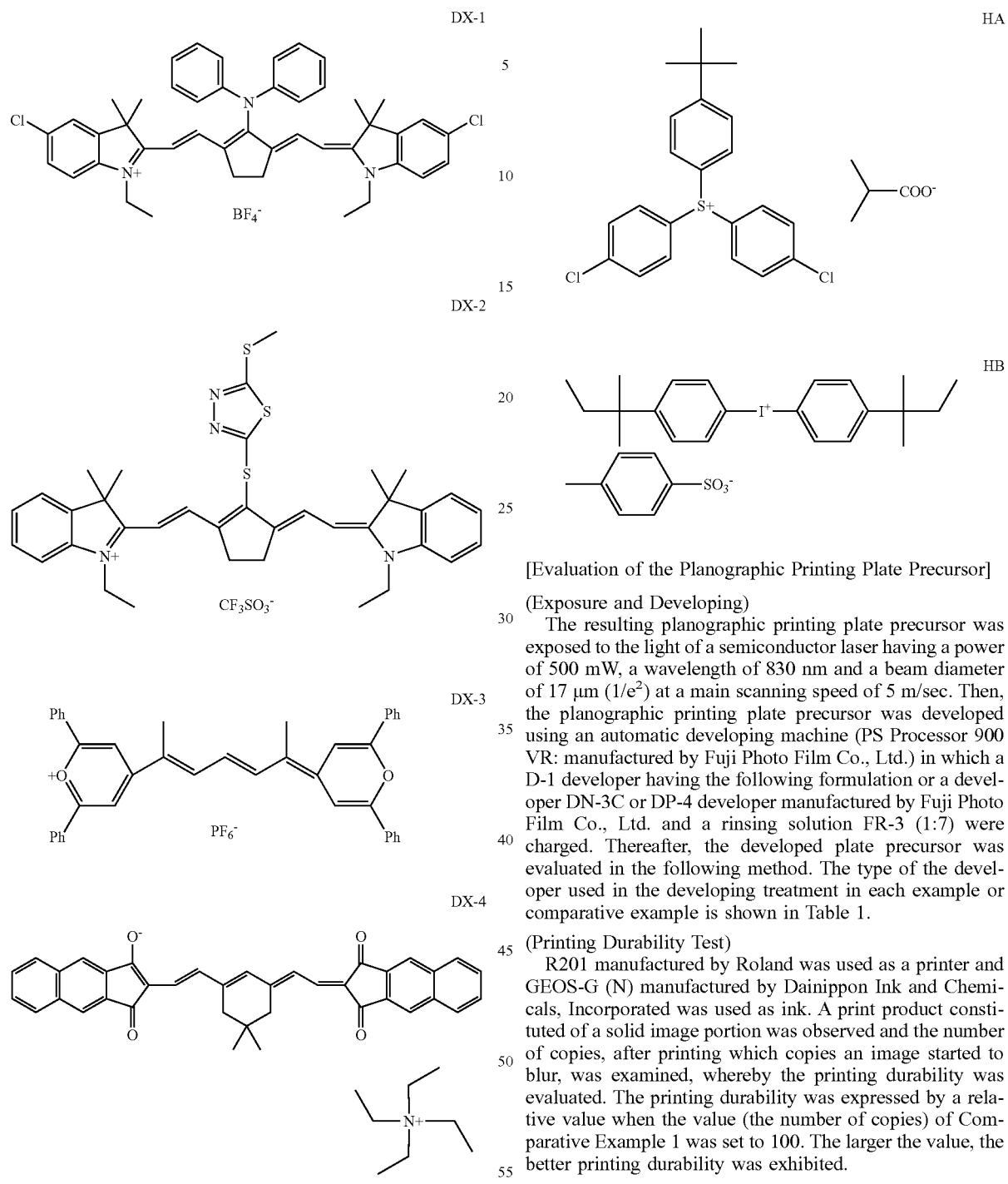

Among the polymerization initiators used in the present examples, those used in Examples 1 to 12 are each the specific polymer initiator (B) according to the present embodiment, which initiator has been described in the above-mentioned specific examples. The polymerization initiators HA and HB used in the comparative examples are polymerization initiators out of the scope of the present invention, which initiators have an onium salt structure provided with no polymer structure. The structures of the polymerization initiators HA and HB are shown below.

[Evaluation of the Planographic Printing Plate Precursor]

(Exposure and Developing)

The resulting planographic printing plate precursor was exposed to the light of a semiconductor laser having a power of 500 mW, a wavelength of 830 nm and a beam diameter of 17 μm ($1/e^2$) at a main scanning speed of 5 m/sec. Then, the planographic printing plate precursor was developed using an automatic developing machine (PS Processor 900 VR: manufactured by Fuji Photo Film Co., Ltd.) in which a D-1 developer having the following formulation or a developer DN-3C or DP-4 developer manufactured by Fuji Photo Film Co., Ltd. and a rinsing solution FR-3 (1:7) were charged. Thereafter, the developed plate precursor was evaluated in the following method. The type of the developer used in the developing treatment in each example or comparative example is shown in Table 1.

(Printing Durability Test)

R201 manufactured by Roland was used as a printer and GEOS-G (N) manufactured by Dainippon Ink and Chemicals, Incorporated was used as ink. A print product constituted of a solid image portion was observed and the number of copies, after printing which copies an image started to blur, was examined, whereby the printing durability was evaluated. The printing durability was expressed by a relative value when the value (the number of copies) of Comparative Example 1 was set to 100. The larger the value, the better printing durability was exhibited.

<D-1 Developer>

| | |
|---|---|
| Potassium hydroxide | 2.5 g |
| Sodium bicarbonate | 1.5 g |
| Potassium carbonate | 2 g |
| Sodium sulfite | 1 g |
| Polyethylene glycol mononaphthyl ether | 140 g |
| Sodium dibutylnaphthalenesulfonate | 50 g |
| Tetrasodium ethylenediaminetetraacetate | 8 g |
| Water | 785 g |

(Evaluation of Sensitivity)

The entire surface of the resulting planographic printing plate precursor was exposed to light at an output intensity of 6.5 W by using Trend Setter 3244 VX manufactured by Creo with varying the number of rotations, followed by developing in the following condition, to find the number of rotations (rpm) when a clear image was formed. The results are shown in Table 1.

The higher number of rotations enables recording by exposure in the shorter time and, therefore, the larger number of rotations represents the higher sensitivity.

From the results of Table 1, the planographic printing plate precursors of Examples 1 to 12 using, as the recording layer, the polymerizable composition containing the specific polymer initiator (B) according to the present embodiment were all confirmed to have superb printing durability and to enable recording with high sensitivity.

On the other hand, the planographic printing plate precursors of Comparative Examples 1 and 2 which do not use the specific polymer initiator (B) according to the present embodiment were found to have inferior printing durability and lower recording sensitivity, as compared with Examples 12 and 5 provided with a recording layer having the same composition except for the initiator.

Examples 13 to 24, Comparative Examples 3 and 4

[Formation of a Protective Layer]

An aqueous 3% by mass polyvinyl alcohol solution (degree of saponification: 98% by mol, degree of polymerization: 550) was applied to a recording layer formed in the same manner as in the aforementioned Examples 1 to 12 and Comparative Examples 1 and 2 such that the coating amount after being dried was 2 g/m$^2$ and dried at 100° C. for one minute to form a protective layer on the recording layer to thereby obtain planographic printing plate precursors of Examples 13 to 24 and Comparative Examples 3 to 4.

The resulting planographic printing plate precursor was exposed to light and developed in the same conditions as in Examples 1 to 20 and Comparative Examples 1 to 4, except that the laser output of Trend Setter 3244 VX was changed to 5 W from 6.5 W in the evaluation of sensitivity, to make a planographic printing plate. The resulting planographic printing plate was evaluated with regards to printing durability and sensitivity in the same manner. The results are described together in Table 1.

It is found from the results of Table 1 that, even in the case of forming a protective layer on the recording layer, the same tendency as in Examples 1 to 12 provided with no protective layer was observed and the planographic printing plate precursors using the polymerizable composition of the present embodiment as the recording layer exhibited superior printing durability and enabled recording with high sensitivity. It is also found that the provision of the protective layer makes it possible to obtain higher printing durability and higher recording sensibility, even when the comparative compound was used and a low output infrared laser was employed for recording.

II. Next, an infrared-sensitive composition based on the fifth feature of the invention and a planographic printing plate precursor using the infrared-sensitive composition will be described in detail in the following second embodiment.

SECOND EMBODIMENT

The infrared-sensitive composition based on the present embodiment is preferably used, for an image recording layer formed by coating on a support, and is characterized in that:

an infrared absorber (C) generates heat by exposure to infrared rays;

a compound (A) which generates radicals by the action of light or heat generates radicals due to the exposure to light and said generated heat; and a polymerizable compound (B) is polymerized and cured by these radicals.

First, the compound (A) which generates radicals by the action of light or heat and is the characteristic component of the present embodiment will be described.

[Compound (A) Which Generates Radicals by the Action of Light or Heat]

The compound (A) which generates radicals by the action of light or heat (hereinafter referred to as a radical generator as the case may be) must have a weight average molecular weight (Mw) of 1,000 or more and 50,000 or less. Hereinafter, in the present embodiment, the term "molecular weight" represents "weight average molecular weight" unless otherwise noted.

When the molecular weight of the radical generator is less than 1,000, a problem that the penetration of a developer into an image portion is facilitated during developing and another problem that the penetration of damping water into an image portion is facilitated during printing arise, bringing about deteriorated printing durability, especially when a cleaner is used.

On the other hand, when the molecular weight exceeds 50,000, this causes developing inferior. The molecular weight is preferably in a range of 2,000 to 40,000 (inclusive of 2,000 and 40,000) and more preferably in a range of 4,000 to 30,000 (inclusive of 4,000 and 30,000).

Examples of the compound generating radicals and having a molecular weight in a range of 1,000 to 50,000 (inclusive of 1,000 to 50,000) include polymerization initiators of onium salts obtained by making a counter anion polymeric, azo type polymerization initiators, azo macro-polymerization initiators obtained by a reaction among azo polymerization initiators and macro-polymerization initiators obtained by thermally polymerizing monomers and initiators having chain transfer groups. The molecular weight may be optionally designed by controlling the polymerization.

The polymerization initiators of onium salts, which are preferable radical generators in the present embodiment and are obtained by making a counter anion polymeric, may be easily obtained by homopolymerizing a structural unit including, at a side chain thereof, a functional group containing an onium salt as a counter cation or by copolymerizing the structural unit with other structural units.

Also, specific examples of the azo macro-polymerization initiator include initiators having a molecular weight of 1500 to 60,000 g/mol and produced by reacting a prepolymer having a terminal group reactive with an isocyanate group, a diisocyanate and an azo polymerization initiator having at least two hydroxyl groups in its molecule. These initiators are described in detail in Japanese Patent No. 329317. Azo macro-initiators described in this patent may be preferably used as the radical generator of the present embodiment.

Specific examples of the macro-polymerization initiator include macro-photoinitiators obtained using a photoinitiator having a specific chain transfer group described in the publication of Japanese Patent Application National Publication (Laid-Open) No. 2002-517522. Macro photoinitiators described there are preferably used as the radical generators used in the present embodiment.

As aforementioned, the radical generator according to the present embodiment may be easily synthesized using a known method.

Specific examples ((R-1) to (R-17)) of radical generators preferably used in the present embodiment are described hereinbelow together with each weight average molecular weight: however, these examples are not intended to be limiting of the invention.

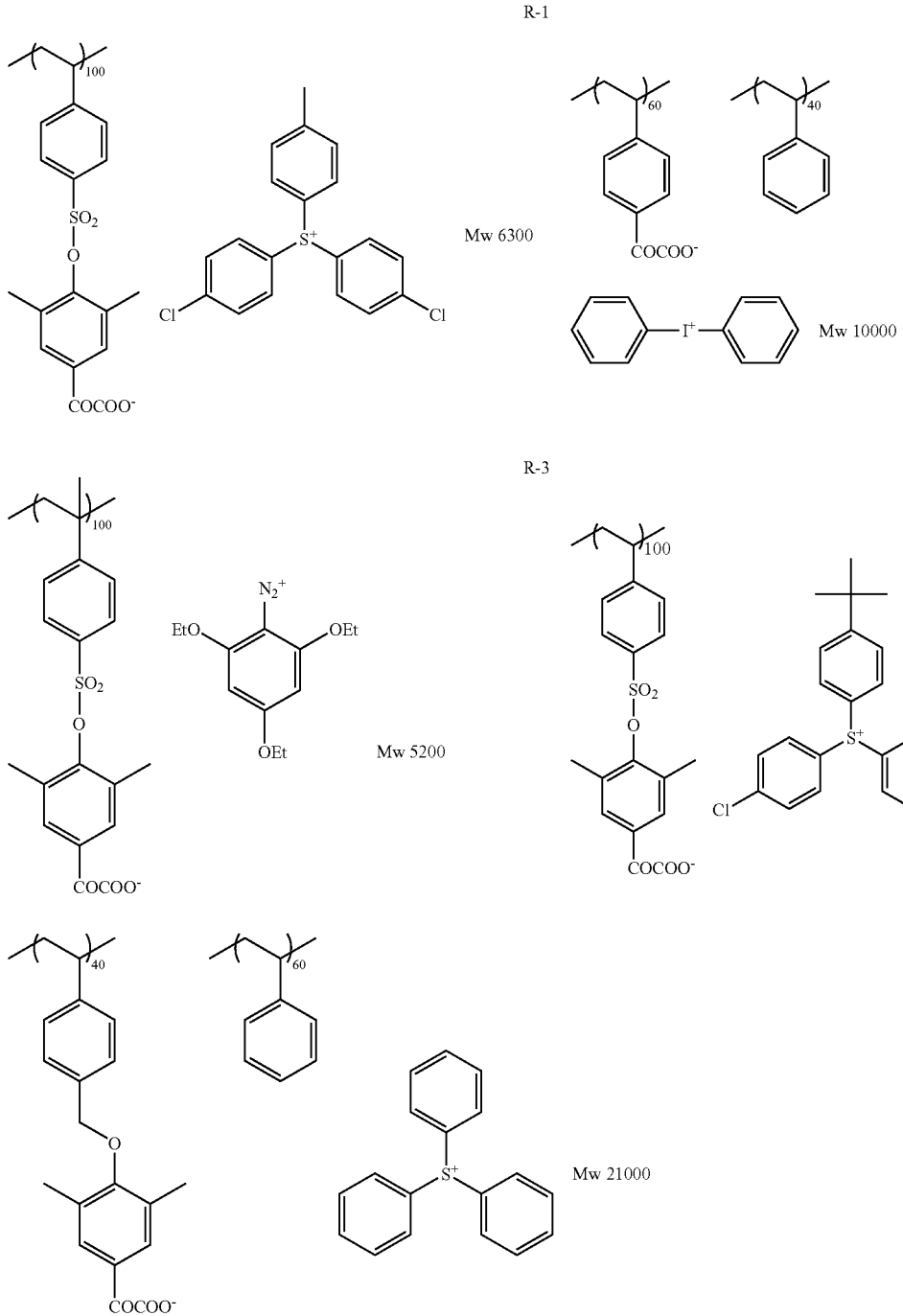

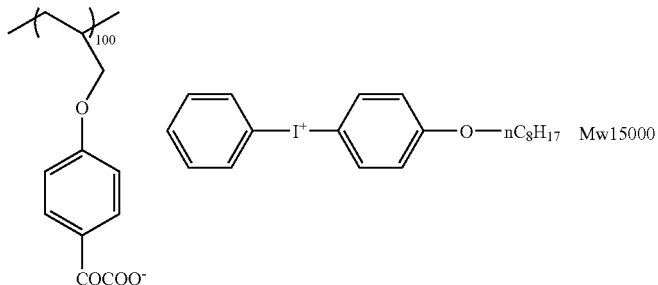
R-6
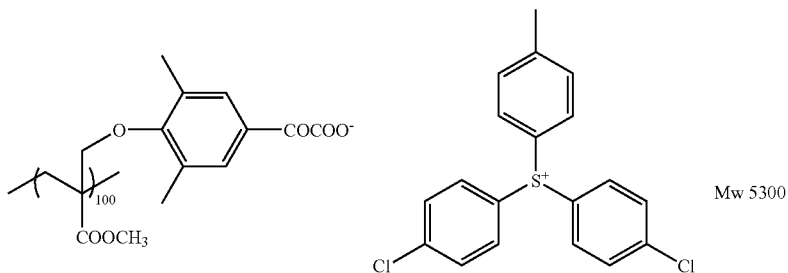
R-7
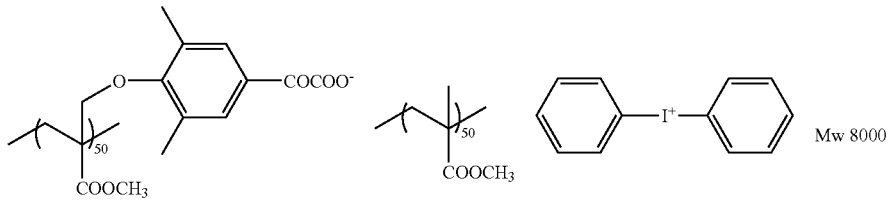
R-8
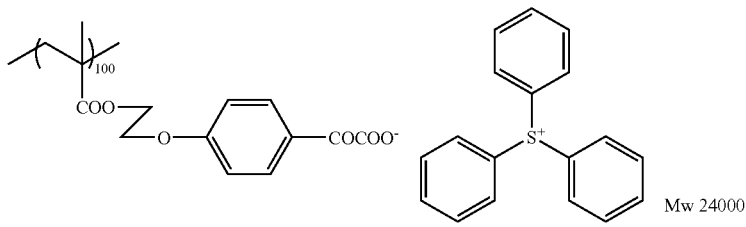
R-9
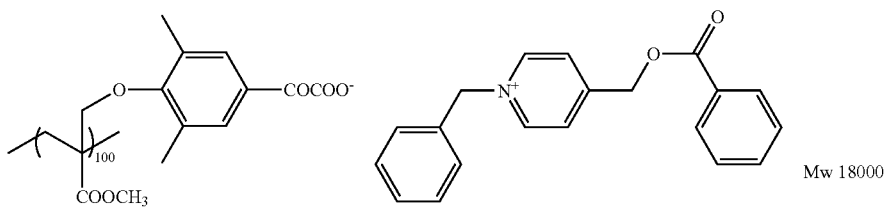
R-10
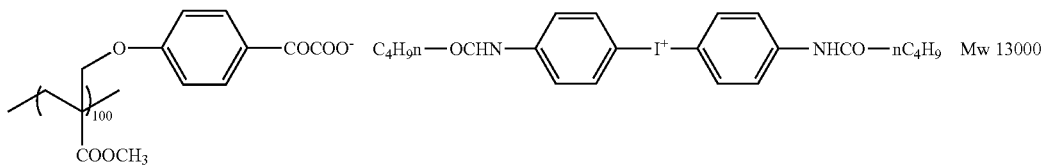
R-11

-continued
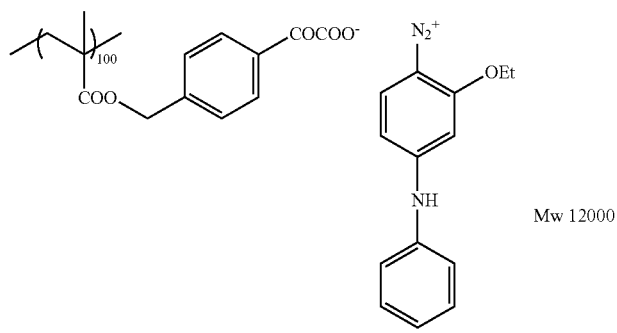
R-12
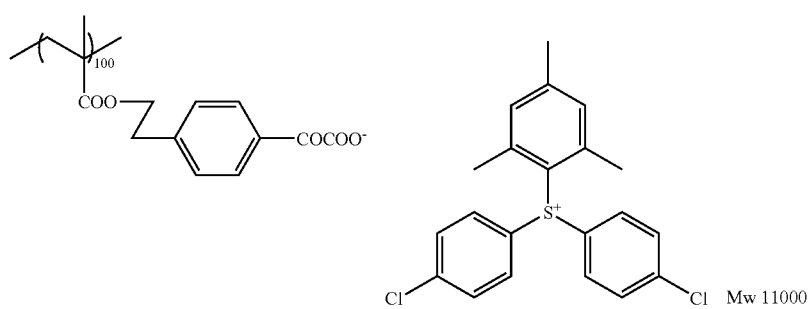
R-13
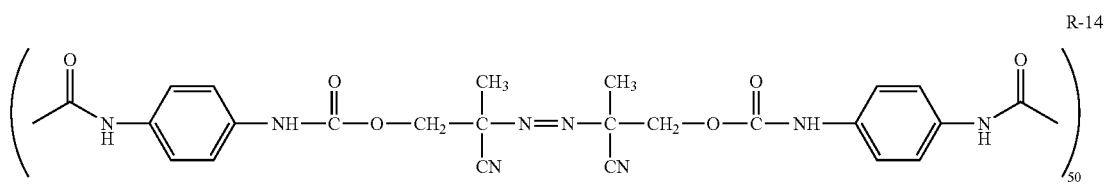
R-14
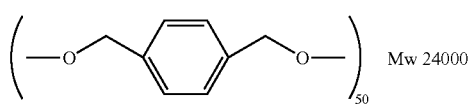
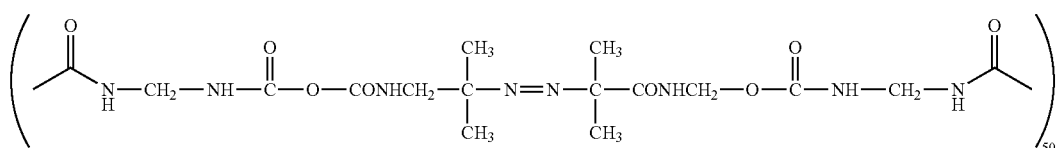
R-15
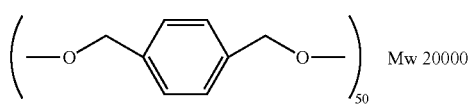
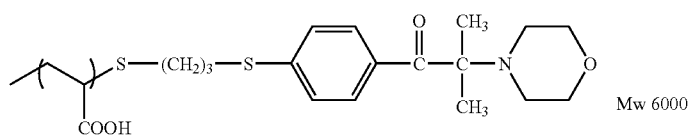
R-16
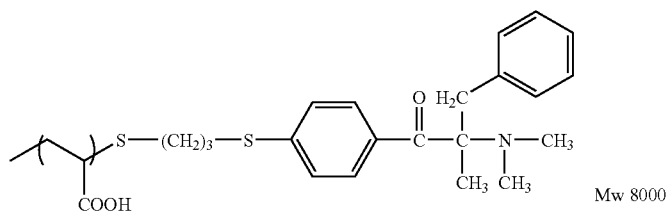
R-17

In the present embodiment, in particular, use of radical generators of onium salts obtained by making a counter anion polymeric is preferable.

The radical generator (R-1) is the same as the "specific polymer initiator (I-1)" described in the first embodiment and thus the descriptions of the first embodiment may be adopted as a reference of a method of synthesizing the radical generator (R-1).

The radical generator of the present embodiment has a maximum absorption wavelength of preferably 400 nm or less and more preferably 360 nm or less. The planographic printing plate precursor can be handled under white light by making the absorption wavelength fall in the ultraviolet region in this manner.

In the present embodiment, the radical generator (A) may be added to a photo-sensitive layer coating solution in a proportion of 0.1 to 50% by mass, preferably 0.5 to 30% by mass and particularly preferably 1 to 20% by mass based on the total solid of the photo-sensitive composition. When the amount is less than 0.1% by mass, the sensitivity tends to be deteriorated, whereas when the amount exceeds 50% by mass, the contamination of the image portion is easily caused during printing.

These radical generators may be used either singly or in combinations of two or more. Also, in the case of forming the photo-sensitive composition of the present embodiment as a film to form a photo-sensitive recording layer, these radical generators may be added to the same layer where other components are added or to another layer separately formed.

A known radical generator having a molecular weight less than 1000 may be used together with the aforementioned specific radical generator (A), to the extent that the effect of the invention is not impaired.

The infrared-sensitive composition of the present embodiment contains, besides the radical generator (A), a polymerizable compound (B), an infrared absorber (C) and preferably a binder polymer (D). These structural components will be hereinafter explained sequentially.

(B) Polymerizable Compound

This is the same as the polymerizable compound described in the first embodiment and detailed descriptions are therefore omitted.

The selection and usage of the (radical) polymer compound are important factors in the light of compatibility with and dispersibility in other components (e.g., a binder polymer, an initiator and colorants) in the photo-sensitive layer. For example, there is the case where the use of a low-purity compound and a combination of two or more compounds improve compatibility. Also, there is the case where a specific structure is selected for the purpose of improving the adhesiveness of a support, an overcoat layer and the like.

As to the ratio of the radical polymerizable compound to be contained in an image recording layer, a larger ratio is advantageous in the light of sensitivity. However, when the ratio is excessively large, unfavorable phase separation is caused, and a problem concerning production steps caused by the adhesiveness of an image recording layer (for example, production inferiors originated from the transfer and adhesion of recording layer components) and problems concerning precipitation from a developer and the like probably arise. From these points of view, the ratio of the polymerizable compound to be contained is 5 to 80% by mass and preferably 20 to 75% by mass based on the whole components of the composition in many cases. Also, these polymerizable compounds may be used either singly or in combinations of two or more.

Other than the above, as to the usage of the polymerizable compound, a proper structure, formulation and amount may be arbitrarily selected from the viewpoint of the magnitude of polymerization inhibition by oxygen, resolution, fogging characteristics, a change in refractive index and surface adhesiveness. A layer structure/coating method such as undercoating and over-coating may be selected according to the case.

(C) Infrared Absorber

It is a major object of the present invention to apply the photo-sensitive composition of the present embodiment to the recording layer of an image recording material in which an image is recorded using a laser emitting infrared rays. For this, it is essential to use an infrared absorber in the photo-sensitive composition of the present embodiment. The infrared absorbers to be used in the present embodiment are dyes or pigments having an absorption maximum at a wavelength from 760 nm to 1200 nm.

Specific examples of the cyanine dye which is represented by the general formula (I) and preferably used in the present embodiment include those described in JP-A No. 2001-133969, Paragraph Nos. [0017] to [0019].

These infrared absorbers may be added to the same layer where other components are added or to another layer separately formed when the photo-sensitive composition of the present embodiment is used in the recording layer of an image recording material. When the layer to which the infrared absorber is added is produced as the photo-sensitive layer of a negative type planographic printing plate precursor, the optical density of the photo-sensitive layer at the absorption maximum in a wavelength range from 760 nm to 1200 nm is preferably in the range of 0.1 to 3.0. When the optical density is out of this range, the sensitivity tends to be deteriorated. Because the optical density is determined by the amount of the infrared absorber to be added and by the thickness of the recording layer, a specified optical density is obtained by controlling the condition of the both. The optical density of the recording layer may be measured by a usual method. Given as examples of the measuring method are a method in which a recording layer with such a thickness that the coating amount after dried is defined within the range required for a planographic printing plate is formed on a transparent or white support to measure optical density using a transmission type optical densitometer and a method in which a recording layer is formed on a reflective support such as an aluminum support to measure reflection density.

Other characteristics of the infrared absorber according to the present embodiment are the same as those of the infrared absorber described in the first embodiment and therefore, detailed explanations are omitted.

(D) Binder Polymer

Further, a binder polymer may be used, if necessary, in the infrared-sensitive composition of the present embodiment, so that, for example, the film characteristics of the recording layer to be formed is improved. As the binder, a linear organic polymer is preferably used. A known type of linear organic polymer may be used as such a "linear organic polymer". A linear organic polymer which is soluble to water or to weak alkali water or can be swelled therein is preferably selected, to enable water developing or weak-alkali water developing. The linear organic polymer is selectively used, not only as a film-forming agent for forming the photo-sensitive layer, but also as a water-based developer, a wead-alkali-based developer or an organic solvent-based developer. For example, the use of a water-soluble organic polymer enables water developing.

Examples of such a linear organic polymer include radical polymers having a carboxylic group at the side chain, for example, those described in JP-A No. 59-44615, JP-B Nos. 54-34327, 58-12577, 54-25957, JP-A Nos. 54-92723, 59-53836 and 59-71048, specifically, methacrylic acid copolymers, acrylic acid copolymers, itaconic acid copolymers, crotonic acid copolymers, maleic acid copolymers and partially esterified maleic acid copolymers. Examples of the linear organic polymer also include acidic cellulose derivatives having a carboxylic acid group at the side chain like the above. Other than the above, those obtained by adding a cyclic acid anhydride to a polymer having a hydroxyl group are useful.

Among these polymers, (meth)acryl resins having a benzyl group or an aryl group and a carboxylic group at the side chain are superior in the balance between film strength, sensitivity and developing characteristics and are therefore preferable.

Urethane type binder polymers having an acid group and described in each publication of JP-B Nos. 7-120040, 7-120041, 7-120042 and 8-12424 and JP-A Nos. 63-287944, 63-287947 and 1-271741 have very high strength and are therefore advantageous in the point of printing durability and an aptitude to low exposure. Also, polyurethane resin binders described in each specification of Japanese Patent Application Nos. 10-116232, 11-286965, 11-297142, 11-305734, 11-309585, 11-352691, 2000-35369 and 2000-35370 which are proposed by the applicant of this case are useful in the use of the present embodiment.

As the water-soluble linear organic polymer other than the above, polyvinyl pyrrolidones, polyethylene oxides and the like are useful. Also, alcohol-soluble nylons and a polyether of 2,2-bis-(4-hydroxyphenyl)-propane and epichlorohydrin, and the like are useful.

The weight average molecular weight of the binder polymer used in the present embodiment is preferably 5,000 or more and more preferably in the range of 10,000 to 300,000. The number average molecular weight of the binder polymer is preferably 1,000 or more and more preferably in the range of 2,000 to 250,000. The degree of polydispersion (weight average molecular weight/number average molecular weight) is preferably 1 or more and more preferably in the range of 1.1 to 10.

These polymers may be any one of random polymers, block polymers and graft polymers, but are preferably random polymers.

The polymer to be used in the present embodiment may be synthesized by a conventionally known method. Examples of a solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. These solvents may be used either independently or in combinations of two or more.

As the radical polymerization initiator used when synthesizing the binder polymer used in the present embodiment, known compounds such as azo type initiators and peroxide initiators may be used.

Among these polymers, the aforementioned urethane type binder polymer develops such an effect as to significantly improve printing durability by combining it with the specific macromolecular radical generator of the present embodiment and therefore, a combination of the both is particularly useful.

Specific examples of the urethane type binder which is preferably used in the present embodiment include those described as the polyurethane resin binder in the specification of Japanese Patent Application No. 2001-126072 which is previously filed by the applicant of this case. Such a binder will be described in detail hereinbelow.

It is required that the urethane type binder (hereinafter referred to as a polyurethane resin as the case may be) used in the present embodiment has, not only film-forming ability, but also solubility to an alkali developer. Therefore, polyurethane macromolecular polymers which are soluble in aqueous alkali or can be swelled are preferably used.

Specific examples of the polyurethane macromolecular polymers include those having, as a base skeleton, a structural unit represented by a product obtained as a result of a reaction between at least one type of diisocyanate compound represented by the following general formula (11) and at least one type of diol compound represented by the general formula (12).

OCN—X⁰—NCO          (11)

HO—Y⁰—OH          (12)

wherein $X^0$ and $Y^0$ respectively represent a divalent organic residue.

Among the aforementioned polyurethane resins, a preferable one is a polyurethane resin having a structure represented by a reaction product obtained as a result of a reaction between a diisocyanate compound represented by the following general formula (13) and at least one of a polyether diol compound, polyester diol compound and polycarbonate diol compound.

OCN-L¹-NCO          (13)

wherein $L^1$ represents a divalent aliphatic or aromatic hydrocarbon group which may have a substituent. Other functional groups, which are not reacted with an isocyanate group, such as an ester group, urethane group, amide group and ureide group may be contained in $L^1$, if necessary.

Specific examples of the diisocyanate compound represented by the general formula (13) include the following compounds.

Specifically, given as examples of the diisocyanate compound are aromatic diisocyanate compounds such as 2,4-tolylenediisocyanate, dimers of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate and 3,3-dimethylbiphenyl-4,4'-diisocyanate; aliphatic diisocyanate compounds such as hexamethylenediisocyanate, trimethylhexamethylenediisocyanate, lysinediisocyanate and dimer acid diisocyanate; alicyclic diisocyanate compounds such as isophoronediisocyanate, 4,4'-methylenebis(cyclohexylisocyanate), methylcyclohexane-2,4 (or 2,6)diisocyanate and 1,3-(isocyanatemethyl)cyclohexane; and diisocyanate compounds which are reaction products between a diol and a diisocyanate such as adducts of 1 mol of 1,3-butylene glycol and 2 mols of tolylenediisocyanate.

Examples of the diol compound include, in a wide sense, polyether diol compounds, polyester diol compounds and polycarbonate diol compounds.

Examples of the polyether diol compound include compounds represented by the general formula (A), (B), (C), (D) or (E) and random copolymers of ethylene oxide and propylene oxide having a hydroxyl group at the terminal.

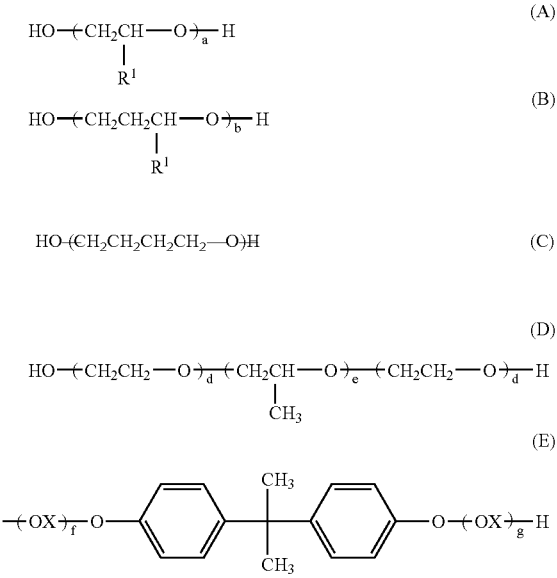

(A), (B), (C), (D), (E)

In the above formulae, $R^1$ represents a hydrogen atom or a methyl group and X represents the following group.

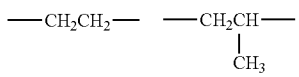

a, b, c, d, e, f and g respectively denote an integer of 2 or more and preferably an integer from 2 to 100.

As the polyether diol compound represented by the general formula (A) or (B), the following compounds are specifically given as examples.

Specifically, examples of these compounds include diethylene glycol, triethylene glycol, tetrasethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycols having a weight average molecular weight of 1000, polyethylene glycols having a weight average molecular weight of 1500, polyethylene glycols having a weight average molecular weight of 2000, polyethylene glycols having a weight average molecular weight of 3000, polyethylene glycols having a weight average molecular weight of 7500, polypropylene glycols having a weight average molecular weight of 400, polypropylene glycols having a weight average molecular weight of 700, polypropylene glycols having a weight average molecular weight of 1000, polypropylene glycols having a weight average molecular weight of 2000, polypropylene glycols having a weight average molecular weight of 3000 and polypropylene glycols having a weight average molecular weight of 4000.

Specific examples of the polyether diol compound represented by the general formula (C) include compounds shown below:

PTMG 650, PTMG 1000, PTMG 2000, PTMG 3000 and the like manufactured by Sanyo Chemical Industries, Ltd.

Specific examples of the polyether diol compound represented by the general formula (D) include compounds shown below:

Newpole PE-61, Newpole PE-62, Newpole PE-64, Newpole PE-68, Newpole PE-71, Newpole PE-74, Newpole PE-75, Newpole PE-78, Newpole PE-108, Newpole PE-128 and the like manufactured by Sanyo Chemical Industries Ltd.

Specific examples of the polyether diol compound represented by the general formula (E) include compounds shown below:

Newpole BPE-20, Newpole BPE-20F, Newpole BPE-20NK, Newpole BPE-20T, Newpole BPE-20G, Newpole BPE-40, Newpole BPE-60, Newpole BPE-100, Newpole BPE-180, Newpole BPE-2P, Newpole BPE-23P, Newpole BPE-3P, Newpole BPE-5P and the like manufactured by Sanyo Chemical Industries, Ltd.

Specific examples of the random copolymers of ethylene oxide having a hydroxyl group at its terminal and propylene oxide include compounds shown below:

Newpole 50HB-100, Newpole 50HB-260, Newpole 50HB-400, Newpole 50HB-660, Newpole 50HB-2000, Newpole 50HB-5100 and the like manufactured by Sanyo Chemical Industries, Ltd.

Examples of the polyester diol compound include compounds represented by the following formulae (F) and (G).

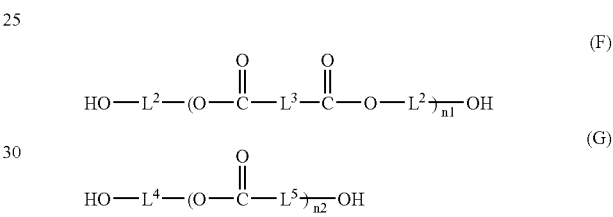

(F), (G)

In the above formulae, $L^2$, $L^3$ and $L^4$, which may be the same or different, respectively represent a divalent aliphatic or aromatic hydrocarbon group and $L^5$ represents a divalent aliphatic hydrocarbon group. It is preferable that $L^2$, $L^3$ and $L^4$ respectively represent an alkylene group, an alkenylene group, an alkinylene group or an arylene group and $L^5$ represents an alkylene group. Also, other functional groups, which are not reacted with an isocyanate group, such as an ether, carbonyl, ester, cyano, olefin, urethane, amide or ureide group or a halogen atom may exist in $L^2$, $L^3$, $L^4$ and $L^5$. n1 and n2 respectively denote an integer of 2 or more and preferably 2 to 100.

Examples of the polycarbonate diol compound include compounds represented by the general formula (H).

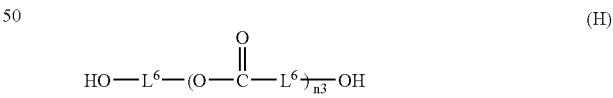

(H)

In the general formula, $L^6$s which may be of the same type or different types, respectively represent a divalent aliphatic or aromatic hydrocarbon group. $L^6$ preferably represents an alkylene group, an alkenylene group, an alkinylene group or an arylene group. Also, other functional groups, which are not reacted with an isocyanate group, such as an ether, carbonyl, ester, cyano, olefin, urethane, amide or ureide group or a halogen atom, may exist in $L^6$. n3 respectively denote an integer of 2 or more and preferably 2 to 100.

Examples of the diol compound represented by the general formula (F), (G) or (H) include compounds shown below. In the following specific examples, n denotes an integer of 2 or more.

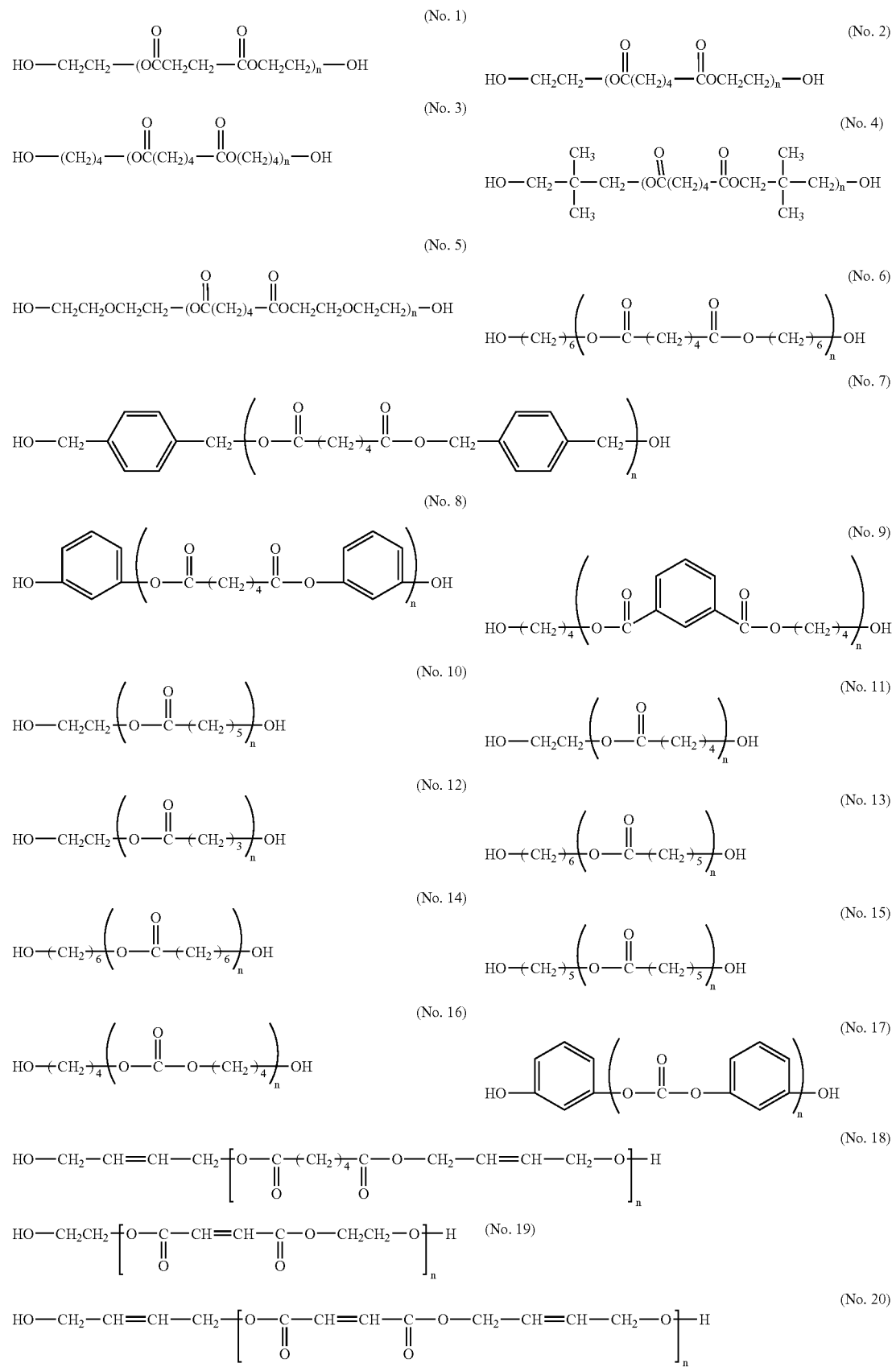

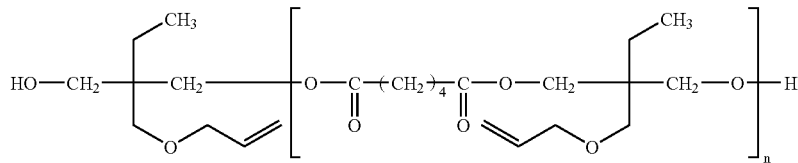

(No. 21)

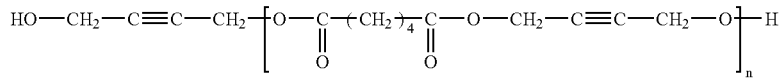

(No. 22)

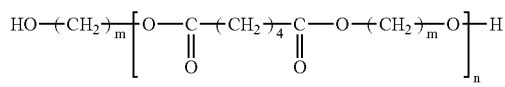

(No. 23)

m = 2, 4

The urethane binder (also called a polyurethane resin) contained in the photopolymerizable photo-sensitive layer of the photo-sensitive planographic printing plate of the present embodiment is more preferably polyurethane resins further having a carboxyl group. Polyurethane resins preferably used are polyurethane resins having a structural unit represented by at least one type among diol compounds represented by the formulae (I), (J) and (K) and/or a structural unit derived from a compound obtained by ring-opening a tetracarboxylic acid di-anhydride by using a diol compound.

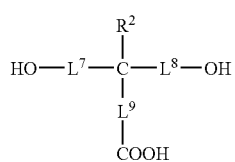

(I)

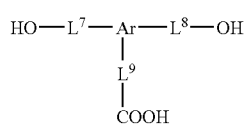

(J)

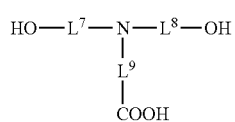

(K)

$R^2$ represents a hydrogen atom or an alkyl, aralkyl, aryl, alkoxy or aryloxy group which may have a substituent (including, for example, a group such as a cyano group, nitro group, halogen atom (—F, —Cl, —Br or —I), —$CONH_2$, —$COOR^3$, —$OR^3$, —$NHCONHR^3$, —$NHCOOR^3$, —NH-$COR^3$ and —$OCONHR^3$ (where $R^3$ represents an alkyl group having 1 to 10 carbon atoms or an aralkyl group having 7 to 15 carbon atoms)) and preferably represents a hydrogen atom, an alkyl group having 1 to 8 carbon atoms or an aryl group having 6 to 15 carbon atoms. $L^7$, $L^8$ and $L^9$, which may be of the same type or different types, respectively represent a single bond or a divalent aliphatic or aromatic hydrocarbon group which may have a substituent (preferably, for example, an alkyl group, an aralkyl group, an aryl group, an alkoxy group or a halogeno group), preferably an alkylene group having 1 to 20 carbon atoms, an arylene group having 6 to 15 carbon atoms and more preferably an alkylene group having 1 to 8 carbon atoms. Also, other functional groups, which are not reacted with an isocyanate group, such as a carbonyl, ester, urethane, amide, ureide or ether group may exist in $L^7$, $L^8$ and $L^9$, if necessary. A ring may be formed by two or three among $R^2$, $L^7$, $L^8$ and $L^9$.

Ar represents a trivalent aromatic hydrocarbon group which may have a substituent and preferably an aromatic group having 6 to 15 carbon atoms.

Specific examples of the diol compound having a carboxyl group and represented by the general formula (I), (J) or (K) include the following compounds:

specifically, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethyl glycine and N,N-bis(2-hydroxyethyl)-3-carboxy-propionamide.

Examples of preferable tetracarboxylic acid di-anhydride used for the synthesis of a polyurethane resin include those represented by the general formula (L), (M) or (N).

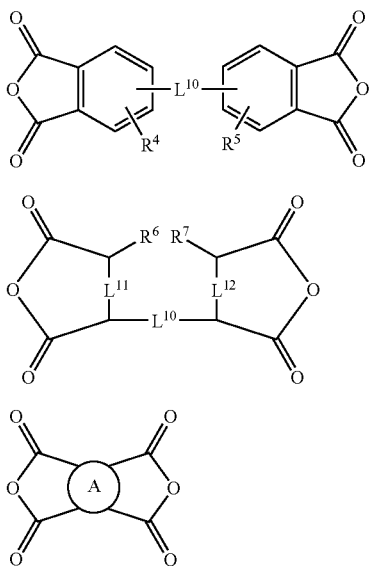

In the above formulae, $L^{10}$ represents a single bond or a divalent aliphatic or aromatic hydrocarbon group which may have a substituent (preferably an alkyl group, an aralkyl group, an aryl group, an alkoxy group, a halogeno group, an ester group or an amide group), —CO—, —SO—, —SO$_2$—, —O— or —S— and preferably a single bond, a divalent aliphatic hydrocarbon group having 1 to 15 carbon atoms, —CO—, —SO$_2$—, —O— or —S—. $R^4$ and $R^5$, which may be of the same type or different types, respectively represent a hydrogen atom, an alkyl group, an aralkyl group, an aryl group, an alkoxy group or a halogeno group and preferably a hydrogen atom, an alkyl group having 1 to 8 carbon atoms, an aryl group having 6 to 15 carbon atoms, an alkoxy group having 1 to 8 carbon atoms or a halogeno group. Also, two among $L^{10}$, $R^4$ and $R^5$ may be combined with each other to form a ring. $R^6$ and $R^7$, which may be of the same type or different types, respectively represent a hydrogen atom, an alkyl group, an aryl group or a halogeno group and preferably a hydrogen atom, an alkyl group having 1 to 8 carbon atoms or an aryl group having 6 to 15 carbon atoms. Also, two among $L^{10}$, $R^6$ and $R^7$ may be combined with each other to form a ring. $L^{11}$ and $L^{12}$, which may be of the same types or different types, respectively represent a single bond, a double bond or a methylene group. "A" represents a single nuclear or polynuclear aromatic ring and preferably an aromatic ring having 6 to 18 carbon atoms.

Specific examples of the compound represented by the general formula (L), (M) or (N) include the following compounds:

specifically, aromatic tetracarboxylic acid di-anhydrides such as pyromellitic acid di-anhydride, 3,3',4,4'-benzophenonetetracarboxylic acid di-anhydride, 3,3',4,4'-diphenyltetracarboxylic acid di-anhydride, 2,3,6,7-naphthalanetetracarboxylic acid di-anhydride, 1,4,5,8-naphthalenetetracarboxylic acid di-anhydride, 4,4'-sulfonyldiphthalic acid di-anhydride, 2,2-bis(3,4-dicarboxyphenyl)propane di-anhydride, bis(3,4-dicarboxyphenyl) ether di-anhydride, 4,4'-[3,3'-(alkylphosphoryldiphenylene)-bis(iminocarbonyl)] diphthalic acid di-anhydride, adducts of hydroquinone diacetate and trimellitic acid anhydride and adducts of diacetyldiamine and trimellitic acid anhydride; alicyclic tetracarboxylic acid di-anhydrides such as 5-(2,5-dioxotetrahydrofuryl)-3-methyl-3-cyclohexene-1,2-dicarboxylic acid anhydride (Epycron B-4400, manufactured by Dainippon Ink and Chemicals, Inc.), 1,2,3,4-cyclopentanetetracarboxylic acid di-anhydride, 1,2,4,5-cyclohexanetetracarboxylic acid di-anhydride and tetrahydrofurantetracarboxylic acid di-anhydride; and aliphatic tetracarboxylic acid di-anhydrides such as 1,2,3,4-butanetetracarboxylic acid di-anhydride and 1,2,4,5-pentanetetracarboxylic acid di-anhydride.

Examples of a method of introducing a structural unit, derived from a compound obtained by ring-opening these tetracarboxylic acid di-anhydride by using a diol compound, into a polyurethane resin, include the following methods.

a) A method in which a compound with an alcohol at its terminal, which compound is obtained by ring-opening a tetracarboxylic acid di-anhydride using a diol compound, is reacted with a diisocyanate compound.

b) A method in which a urethane compound with an alcohol at its terminal, which urethane compound is obtained by reacting a diisocyanate compound under the presence of an excessive amount of a diol compound, is reacted with tetracarboxylic acid di-anhydride.

Specific examples of the diol compound used at this time include the following compounds:

specifically, ethylene glycol, diethylene glycol, triethylene glycol, tetraethylene glycol, propylene glycol, dipropylene glycol, polyethylene glycol, polypropylene glycol, neopentyl glycol, 1,3-butyrene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adducts of bisphenol A, propylene oxide adducts of bisphenol A, ethylene oxide adducts of bisphenol F, propylene oxide adducts of bisphenol A, ethylene oxide adducts of hydrogenated bisphenol A, propylene oxide adducts of hydrogenated bisphenol A, hydroquinonedihydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate and bis(2-hydroxyethyl) isophthalate.

Further, the diol compound may have no carboxyl group but may have other substituents which are not reacted with isocyanate. Yet further, other diol compounds may also be used together.

Examples of such a diol compound include compounds shown below.

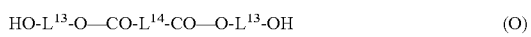

$$\text{HO-L}^{13}\text{-O-CO-L}^{14}\text{-CO-O-L}^{13}\text{-OH} \tag{O}$$

$$\text{HO-L}^{14}\text{-CO-O-L}^{13}\text{-OH} \tag{P}$$

In the above formulae, $L^{13}$ and $L^{14}$, which may be of the same type of different types, respectively represent a divalent aliphatic hydrocarbon group, aromatic hydrocarbon group or heterocyclic group which may have a substituent (including, for example, analkyl group, aralkyl group, aryl group, alkoxy group, aryloxy group or halogen atom (—F, —Cl, —Br and —I)). Also, other functional groups, which are not reacted with an isocyanate group, such as a carbonyl, ester, urethane, amide or ureide group may exist in $L^{13}$ and $L^{14}$, if necessary. $L^{13}$ and $L^{14}$ may be combined to form a ring.

Specific examples of the compound represented by the aforementioned general formula (O) or (P) include the following compounds.

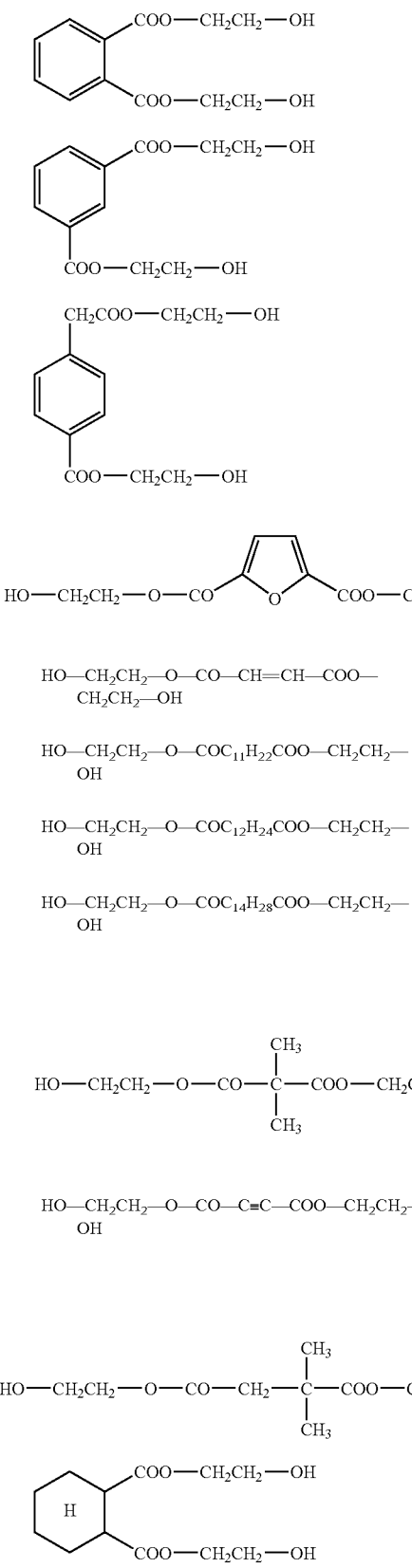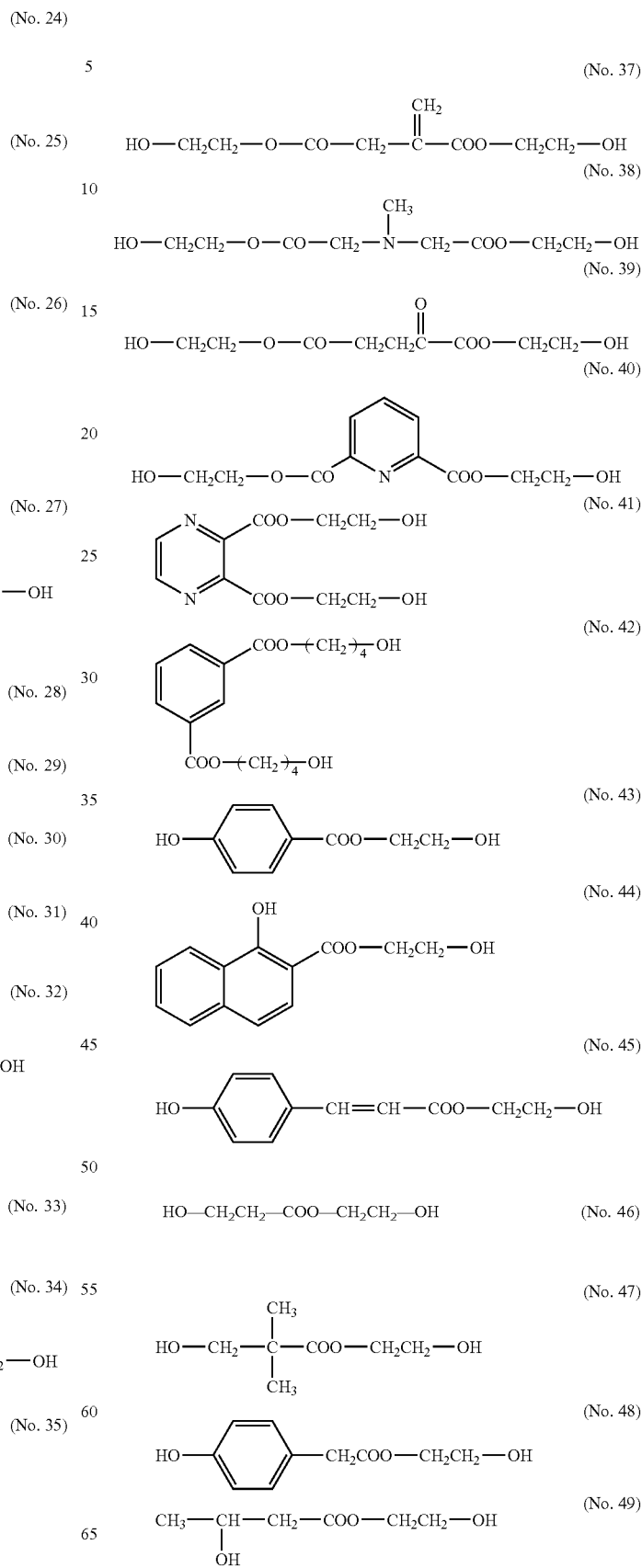

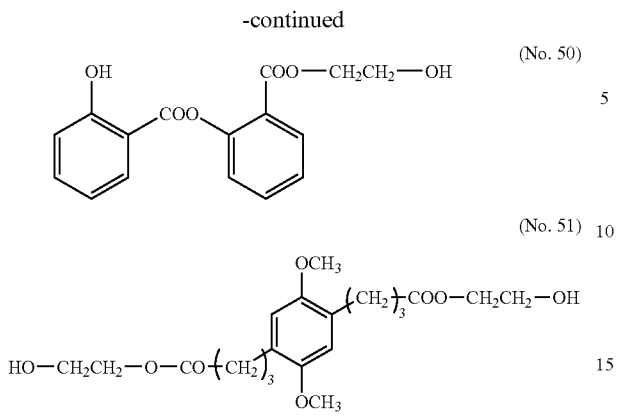 (No. 50)

 (No. 51)

Also, diol compounds shown below may be preferably used.

HO(CH$_2$)$_c$OH (Q)

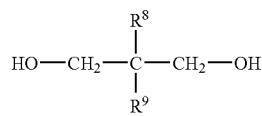 (R)

In the above formulae, R$^8$ and R$^9$, which may be of the same type or different types, respectively represent an alkyl group which may have a substituent, c denotes an integer of 2 or more and preferably an integer from 2 to 100.

Specific examples of the diol compound represented by the general formula (Q) or (R) include compounds shown below:

specifically, ethylene glycol, 1,3-propanediol, 1,4-butandiol, 1,5-pentanediol, 1,6-hexanediol, 1,7-heptanediol and 1,8-octanediol as the diol compound represented by the general formula (Q), and the following compounds as diol compound represented by the general formula (R).

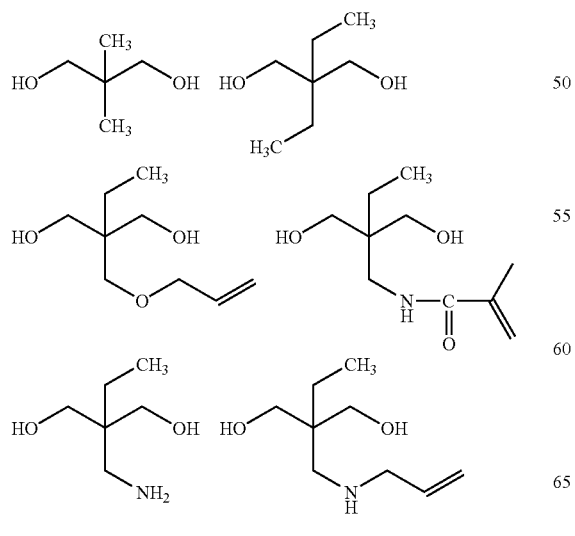

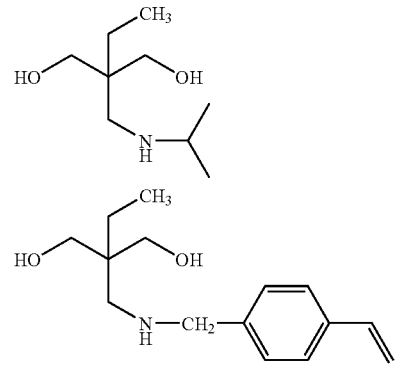

Also, diol compounds shown below may be preferably used.

HO-L$^{15}$-NH—CO-L$^{16}$-CO—NH-L$^{15}$-OH (S)

HO-L$^{16}$-CO—NH-L$^{15}$-OH (T)

In the above formulae, L$^{15}$ and L$^{16}$, which may be of the same type of different types, respectively represent a divalent aliphatic hydrocarbon group, aromatic hydrocarbon group or heterocyclic group which may have a substituent (including, for example, an alkyl group, aralkyl group, aryl group, alkoxy group, aryloxy group or halogen atom (—F, —Cl, —Br and —I)). Also, other functional groups, which do not react with an isocyanate group, such as a carbonyl, ester, urethane, amide or ureide group may exist in L$^{15}$ and L$^{16}$, if necessary, if necessary. L$^{15}$ and L$^{16}$ may be combined to form a ring.

Specific examples of the compound represented by the aforementioned general formula (S) or (T) include the following compounds.

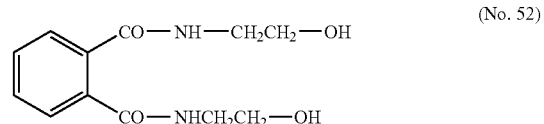 (No. 52)

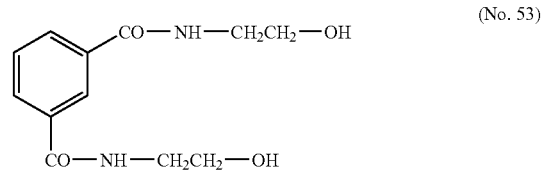 (No. 53)

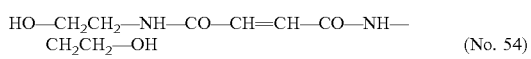 (No. 54)

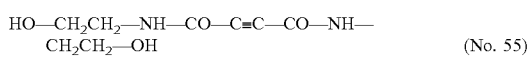 (No. 55)

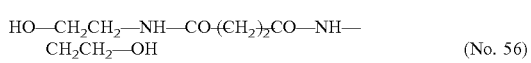 (No. 56)

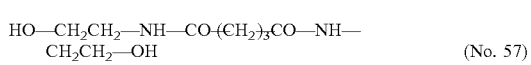 (No. 57)

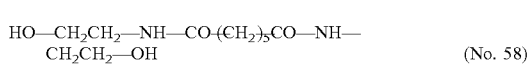 (No. 58)

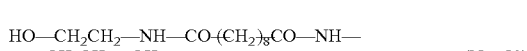 (No. 59)

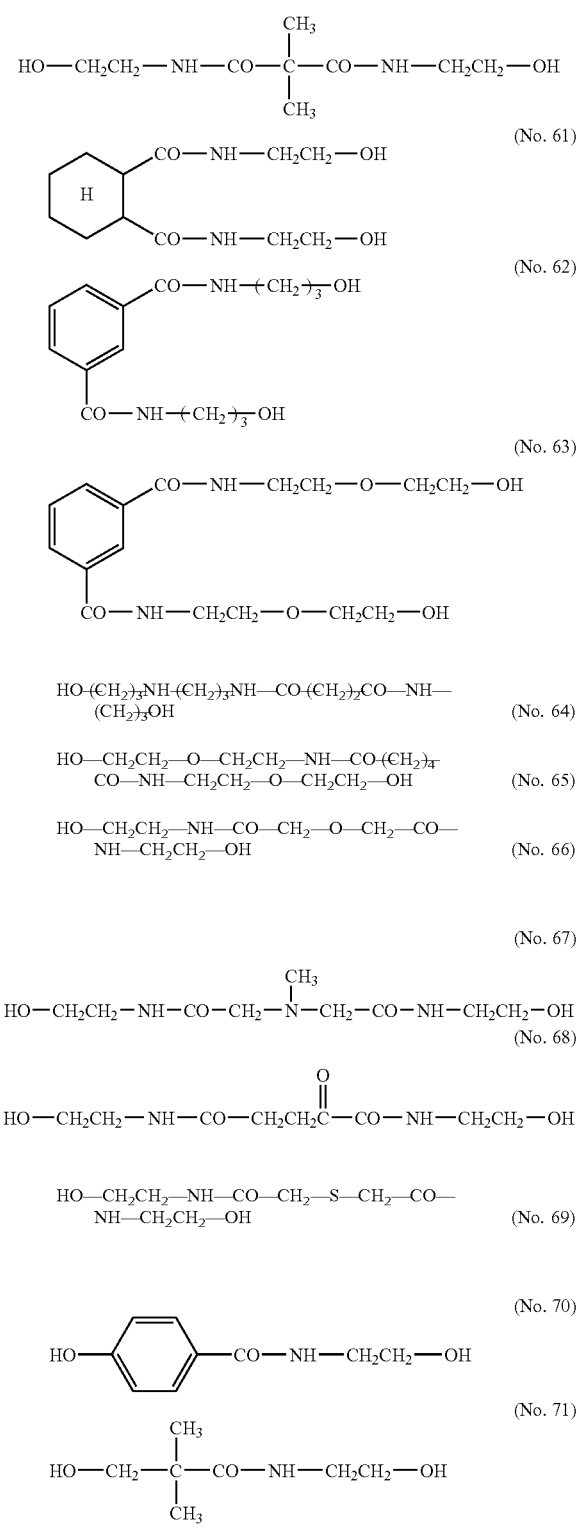

Also, diol compounds shown below may be preferably used.

HO—Ar²-(L¹⁷-Ar³)$_n$-OH (U)

HO—Ar²-L¹⁷-OH (V)

In the above formulae, $L^{17}$ represents a divalent aliphatic hydrocarbon group which may have a substituent (including, for example, an alkyl group, aralkyl group, aryl group, alkoxy group, aryloxy group or halogeno group). Also, other functional groups, which do not react with an isocyanate group, such as an ester, urethane, amide or ureide group may exist in $L^{17}$, if necessary. $Ar^2$ and $Ar^3$, which may be the same or different, respectively represent a divalent aromatic hydrocarbon group which may have a substituent and preferably an aromatic group having 6 to 15 carbon atoms. n denotes an integer from 0 to 10.

Specific examples of the compound represented by the aforementioned general formula (U) or (V) include the following compounds:

specifically, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornane-3,6-diol, bisphenol A, bisphenol S, 3,3'-dichlorobisphenol S, 4,4'-dihydroxybenzophenone, 4,4'-dihydroxybiphenyl, 4,4,'-thiodiphenol, 2,2'-dihydroxydiphenylmethane, 3,4-bis(p-hydroxyphenyl)hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenetyl alcohol, 2-hydroxyethyl-4-hydroxybenzoate, 2-hydroxyethyl-4-hydroxyphenyl acetate and resorcin mono-2-hydroxyethyl ether.

Diol compounds shown below may also be preferably used.

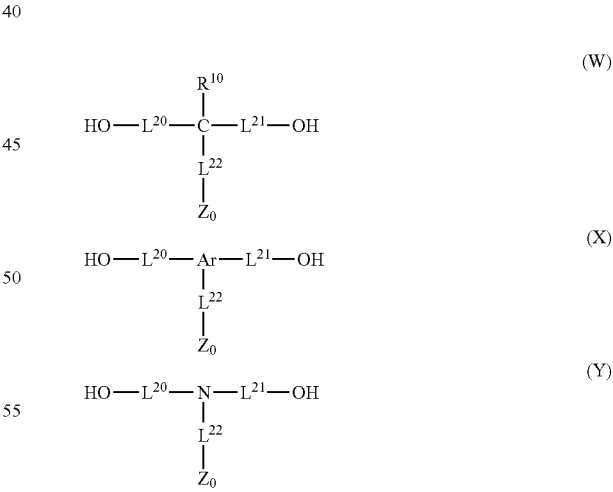

In the above formulae, $R^{10}$ represents a hydrogen atom or an alkyl, aralkyl, aryl, alkoxy or aryloxy group which may have a substituent (including, for example, a group such as a cyano group, nitro group, halogen atom (—F, —Cl, —Br or —I), —CONH$_2$, —COOR$^{11}$, —OR$^{11}$, —NHCONHR$^{11}$, —NHCOOR$^{11}$, —NHCOR$^{11}$, —OCONHR$^{11}$ and —CONHR$^{11}$ (where $R^{11}$ represents an alkyl group having 1 to 10 carbon atoms or an aralkyl group having 7 to 15 carbon atoms)) and preferably a hydrogen atom, an alkyl group having 1 to 8 carbon atoms or an aryl group having 6 to 15 carbon atoms. $L^{20}$, $L^{21}$ and $L^{23}$, which may of be the same type or different types, respectively represent a single bond or a divalent aliphatic or aromatic hydrocarbon group which may have a substituent (preferably, for example, an alkyl group, an aralkyl group, an aryl group, an alkoxy group or a halogeno group), preferably an alkylene group having 1 to 20 carbon atoms or an arylene group having 6 to 15 carbon atoms and more preferably an alkylene group having 1 to 8 carbon atoms. Also, other functional groups, which are not reacted with an isocyanate group, such as a carbonyl, ester, urethane, amide, ureide or ether group may exist in $L^{20}$, $L^{21}$ and $L^{23}$, if necessary. A ring may be formed by two or three among $R^{10}$, $L^{20}$, $L^{21}$ and $L^{23}$. Ar represents a trivalent aromatic hydrocarbon group which may have a substituent and preferably an aromatic group having 6 to 15 carbon atoms. $Z_0$ represents the following group.

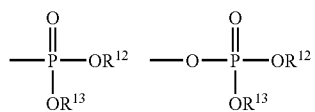

wherein $R^{12}$ and $R^{13}$, which may be of the same type or different types, respectively represent a hydrogen atom, sodium, potassium, an alkyl group or an aryl group and preferably a hydrogen atom, an alkyl group having 1 to 8 carbon atoms or an aryl group having 6 to 15 carbon atoms.

The diol compounds having a phosphonic acid and a phosphoric acid represented by the above general formula (W), (X) or (Y) and/or an ester group of these acids are synthesized by the methods shown below.

After the hydroxy group of the halogen compound represented by the following general formula (W'), (X') or (Y') is protected as required, the halogen compound is phosphonate-esterified by a Michaelis-Arbuzov reaction and further hydrolyzed using hydrogen bromide, if necessary to synthesize the diol compound.

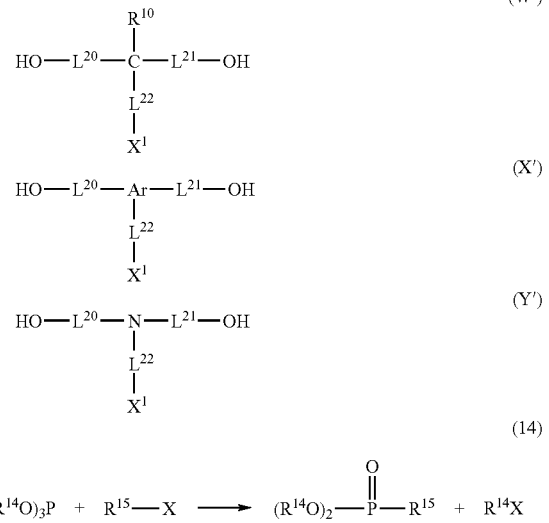

In the above formulae, $R^{10}$, $L^{20}$, $L^{21}$, $L^{22}$ and Ar have the same meanings as in the case of the general formula (W), (X) and (Y). $R^{14}$ represents an alkyl group or an aryl group and preferably an alkyl group having 1 to 8 carbon atoms or an aryl group having 6 to 15 carbon atoms. $R^{15}$ represents a residue obtained by excluding $X^1$ from the formulae (W'), (X') and (Y'), wherein $X^1$ represents a halogen atom and preferably Cl, Br or I.

Also, synthes is carried out by a method in which, after a reaction with phosphorous oxychloride represented by the general formula (15) is finished, the resulting product is hydrolyzed.

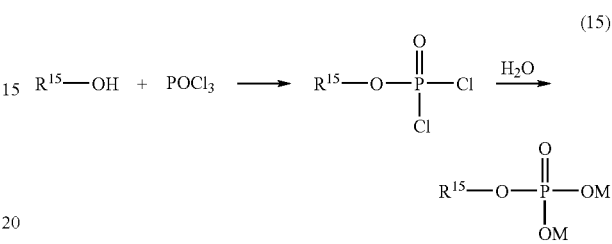

In the above general formula, $R^{15}$ has the same meaning as in the case of the general formula (14) and M represents a hydrogen atom, sodium or potassium.

In the case where the polyurethane resin used in the present embodiment has a phosphonic acid group, the diisocyanate compound represented by the general formula (13) may be reacted with the diol compound having a phosphonic acid ester group represented by the general formula (W), (X) or (Y) to form a polyurethane resin, which is then hydrolyzed using a hydrogen bromide or the like to synthesize the diol compound.

Moreover, amino group-containing compounds (16) and (17) may also be reacted with the diisocyanate compound represented by the general formula (13) in the same manner as the diol compound to form a urea structure, which is then incorporated into the structure of a polyurethane resin.

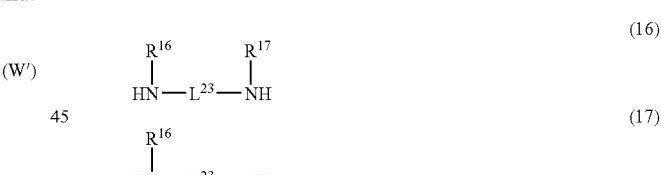

In the above formulae, $R^{16}$ and $R^{17}$, which may be of the same type or different types, respectively represent a hydrogen atom or an alkyl, aralkyl or aryl group which may have a substituent (including, for example, an alkoxy group, halogen atom (—F, —Cl, —Br and —I), ester group and carboxyl group) and preferably a hydrogen atom or an alkyl group having 1 to 8 carbon atoms or an aryl group having 6 to 15 carbon atoms which group may have a carboxyl group as a substituent. $L^{23}$ represents a divalent aliphatic hydrocarbon group, aromatic hydrocarbon group or heterocyclic group which may have a substituent (including, for example, an alkyl group, aralkyl group, aryl group, alkoxy group, aryloxy group, halogen atom (—F, —Cl, —Br and —I) or carboxyl group). Also, other functional groups, which do not react with an isocyanate group, such as a carbonyl, ester, urethane, amide or ureide group may exist in $L^{23}$, if necessary. Two among R16, $L^{23}$ and $R^{17}$ may be combined to form a ring.

Specific examples of the compound represented by the aforementioned general formula (16) or (17) include the following compounds:

specifically, aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-mino-2,2-6,6-tetramethylpiperidine, N,N-dimethylethylenediamine, lysine, L-cystine and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds such as 2-aminoimidazole, 3-aminotriazole, 5-amino-1H-tetrazole, 4-aminopyrazole, 2-aminobenzimidazole, 2-amino-5-carboxy-triazole, 2,4-diamino-6-methyl-S-triazine, 2,6-diaminopyridine, L-histidine, DL-tryptophan and adenine; and amino alcohol or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenetyl alcohol, 2-carboxy-5-amino-1-naphthol and L-tyrosine.

A urethane type binder is synthesized by reacting the aforementioned isocyanate compound with the aforementioned diol compound under heating in a non-protonic solvent in the presence of a known catalyst added corresponding to each reactivity. The mol ratio of the diisocyanate to the diol compound to be used is preferably 0.8:1 to 1.2:1.

The urethane type binder is preferably a polyurethane resin having a structure represented by a reaction product between the isocyanate compound and at least one type among polyether diol compounds, polyesterdiol compounds and polycarbonate diol compounds. The content of the diol compound in the polyurethane resin is preferably 1 to 80% by weight and more preferably 5 to 60% by weight.

The urethane type binder is preferably a polyurethane resin having a carboxyl group. As to the content of the binder, the carboxyl group is contained in an amount of preferably 0.4 meq/g or more and more preferably 0.4 to 3.5 meq/g.

The molecular weight of the urethane type binder is preferably 1,000 or more and more preferably in the range of 10,000 to 300,000 in weight average.

The binder polymer used in the present embodiment may be used either singly or by mixing with each other. The polymer is added to the photo-sensitive layer in an amount of 20 to 95% by mass and preferably 30 to 90% by mass based on the total solid of the photo-sensitive layer coating solution. When the amount is less than 20% by mass, the strength of an image portion is dissatisfied. On the other hand, when the amount exceeds 95% by mass, no image is formed.

Also, the ratio by weight of the compound having a radical-polymerizable ethylenic unsaturated double bond to the linear organic polymer is preferably in the range of 1/9 to 7/3.

It is to be noted that the aforementioned urethane type binder used particularly preferably in the present embodiment is preferably used together in a ratio of 2 to 5 equivalents (mass) to the aforementioned specific radical generator.

(Other Components in the Photo-sensitive Layer)

In the present embodiment, various compounds other than the above components may be further added, if necessary. For example, dyes having large absorption in the visible range may be used as the colorants of an image. Specific examples of these dyes may include Oil Yellow #101, Oil Yellow #103, Oil Pink #312, Oil Green BG, Oil Blue BOS, Oil Blue #603, Oil Black BY, Oil Black BS, Oil Black T-505 (the above materials are all manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) and dyes described in JP-A No. 62-293247. Pigments such as phthalocyanine type pigments, azo type pigments, carbon black and titanium oxide may be preferably used.

These colorants are preferably added because an image portion and a non-image portion are easily discriminated from each other after an image is formed. The ratio of these colorants to be added is 0.01 to 10% by mass based on the total solid of the photo-sensitive layer coating solution.

Also, in the present embodiment, a small amount of thermopolymerization inhibitor is preferably added to inhibit unnecessary thermopolymerization of the compound having a radical-polymerizable ethylenic unsaturated bond during the preparation and storage of the photo-sensitive coating solution. Examples of a proper thermopolymerization inhibitor include hydroquinone, p-methoxyphenol, di-t-butyl-p-cresol, pyrogallol, t-butylcatechol, benzoquinone, 4,4,-thiovis(3-methyl-6-t-butylphenol), 2,2'-methylenebis (4-methyl-6-t-butylphenol) and N-nitrosophenylhydroxyamine cerous salt. The amount of the thermopolymerization inhibitor to be added is preferably about 0.01% by mass to about 5% by mass based on the mass of the whole composition. Also, when adding a higher fatty acid derivative such as behenic acid or behenic acid amide or the like, if necessary, to prevent polymerization inhibition due to oxygen, the higher fatty acid derivative maybe localized on the surface of the recording layer during the course of drying after applying to a support or the like. The amount of the higher fatty acid derivative is preferably about 0.1% by mass to about 10% by mass based on the whole composition.

Also, nonionic surfactants as described in JP-A Nos. 62-251740 and 3-208514 and amphoteric surfactants as described in JP-A Nos. 59-121044 and 4-13149 may be added to the photo-sensitive layer coating solution in the present embodiment to widen process stability to developing conditions.

Examples of the nonionic surfactant include sorbitan tristearate, sorbitan monopalmitate, sorbitan triorate, monoglyceride stearate and polyoxyethylene nonylphenyl ether.

Examples of the amphoteric surfactant include alkyldi (aminoethyl)glycine, alkylpolyaminoethylglycine hydrochloride, 2-alky-N-carboxyethyl-N-hydroxyethylimidazoliniumbetaine and N-tetradecyl-N,N-betaine types (e.g., trademark: Amorgen K, manufactured by Dai-ichi Kogyo Seiyaku Co., Ltd.).

The proportion occupied by the aforementioned nonionic surfactant and amphoteric surfactant in the photo-sensitive composition is preferably 0.05 to 15% by mass and more preferably 0.1 to 5% by mass.

Other than the above, additives such as an adhesion improver, developing improver, ultraviolet absorber and sliding agent may be preferably contained corresponding to the purpose.

Further, a plasticizer may be added to the photo-sensitive layer coating solution according to the present embodiment as required to impart softness to a coating film. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate or the like is used.

In the production of a planographic printing plate precursor by using the photo-sensitive composition of the present embodiment, usually each of the aforementioned components necessary for a photo-sensitive layer coating solution may be dissolved in a solvent and applied to an appropriate support. Examples of the solvent used here may include, though not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. These solvents may be used either singly or by mixing with each other. The concentration of the above components (total solid content including the additives) in the solvent is preferably 1 to 50% by mass.

The amount of the photo-sensitive layer coating solution (solid content) which is applied to the support and dried is, though it differs depending on its use, generally 0.5 to 5.0 g/m$^2$ in the case of a planographic printing plate precursor. Although apparent sensitivity is increased with decreased coating amount, the film characteristics of the photo-sensitive layer which accomplishes an image-recording function are then deteriorated.

Various methods may be used as a coating method. Bar coater coating, rotary coating, spray coating, curtain coating, dip coating, air-knife coating, blade coating and roll coating may be exemplified.

A surfactant for improving coatability, for example, a fluorine based surfactant such as those described in JP-A No. 62-170950 may be added to the photo-sensitive coating solution according to the present embodiment. The amount of the surfactant to be added is preferably 0.01 to 1% by mass and more preferably 0.05 to 0.5% by mass in the material solid content of the whole photo-sensitive layer.

(Supports)

A negative type image recording material using the photo-sensitive composition of the present embodiment is formed by applying a recording layer using the aforementioned photo-sensitive composition to a support by coating. No particular limitation is imposed on a material usable as the support insofar as it is a dimensionally stable plate material. The surface treatment of this support is the same as that of the support described in the aforementioned first embodiment. The detailed explanations of the support are therefore omitted.

In the support used for a planographic printing plate using the photo-sensitive composition of the present embodiment, a preferable center average roughness is 0.10 to 1.2 μm. When the center average roughness is less than 0.10 μm, the adhesion of the support to the photo-sensitive layer is poor, causing a significant deterioration in printing durability. When the center average roughness exceeds 1.2 μm, contamination resistance during printing is deteriorated.

Moreover, the color density of the support is 0.15 to 0.65 in terms of reflection density value. When the reflection density value is less than 0.15, a halation at the time of imagewise exposure is too strong, whereby image formation is hindered. On the contrary, when the reflection density value is larger than 0.65, it is difficult to see an image in a plate-inspection operation after development, plate-inspection characteristics are deteriorated.

As mentioned above, the aforementioned photo-sensitive layer and further other desired layers such as a surface protective layer and a backcoat layer may be formed on the support obtained by a predetermined processing, whereby a planographic printing plate precursor having a negative type image recording layer (hereinafter referred to as a photo-sensitive layer as the case may be) using the photo-sensitive composition of the present embodiment can be obtained. In this planographic printing plate precursor according to the present embodiment, an image is formed using an infrared laser. Also, this planographic printing plate precursor enables thermal recording using a ultraviolet lamp and a thermal head.

In the present embodiment, it is preferable to imagewise-expose the planographic printing plate precursor by using a solid laser or a semiconductor laser emitting infrared rays having a wavelength ranging from 760 nm to 1200 nm. The output of the laser is preferably 100 mW or more and it is preferable to use a multi-beam laser device to shorten exposure time. Also, exposure time per pixel is preferably within 20 μseconds. The energy applied to the recording material by irradiation is preferably 10 to 300 mJ/cm$^2$. When the energy for exposure is excessively small, the image recording layer is insufficiently cured and there is therefore a possibility that the insolubilizing ratio defined by the invention cannot be attained. On the other hand, when the energy is too large, the image recording layer is abraded by a laser and there is therefore a possibility that an image is damaged.

The exposure in the present embodiment may be carried out with overlapping the light beam of a light source. The term "overlap" means that the width of sub-scanning pitch is smaller than the diameter of a beam. The overlap can be expressed quantitatively by FWHM/sub-scanning pitch width (overlap coefficient) when the beam diameter is expressed by the half width of beam strength (FWHM). In the present embodiment, this overlap coefficient is preferably 0.1 or more.

There is no particular limitation to the scanning system of the light source of an exposure apparatus used in the present embodiment, and a cylindrical external surface scanning system, cylindrical internal surface scanning system, plane scanning system and the like may be used. Also, although the channel of the light source may be single channel or multi-channel, multi-channel is preferably used in the case of the cylindrical external surface system.

The developer and replenishing solution used for the developing and plate-making of a planographic printing plate to which the image recording material of the present embodiment is applied are the same as those used in the aforementioned first embodiment and therefore detailed explanations are omitted.

Particularly preferable developers among alkali agents are aqueous solutions of a silicate such as sodium silicate and potassium silicate. This reason is that developing characteristics can be controlled by changing the ratio of silicon oxide $SiO_2$, which is a component of the silicate, to an alkali metal oxide $M_2O$ and by changing concentrations of $SiO_2$ and $M_2O$. For example, alkali metal silicates as described in JP-A No. 54-62004 and JP-B No. 57-7427 are used effectively.

When development is carried out by using an automatic developing machine, the developing conditions are the same as those described in the application example of the first embodiment, and thus detailed explanations thereof are omitted.

When burning the planographic printing plate, it is preferable that the planographic printing plate is treated with a surface regulating solution as described in JP-B Nos. 61-2518 and 55-28062 and JP-A Nos. 62-31859 and 61-159655.

As the method of burning, a method, in which a sponge or absorbent cotton impregnated with the surface regulating solution is used to apply this solution to the planographic printing plate or the printing plate is dipped in a vat filled with the surface regulating solution to apply the solution to the printing plate, and a method of applying the solution by using an automatic coater may be applied. Making the coating amount uniform by using a squeegee or squeegee roller after coating gives better results. The amount of the surface regulating solution is preferably set to be generally 0.03 to 0.8 g/m² (dry weight).

The planographic printing plate to which the surface regulating solution has been applied is dried if necessary, and then heated at high temperatures by using a burning processor (for example, a burning processor: BP-1300 which is commercially available from Fuji Photo Film Co., Ltd.). Although heating temperature and time in this case depends on the types of components forming an image, a temperature range from 180 to 300° C. and a time range from 1 to 20 minutes are preferable.

The planographic printing plate which has been processed by burning treatment may be subjected appropriately to conventionally performed treatments such as washing and gum application. In the case of using a surface regulating solution containing a water-soluble macromolecular compound and the like, a so-called protective gum treatment such as gum application may be omitted.

The planographic printing plate using the photo-sensitive composition of the present embodiment for the image recording layer is placed in an offset printer and used for printing a number of copies.

EXAMPLES

The present invention will be hereinafter explained in detail by way of examples, which, however, do not be limit the present invention.

Examples 1 to 5, Comparative Example 1, and Reference Example

[Production of a Support]

<Aluminum Plate>

A molten bath was prepared using an aluminum alloy having the following composition: Si: 0.06% by mass, Fe: 0.30% by mass, Cu: 0.001% by mass, Mn: 0.001% by mass, Mg: 0.001% by mass, Zn: 0.001% by mass and Ti: 0.03% by mass, which was balanced with Al and unavoidable impurities. After molten bath treatment and filtration were finished, an ingot having a thickness of 500 mm and a width of 1200 mm was produced by a DC casting method. The ingot was planed by cutting the surface portion with an average thickness of 10 mm using a facing machine and was then kept at 550° C. for about 5 hours in the manner of soaking. When the temperature of the ingot was dropped to 400° C., the ingot was rolled by a hot roller to form a rolled plate having a thickness of 2.7 mm. The rolled plate was further heat-treated at 500° C. by using a continuous annealing machine, followed by cold-rolling to finish a plate with a thickness of 0.24 mm, thereby obtaining an aluminum plate of JIS 1050 material. This aluminum plate was cut down to a width of 1030 mm and then subjected to the following surface treatment.

<Surface Treatment>

The surface treatment was performed by carrying out the following various treatments (a) to (j) continuously. After these various treatments and washing with water, the liquid was drained off by a nip roller.

(a) Mechanical Surface Roughing Treatment

Using a device as shown in FIG. 1, mechanical surface roughing treatment was carried out by a rotating roller-like nylon brush with supplying a suspension of an abrasive agent (pumice) having a specific gravity of 1.12 and water as an abrasive slurry solution to the surface of the aluminum plate. In FIG. 1, 1 represents an aluminum plate, 2 and 4 respectively represent a roller-like brush, 3 represents an abrasive slurry solution and 5, 6, 7 and 8 respectively represent a support roller. The average particle diameter of the abrasive agent was 30 μm and the maximum particle diameter of the abrasive agent was 100 μm. The material of the nylon brush was 6·10 nylon wherein the hair length was 45 mm and the diameter of the hair was 0.3 mm. The nylon brush was obtained by opening holes in a stainless cylinder having a diameter of 300 mm and by planting hairs therein densely. Three rotary brushes were used. The distance between two support rollers (diameter: 200 mm) under the brush was 300 mm. The brush roller was pressed to the aluminum plate until the load of the drive motor rotating the brush was increased to a load 7 kW higher than the load before the brush was pressed to the aluminum plate. The direction of the rotation of the brush was the same as the direction in which the aluminum plate was moved. The number of rotations of the brush was 200 rpm.

(b) Alkali Etching Treatment

The aluminum plate obtained above was subjected to etching treatment by spraying thereto a 70° C. aqueous solution containing 2.6% by mass of caustic soda and 6.5% by mass of aluminum ions, to etch 10 g/m² of the aluminum plate, followed by washing with water by spraying.

(c) Desmutting Treatment

Desmutting treatment was carried out using an aqueous 1% by mass nitric acid solution (containing 0.5% by mass of aluminum ions) kept at 30° C., followed by washing with water by spraying. As the aqueous nitric acid solution used in the desmutting treatment, a waste solution obtained in a step of the electrochemical surface roughing treatment using a.c. current in an aqueous nitric acid solution was used.

(d) Electrochemical Surface Roughing Treatment

Figure 2:
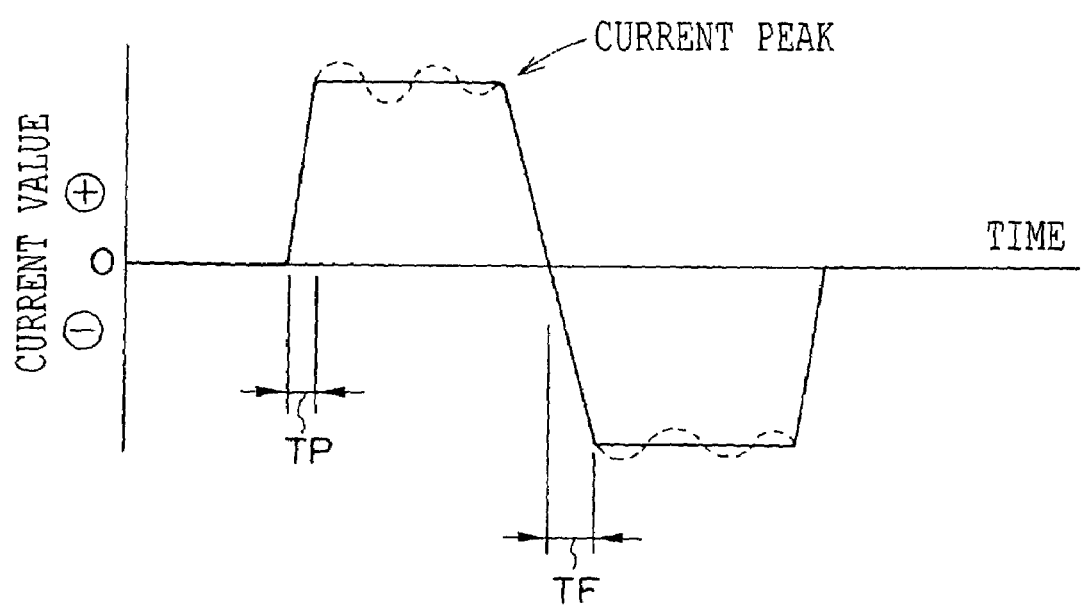
FIG. 2 is a graph showing one example of a view of an alternate-waveform current waveform used for electrochemical surface roughing treatment in the production of the support of the planographic printing plate shown in FIG. 1.
Figure 3:
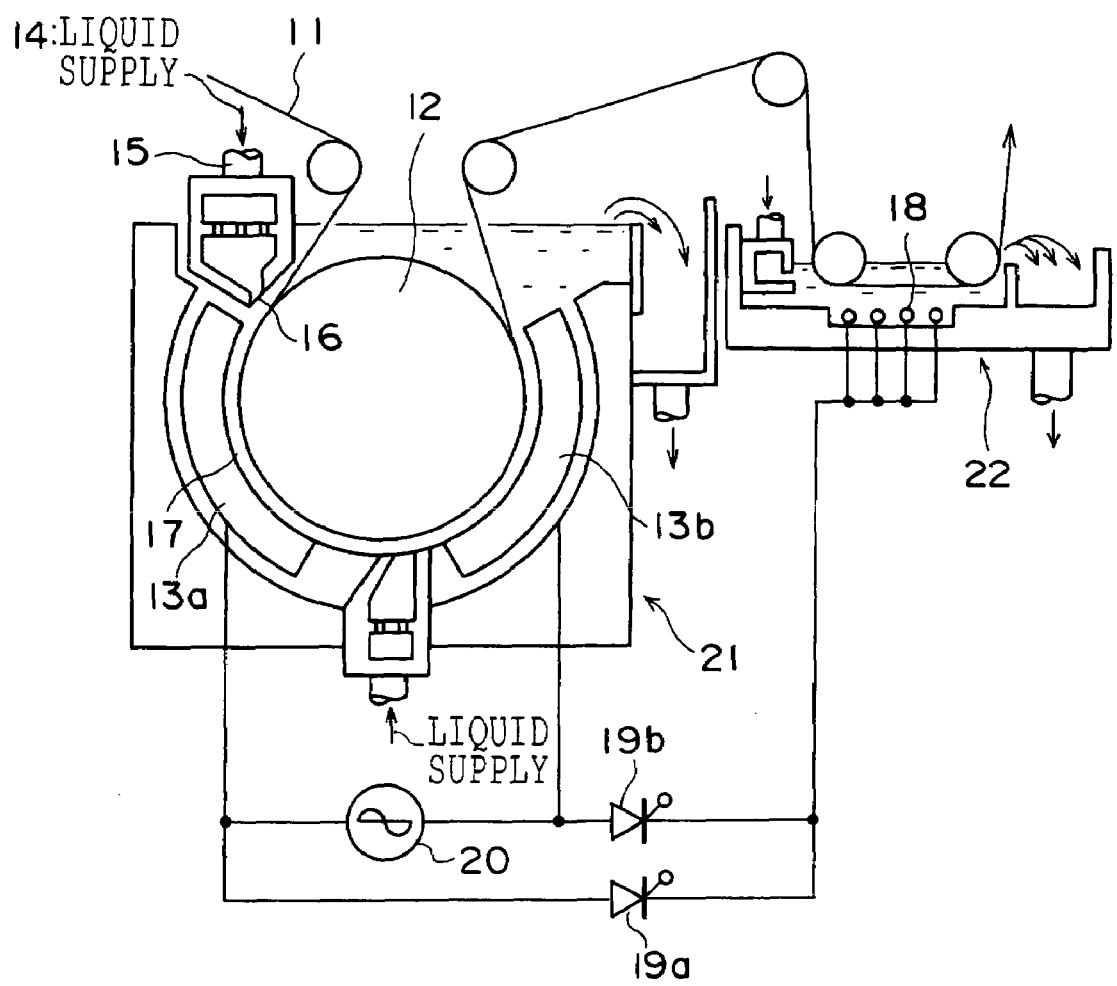
FIG. 3 is a side view showing one example of a radial type cell in electrochemical surface roughing treatment in the production of the support of the planographic printing plate shown in FIG. 1.

Electrochemical surface roughing treatment was continuously carried out using an a.c. voltage of 60 Hz. The electrolyte used in this treatment was an aqueous solution containing 10.5 g/L of nitric acid (including 5 g/L of aluminum ions and 0.007% by mass of ammonium ions) and the temperature of this electrolyte was 50° C. The a.c. power source had the waveform shown in FIG. 2. Using trapezoidal rectangular waved-a.c. current wherein the time TP required for current value to reach a peak from 0 was 0.8 msec and the duty ratio was 1:1, electrochemical surface roughing treatment was carried out using a carbon electrode as a counter electrode. As the auxiliary anode, ferrite is used. The electrolytic vessel used is shown in FIG. 3.

The current density was 30 A/dm$^2$ at a peak current and the quantity of electricity was 220 C/dm$^2$ as the total quantity of electricity when the aluminum plate was an anode. 5% of the current flowing from the power source was supplied separately to the auxiliary electrode. Thereafter, the aluminum plate is washed with water by spraying.

(e) Alkali Etching Treatment

The aluminum plate was subjected to etching treatment at 32° C. by spraying an aqueous solution containing 26% by mass of caustic soda and 6.5% by mass of aluminum ions to the aluminum plate, to etch the aluminum plate in an amount of 0.50 g/m$^2$, and to remove the smut component primarily containing aluminum hydroxide generated during the foregoing electrochemical surface roughing treatment using a.c. current, and also to etch the edge part of the pit produced to thereby round the edge part. Then, the aluminum plate is washed with water by spraying.

(f) Desmutting Treatment

An aqueous 15% by mass sulfuric acid solution (including 4.5% by mass of aluminum ions) was used to carry out desmutting treatment at 30° C., which treatment was carried out by spraying the sulfric acid solution, followed by washing with water by spraying. As the aqueous nitric acid solution used in the desmutting treatment, a waste solution in the step of the electrochemical surface roughing treatment using a.c. current in an aqueous nitric acid solution was used.

(g) Electrochemical Surface Roughing Treatment

Electrochemical surface roughing treatment was continuously carried out using an a.c. voltage of 60 Hz. The electrolyte used in this treatment was an aqueous solution containing 5.0 g/L of hydrochloric acid (including 5 g/L of aluminum ions) and the temperature of this electrolyte was 35° C. The a.c. power source had the waveform shown in FIG. 2. Using trapezoidal rectangular waved-a.c. current, wherein the time TP required for current value to reach a peak from 0 was 0.8 msec and the duty ratio was 1:1, electrochemical surface roughing treatment was carried out using a carbon electrode as a counter electrode. As the auxiliary anode, ferrite was used. The electrolytic vessel used is shown in FIG. 3.

The current density was 25 A/dm$^2$ at a peak current and the quantity of electricity was 50 C/dm$^2$ as the total quantity of electricity when the aluminum plate was an anode. Then the aluminum plate was washed with water by spraying.

(h) Alkali Etching Treatment

The aluminum plate was subjected to etching treatment at 32° C. by spaying an aqueous solution containing 26% by mass of caustic soda and 6.5% by mass of aluminum ions to the aluminum plate, to etch the aluminum plate in an amount of 0.10 g/m$^2$, to remove the smut component primarily containing aluminum hydroxide generated during the foregoing electrochemical surface roughing treatment using a.c. current, and also to etch the edge part of the pit produced to thereby round the edge part. Then, the aluminum plate was washed with water by spraying.

(i) Desmutting Treatment

An aqueous 25% by mass sulfuric acid solution (including 0.5% by mass of aluminum ions) was used to carry out desmutting treatment at 60° C. by spraying, followed by washing with water by spraying.

(j) Anodic Oxidation Treatment

Figure 4:
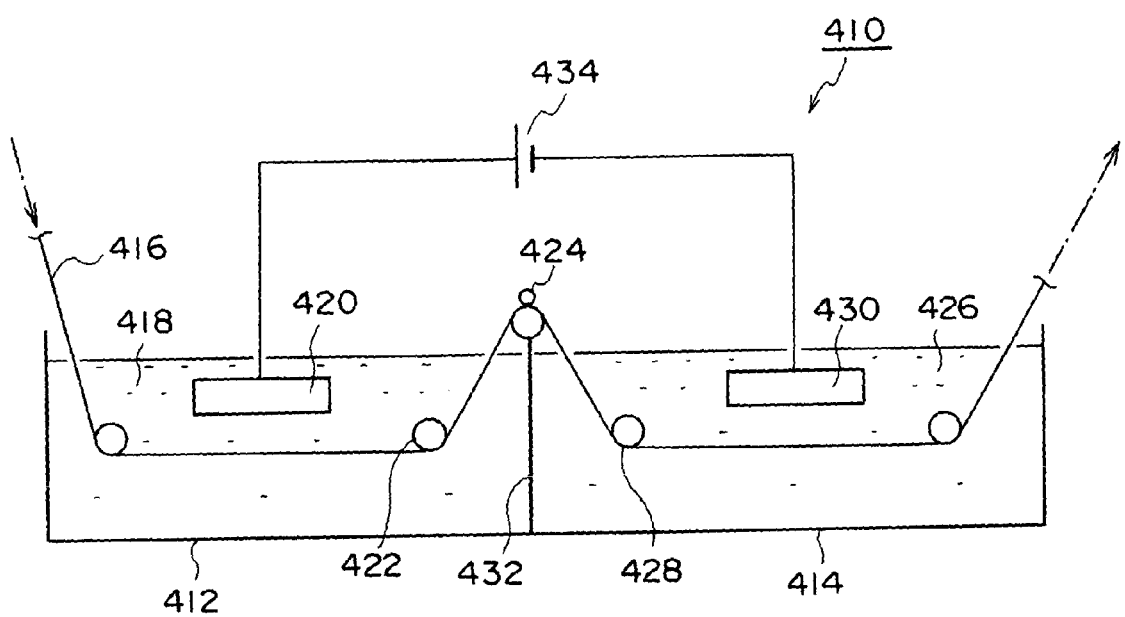
FIG. 4 is a schematic view of an anodic oxidation process device used for anodic oxidation treatment in the production of the support of the planographic printing plate shown in FIG. 1.

Anodic oxidation treatment is carried out using an anodic oxidizing device having the structure shown in FIG. 4 to obtain a support for a planographic printing plate. As the electrolyte supplied to the first and second electrolytic portions, sulfuric acid was used. All the electrolytes contained 170 g/L of sulfuric acid (including 0.5% by mass of aluminum ions) and were used at 38° C. Then, the support was washed with water by spraying. The amount of the final oxide film was 2.7 g/m$^2$.

[Undercoating]

Next, the aluminum support was coated with the following undercoat solution by using a wire bar and the applied solution was dried at 90° C. for 30 seconds by using a hot air type dryer. The coating amount after drying was 10 mg/M$^2$.

<Undercoat Solution>

Copolymer of ethylacrylate and sodium 2-acrylamido-2-

| | |
|---|---|
| methyl-1-propanesulfonate (mol ratio: 75:15) | 0.1 g |
| 2-Aminoethylphosphonic acid | 0.1 g |
| Methanol | 50 g |
| Ion exchange water | 50 g |

[Photo-sensitive Layer]

Next, the following photo-sensitive layer coating solution (P-1) was prepared and applied to the above undercoated aluminum plate by using a wire bar. The applied coating solution was dried at 125° C. for 27 seconds by using a hot air type dryer to obtain a planographic printing plate precursor. The coating amount after drying wass within the range of 1.2 to 1.3 g/m$^2$, the contact angle with water was 92° and the dynamic friction coefficient for a sapphire needle (R: 1 mm) was 0.14.

<Photo-sensitive Layer Coating Solution (P-1)>

| | |
|---|---|
| Infrared absorber (IR-1) | 0.08 g |
| Radical generator shown in FIG. 1 | (amount shown in the table) |
| Dipentaerythritol hexaacrylate | 1.00 g |
| Binder (P-1) | 1.00 g |
| Chloride of Ethyl Violet | 0.04 g |
| Fluorine type surfactant (W-1) | 0.03 g |
| Stearoylmethylamide | 0.06 g |
| Methyl ethyl ketone | 14 g |
| Methanol | 6.5 g |
| 1-Methoxy-2-propanol | 14 g |

Each structure of the infrared absorber (IR-1), binder (P-1) and fluorine type surfactant (W-1) used in the above photo-sensitive layer coating solution, and the conventional radical generators (comparative compound 1 and reference compound) used in comparative example 1 and reference compound, are shown below.

-continued

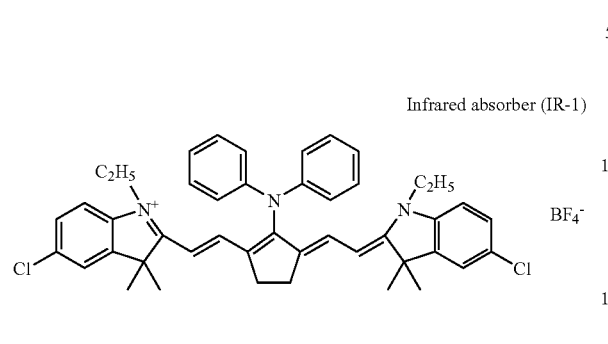

[Overcoat Layer]

An aqueous solution of 3% by mass polyvinyl alcohol (degree of saponification: 98% by mol, degree of polymerization: 500) was applied to the surface of the photosensitive layer by using a wire bar and dried at 100° C. for 90 seconds in a hot air type dryer. The coating amount after drying was 1.0 g/m².

[Evaluation]

<Exposure>

The resulting negative type planographic printing plate precursor was imagewise-exposed with a resolution of 1751 dpi in Trendsetter 3244 VFS manufactured by Creo and mounted with a water-cooling type 40 W infrared semiconductor laser in the following condition: power: 9 W, rotations of the external surface drum: 210 rpm, plate surface energy: 100 mJ/cm² and resolution: 2400 dpi.

<Developing Treatment>

After exposure, the resulting plate precursor was subjected to developing treatment using an automatic developing machine LP 940H manufactured by Fuji Photo Film Co., Ltd. in the condition of 30° C. and 20 seconds. As the developer, a DV-2 (manufactured by Fuji Photo Film Co., Ltd.) solution diluted with water (1:4) was used. As the finisher, a FP-2 (manufactured by Fuji Photo Film Co., Ltd.) solution diluted with water (1:1) was used.

(1) Printing Performance

The density of the non-image portion of the resulting planographic printing plate was measured by a Macbeth reflection densitometer RD-918 and then the planographic printing plate was subjected to printing using a printer Lithron manufactured by Komori Corporation, to evaluate the printing durability of the plate. The results are shown in Table 1.

TABLE 1

| | Radical generator | | Density of a non-image portion | Printing durability (Sheets) |
|---|---|---|---|---|
| Type | Molecular weight | Amount (mg/m$^2$) | | |
| Comparative Example 1 | Comparative compound 1 | 706 | 180 | 0.32 | 50,000 |
| Example 1 | R-1 | 6300 | 180 | 0.32 | 100,000 |
| Example 2 | R-17 | 8000 | 240 | 0.32 | 100,000 |
| Example 3 | R-15 | 20000 | 240 | 0.32 | 100,000 |
| Example 4 | R-9 | 24000 | 150 | 0.32 | 100,000 |
| Example 5 | R-4 | 32000 | 191 | 0.33 | 100,000 |
| Reference Example | Reference compound | 60000 | 191 | 0.51 | 100,000 |

As is clear from Table 1, it is understood that Examples 1 to 5 of the present embodiment in which the molecular weight of the radical generator is in a range of 1,000 to 50,000 each exhibit a decrease in the density of the non-image portion, which density corresponds to contamination characteristics during printing, i.e., are superior both in the contamination characteristics of the non-image portion and in printing performance. It is understood that on the contrary, Comparative Example 1 using a radical generator having an excessively small molecular weight is inferior in printing durability, whereas Reference Example using a radical generator having an excessively large molecular weight exerts no problem concerning printing durability but a contamination occurs on the non-image portion.

Example 6

A planographic printing plate precursor of Example 6 was obtained in the same manner as in Example 1 except that dipentaerythritol hexaacrylate was replaced with the following ethylenic unsaturated bond-containing compound (M-1) and the binder polymer (P-1) was replaced with the following polyurethane type binder (P-2) in the photo-sensitive layer coating solution (P-1) used in Example 1. The resulting planographic printing plate precursor was evaluated in the same manner as in Example 1. planographic printing plate precursor

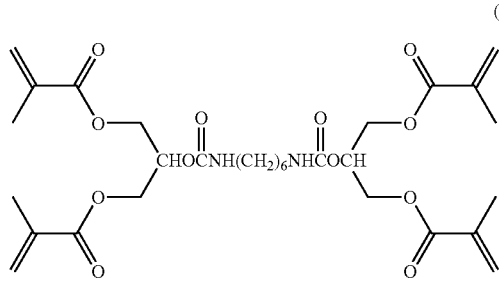
(M-1)

(P-2)
MDI/HMDI/PPG 1000/DMPA=40/10/11/39 mol %
Mw≈5,5000

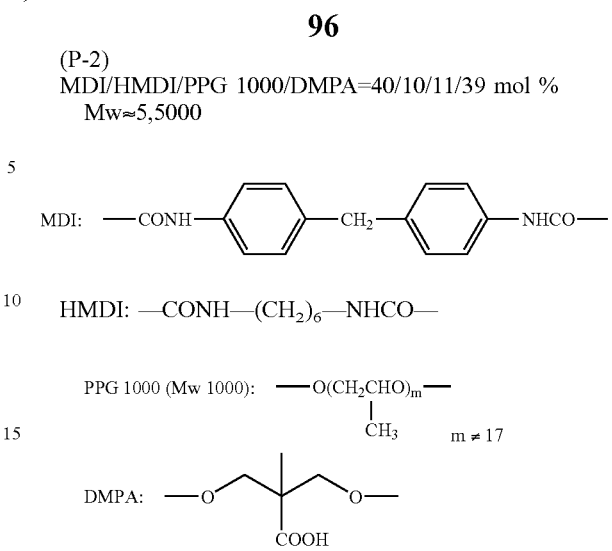

HMDI: —CONH—(CH$_2$)$_6$—NHCO—

PPG 1000 (Mw 1000): —O(CH$_2$CHO)$_m$—
 |
 CH$_3$   m ≠ 17

DMPA:

From the results of evaluation, the density of the non-image portion was 0.31, the result of printing durability was 150,000 sheets, and the density of the non-image portion was low, showing that the planographic printing plate of the example was superior in both the contamination characteristics of the non-image portion and printing durability. Also, the use of the urethane type binder lead to an effect of further improving the printing durability.

III. The macromolecular compound based on the sixth characteristics of the invention and the polymerizable composition and planographic printing plate precursor using the macromolecular compound will be described in detail in the following third embodiment.

THIRD EMBODIMENT

The macromolecular compound of the present embodiment includes, at a side chain thereof, a structure represented by the following general formula (I).

General Formula (III)

COCOO$^-$M$^+$

In the general formula (III), M$^+$ represents an onium cation selected from sulfonium, iodonium, diazonium and azinium. It is to be noted that sulfonium, iodonium and diazonium are the same as those described in the first embodiment and therefore explanations of them are omitted here.

The macromolecular compound of the present embodiment preferably has a structural unit represented by the following general formula (IV), which structural unit contains the structure represented by the general formula (III) at a side chain thereof.

General formula (IV)
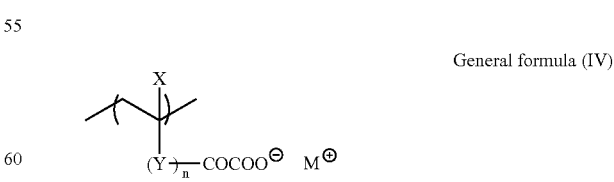

In the general formula (IV), X and Y have the same definitions as those in the general formula (II) and therefore explanations of them are omitted.

The macromolecular compound of the present embodiment may be constituted only of the structural unit having the side chain structure represented by the general formula (I) or of the structural unit represented by the general formula (II) which is a preferable example of the above structural unit. Alternatively, the macromolecular compound of the present embodiment may be a copolymer with known other various monomers. Examples of the copolymerizable monomer include radical polymerizable structural units selected from, for example, acrylates, methacrylates, acrylamides, methacrylamides, styrenes, acrylonitriles and methacrylonitriles.

It is to be noted that specific examples of the copolymerizable monomer are the same as those described in the first embodiment and therefore explanations of these examples are omitted.

Also, specific examples (I-1) to (I-22) of the macromolecular compound of the present embodiment will be given: however, these examples do not limit the scope of the invention. The numerals described in each structural unit designate the polymerization molar ratio, wherein the value 100 indicates that the polymer is a homopolymer constituted only of the structural unit.

(I-1)

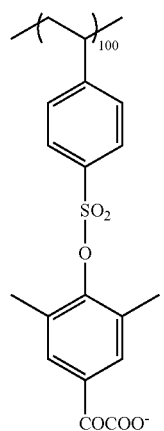
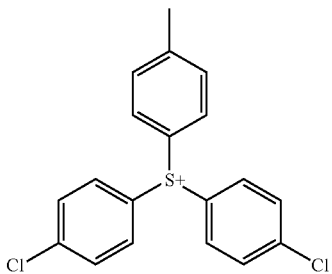

(I-2)

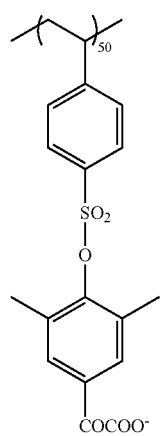
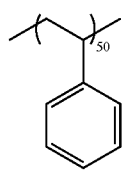

(I-3)

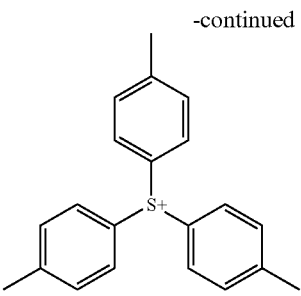
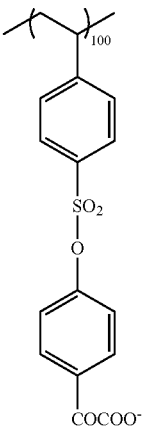

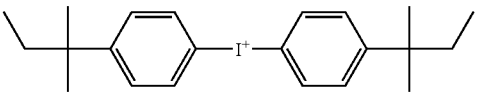

(I-4)

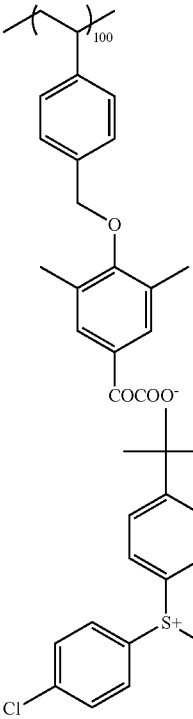

-continued
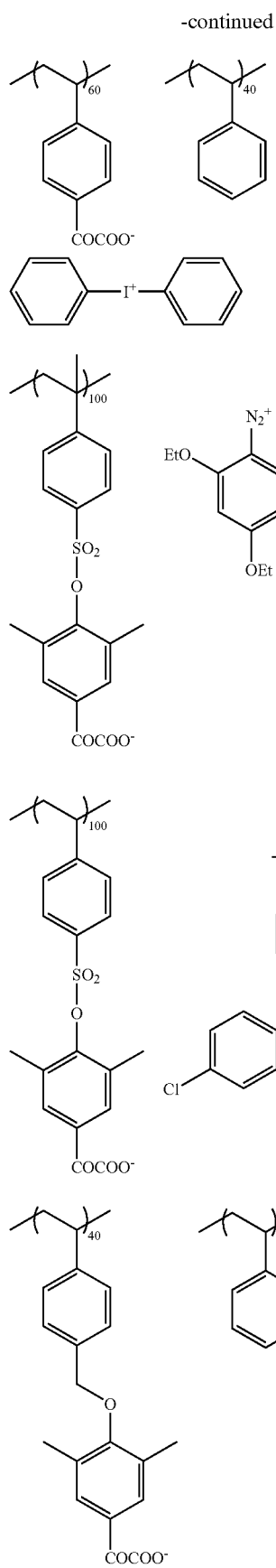
(I-5)
(I-6)
(I-7)
(I-8)
-continued
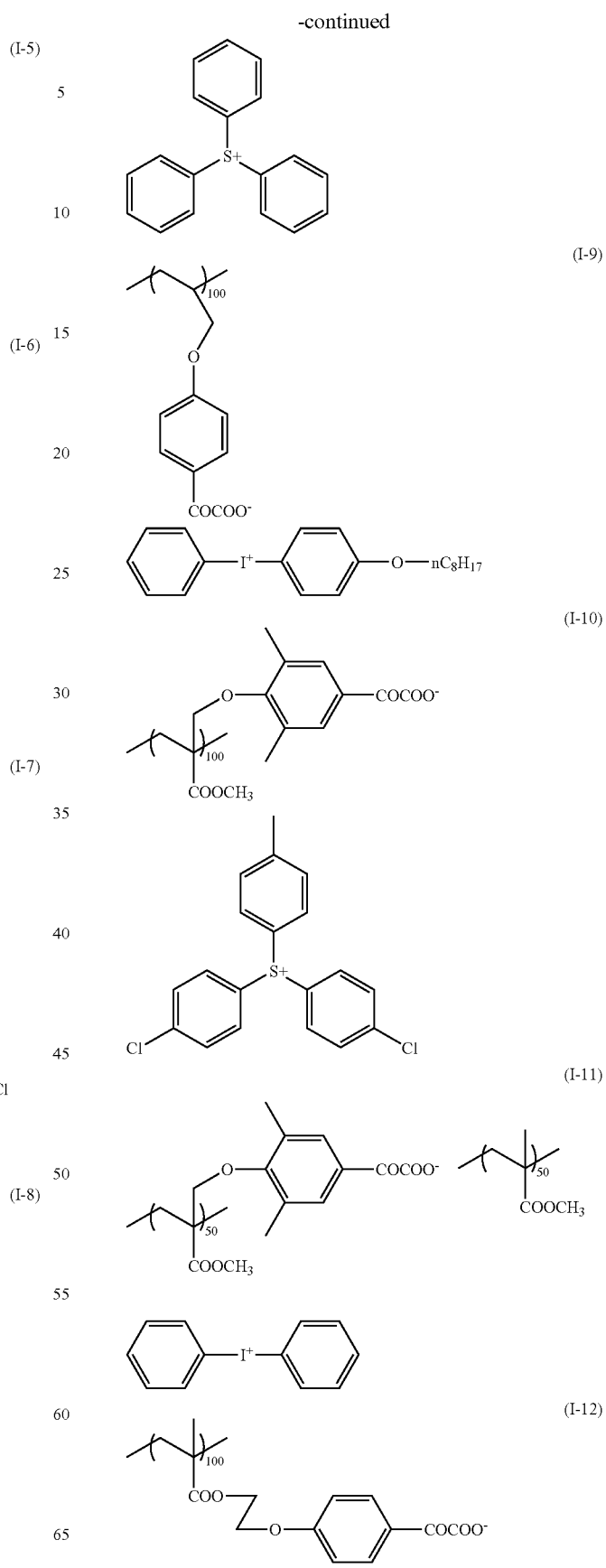
(I-9)
(I-10)
(I-11)
(I-12)

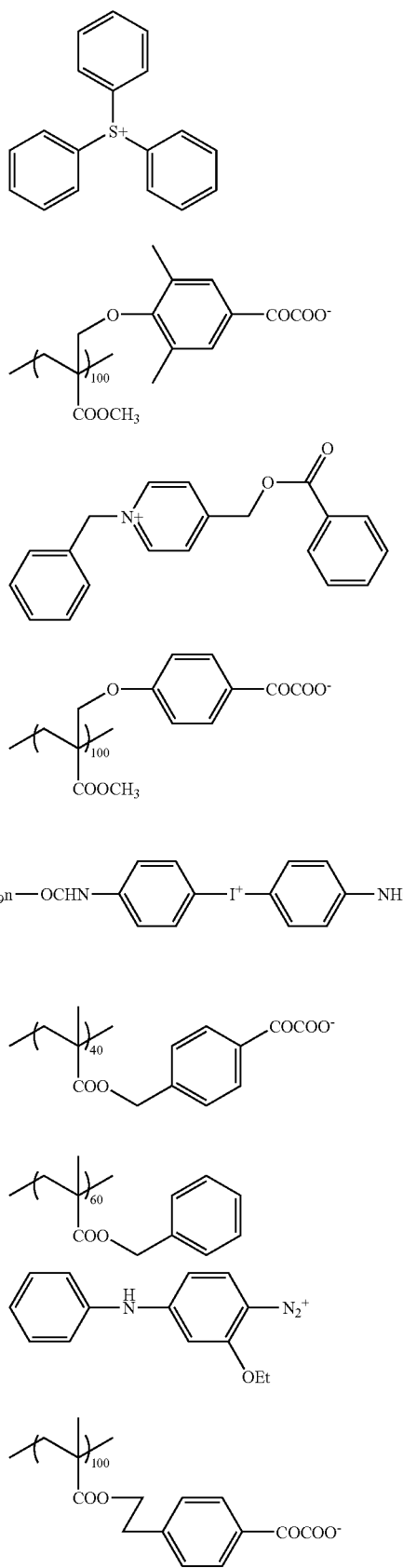
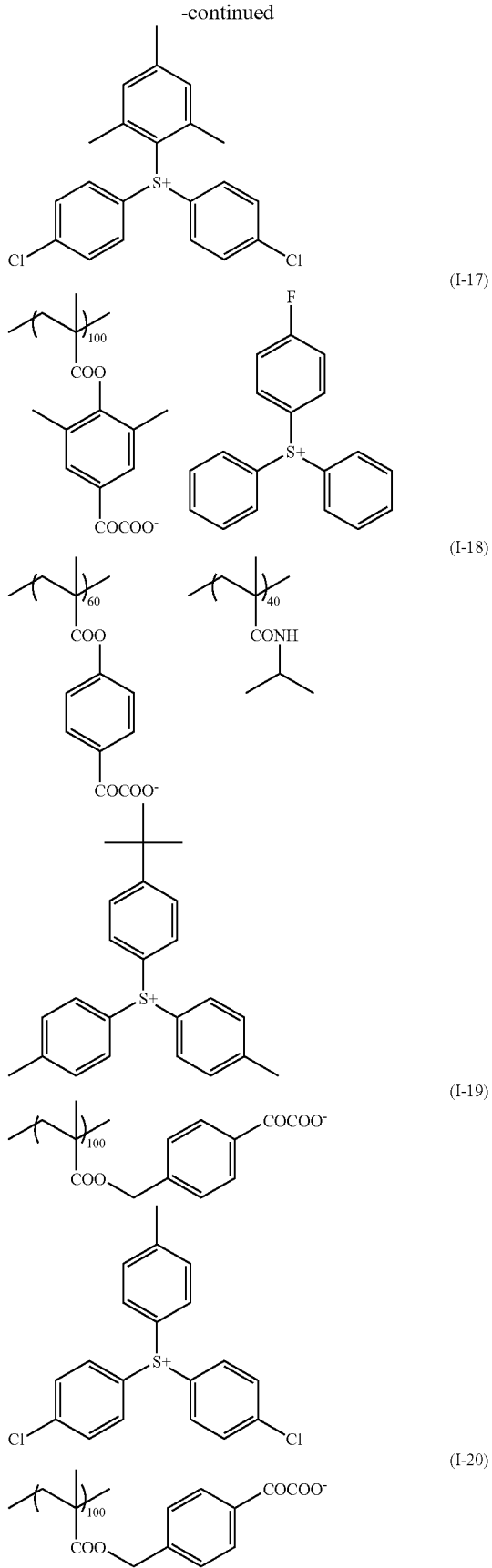

-continued

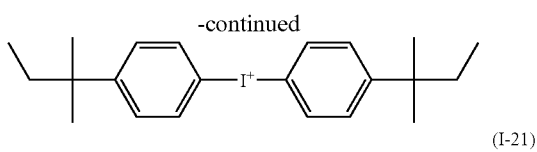

(I-21)

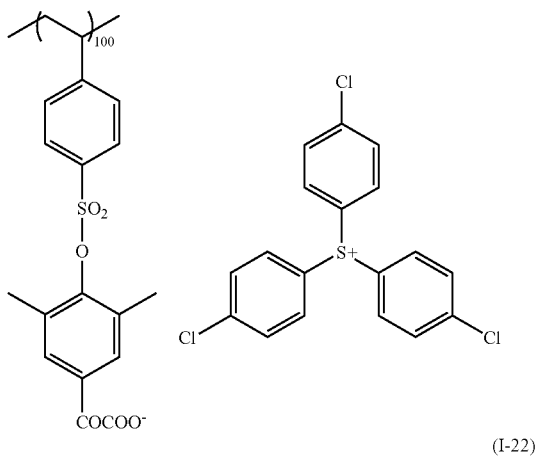

(I-22)

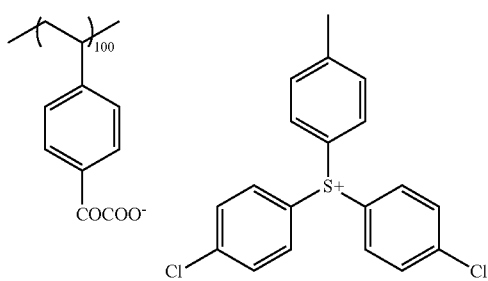

The macromolecular compound based on the present embodiment may be easily synthesized using a known method. For example, an intermediate, specifically, the compound into which a specific onium cation as a counter anion has not been introduced yet may be synthesized according to the method described in U.S. Pat. NO. 4,046,577. Then, the onium cation is introduced into the intermediate by using a known method, whereby the macromolecular compound of the invention can be obtained. The macromolecular compound may also be obtained by polymerizing oxo-(4-vinyl-phenyl)-acetic acid ethyl ester which can be obtained by the method described in J. Org. Chem. Vol. 52, 22 (1987), 5026, hydrolyzing the ester by using an aqueous alkali solution and then by introducing an onium cation by using a known method.

Also, the monomer used to synthesize the macromolecular compound of the present embodiment may be easily synthesized by introducing a glyoxyethyl group ($COCOOCH_2CH_3$) into a phenol compound and its derivative, a phenoxy compound and its derivative, a styrene compound and its derivative or an aromatic compound by a Friedel-Craft reaction and then by reacting the resulting product with a polymerizable compound such as styrenesulfonyl chloride, chloromethylstyrene, (meth)acrylic acid chloride or (meth)acrylic acid anhydride.

The macromolecular compound of the present embodiment may be preferably used for a polymerizable composition since a partial structure having a polymerization initiation function exists in its structure. Also, the macromolecular compound is cured highly sensibly by light or heat and is also superior in film characteristics. Therefore, the macromolecular compound can be preferably used for a composition capable of forming an image.

Examples of such an application of the macromolecular compound of the present embodiment are the same as in the case of the polymer initiator described in the first embodiment and therefore detailed explanations are omitted.

When such a polymerizable composition is exposed to light having a wavelength of 700 to 1200 nm, it preferably contains a compound (hereinafter referred to as an infrared absorber as the case may be) having a maximum absorption wavelength at 700 to 1200 nm. As the infrared absorber used here, it is preferable to use an infrared absorbing dye or pigment having an absorption maximum at a wavelength of 700 to 1200 nm from the viewpoint of adaptability to a high output laser which is easily available. The addition of these dyes or pigments enables the polymerizable composition to be preferably used for forming an image by an infrared laser in the case of using the composition for the recording layer of a planographic printing plate precursor.

Specific examples of such an infrared absorbing dye (especially, cyanine dyes and other dyes) or pigment are the same as the specific examples described in the first embodiment and therefore detailed explanations are omitted.

When such a polymerizable composition is used as a photopolymerizable composition, known sensitizers such as benzophenones such as benzophenone and its derivatives, cumarins such as cumarin 1 and cumarin 338, naphthalenes and merocyanines may be used together according to exposure wavelength as required.

(Application to a Planographic Printing Plate Precursor)

The polymerizable composition containing the novel macromolecular compound of the present embodiment will be described hereinafter as to the case where it is used for the recording layer of a planographic printing plate precursor.

The planographic printing plate precursor according to the present embodiment comprises a recording layer containing the macromolecular compound (having a function as a polymerization initiator) of the invention, a polymerizable compound and preferably, further an infrared absorber on a support and may also be provided with other layers such as an intermediate layer and a protective layer, if necessary. These intermediate layer and protective layer are the same as those described in the first embodiment and detailed explanations are therefore omitted.

(Binder Polymer)

In the planographic printing plate precursor according to the present embodiment, a binder polymer is preferably used in the recording layer. The binder polymer of the present embodiment is the same as the binder polymer described in the second embodiment and detailed explanations are therefore omitted.

A binder having an amide group as described in JP-A No. 11-171907 has superb developing ability and film strength and is therefore preferable.

Also, an optional amount of a linear organic macromolecular polymer may be blended in the whole composition. However, when the amount of the linear organic macromolecular polymer exceeds 90% by mass, preferable results are not obtained in the point of, for example, the strength of an image to be formed. The amount is preferably 30 to 85% by mass. The ratio by mass of the polymerizable compound (B) to the linear organic macromolecular polymer is preferably in the range of 1/9 to 7/3.

As the binder polymer in the present embodiment, a polymer which is substantially insoluble in water and soluble in an aqueous alkali solution is used. This ensures that any of organic solvents which are environmentally undesirable is not used or the amount of organic solvents to be used can be limited to a very small level. The acid value (acid content expressed by the number of chemical equivalents) per 1 g of a polymer) and molecular weight of the binder polymer like this are properly selected from the viewpoint of image strength and developing characteristics. The acid value is preferably 0.4 to 3.0 meq/g and the molecular weight is preferably in the range of 3000 to 500,000. It is more preferable that the acid value be in the range of 0.6 to 2.0 and the molecular weight be in the range of 10,000 to 300,000.

Other components suitable to the use and production method of each may be further appropriately added to the composition constituting the recording layer of the planographic printing plate precursor according to the present embodiment. For example, known additives such as a cosensitizer, polymerization inhibitor, colorants, inorganic fillers for improving the qualities of a cured film, other plasticizers and a fat sensitizer capable of improving inking characteristics of the surface of the recording layer may be added as desired.

The planographic printing plate precursor according to the present embodiment may be produced by applying the aforementioned recording layer coating solution and coating solutions prepared by dissolving coating solution components for desired layers such as a protective layer and resin intermediate layers which will be described later in a proper solvent, to a proper support.

The amount of the recording layer to be applied to the support, the support, the surface treatment of the support, exposure, developing and the like are the same as those in the aforementioned first embodiment and detailed explanations concerned are therefore omitted.

EXAMPLES

Examples of the present embodiment will be described hereinbelow: however these examples do not limit the scope of the present invention.

Example 1

Synthesis Example (I-1)

The results of the foregoing "Synthesis of a specific polymer initiator (I-1)" in the first embodiment were utilized.

Example 2

Synthesis of (I-7)

1.55 g of the following sulfonium salt was dissolved in 50 ml of methanol, to which was then added 0.72 g of silver oxide, and the mixture was stirred at room temperature for 4 hours. After the stirring was completed, the mixture was subjected to filtration and the filtrate was further subjected to filtration using a 0.1 μm filter. To the resulting filtrate was added dropwise a solution of 1.08 g of the polymer (C) obtained in Example 1, dissolved in 50 ml of acetone and 10 ml of methanol. After the addition was finished, the mixture was concentrated to precipitate a semisolid. The semisolid was washed with acetone and ethyl acetate to obtain 2.05 g of a solid (I-7). The obtained polymer was subjected to a TSK-GELα-column manufactured by Tosoh Corporation to measure its molecular weight, to find that Mw=6500. The results of elemental analysis are as follows: [Found (actual value): C, 64.5; H, 5.6; O, 12.5. Calc. (theoretical value): C, 64.9; H, 5.4; O, 12.3.].

It is possible to synthesize the compound (C) by using the same method as above or by using a known acid-containing polymer.

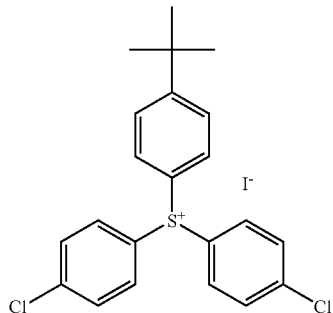

Example 3

Synthesis of (I-20)

10 g of polydilmethacrylate (Mw=18,000) was dissolved in 250 ml of nitrobenzene, to which was then added 100 ml of a nitrobenzene solution containing 9.6 g of ethyl chloroformate and 9.3 g of aluminum chloride under ice-cooling. The mixture was stirred for one hour under ice-cooling and for one hour at room temperature and then poured into 500 ml of 1N hydrochloric acid under ice-cooling. After the organic phase was extracted, solvents were removed by distillation under reduced pressure. The resulting solid was reslurried using diisopropyl ether, followed by filtration. 12.7 g of the resulting solid was thoroughly dried and then dissolved in 200 ml of 1-methoxy-2-propanol, to which was then added dropwise an aqueous alkali solution prepared by dissolving 2.7 g of potassium hydroxide in 80 ml of water, followed by stirring at room temperature for 2 hours. After the stirring was finished, the resulting mixture was poured into an aqueous 1N hydrochloric acid to precipitate a solid. After the solid was precipitated, the solid was subjected to filtration and dried to obtain a polymer (D).

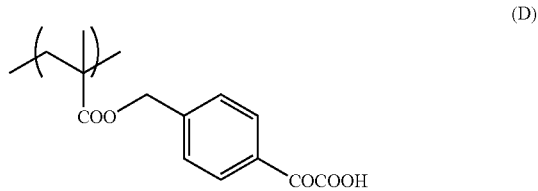

1.63 g of the iodonium salt as shown below was dissolved in 50 ml of methanol, into which 0.72 g of silver oxide was poured and the mixture was stirred at room temperature for 4 hours. After the stirring was finished, the mixture was subjected to filtration and the filtrate was further subjected to filtration using a 0.1 μm filter. To the resulting filtrate was added dropwise a solution of 0.74 g of the aforementioned polymer (D), dissolved in 50 ml of acetone and 10 ml of methanol. After the addition was finished, the mixture was concentrated to precipitate a semisolid. The semisolid was washed with acetone and ethyl acetate to obtain 1.98 g of (I-20). The obtained polymer was subjected to a TSK-GEL α-column manufactured by Tosoh Corporation, to measure its molecular weight, to find that Mw=64000. The results of elemental analysis are as follows:

[Found (actual value): C, 63.5; H, 6.9; O, 11.7. Calc. (theoretical value): C, 63.6; H, 6.8; O, 11.5.].

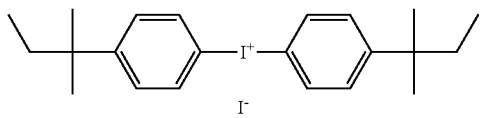

Example 4

Synthesis Example (I-10)

75 ml of an acetone solution containing 11.11 g of the above solid (A) and 8.95 g of methyl-2-(bromomethyl) acrylate was cooled to 0 to 5° C. and stirred. To the mixture was added dropwise 5.1 g of triethylamine. After the addition was finished, the clouded solution, as it was, was stirred at 0 to 5° C. for 1.5 hours and then further stirred at room temperature for 2 hours. The reaction solution was poured into 1N hydrochloric acid. The resulting solution was extracted with ethyl acetate, dried using sodium sulfate and then concentrated. The concentrated solution was subjected to column chromatography using ethyl acetate/hexane to separate, thereby obtaining 14.2 g of the following monomer. [NMR of the monomer] 300 MHz (CDCl$_3$) [δ: 1.43 (t 3H J=7.2 Hz), 2.32 (s 6H), 3.81 (s 3H), 4.45 (q 2H J=7.2 Hz), 4.55 (s 2H), 6.14 (d 1H J=1.4), 6.47 (dd 1H J=1.4), 7.70 (s 2H)]

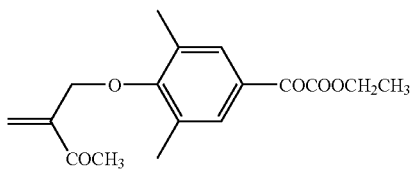

12 g of the above monomer was dissolved in 25 g of 1-methoxy-2-propanol and the mixture was stirred at 75° C. in a nitrogen atmosphere. 0.09 g of polymerization initiator V-601 manufactured by Wako Pure Chemical Industries, Ltd. was added to the mixture, which was then stirred for 4 hours and then cooled to room temperature. The cooled mixture was poured into 1 kg of a hexane solution containing 5% of 2-propanol to obtain 9.8 g of a polymer body. 9.8 g of the polymer was dissolved in 50 ml of 1-methoxy-2-propanol, to which was then added dropwise an aqueous solution containing 1.8 g of potassium hydroxide and 70 ml of water at room temperature, followed by stirring for 2 hours. The resulting mixture was poured into a mixed solution of 500 ml of ice water and 20 ml of concentrated hydrochloric acid to precipitate a solid of carboxylic acid. The solution containing the solid carboxylic acid was subjected to filtration and the separated precipitate was dried to obtain a polymer (E) having a COCOOH unit.

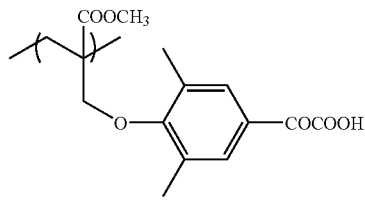

A sulfonium salt was introduced into the above polymer (E) in the same manner as in the case of obtaining the macromolecular compound (I-1) in the above Synthesis example 1, followed by washing with ethyl acetate to obtain 11.2 g of a macromolecular compound (I-10). The molecular weight of the macromolecular compound was measured, to find that Mw=55,000. The results of elemental analysis are as follows: [Found (actual value): C, 64.4; H, 7.0; O, 14.6. Calc. (theoretical value): C, 64.8; H, 6.8; O, 14.4.].

Example 5

Synthesis Example of (I-22)

10.2 g of oxo-(4-vinyl-phenyl)-acetic acid ethyl ester synthesized by the method described in J. Org. Chem. Vol. 52, 22 (1987), 5026-5030 was dissolved in 21 g of 1-methoxy-2-propanol and the mixture was stirred at 75° C. in a nitrogen atmosphere. 0.25 g of polymerization initiator V-601 manufactured by Wako Pure Chemical Industries, Ltd. was added to the mixture, which was then stirred for 4 hours and then cooled to room temperature. The cooled mixture was poured into 300 ml of water, and the resulting solid was filtered and dried. The solid was subjected to alkali hydrolysis in the same manner as in the method described in the aforementioned Synthesis example (I-10) of Example 4, to obtain the following polymer (F). A sulfonium salt was introduced into the above polymer (F) in the same manner as in the case of obtaining the macromolecular compound (I-1) in the above Synthesis example 1, followed by washing with ethyl acetate, to obtain 12.1 g of a macromolecular compound (I-22). The molecular weight of the macromolecular compound was measured, to find that Mw=55, 000. The results of elemental analysis are as follows: [Found (actual value): C, 67.5; H, 5.4; O, 9.0. Calc. (theoretical value): C, 67.5; H, 5.1; O, 8.7.].

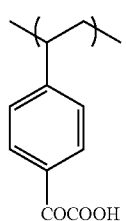

Example 6

Synthesis Example (I-8)

22.22 g of the above solid (A) was dissolved in 75 ml of dimethylacetamide. 4 g of sodium hydroxide was poured into the mixture and 18.3 g of 4-chloromethylstyrene was added to the resulting mixture, followed by stirring at 100° C. for 2 hours. The reaction solution was poured into 1N hydrochloric acid and then subjected to extraction using ethyl acetate. The extract was dried using sodium sulfate, then concentrated and subjected to column chromatography using ethyl acetate/hexane to separate, thereby obtaining 7.5 g of the following monomer. [NMR of the monomer] 300 MHz (CDCl$_3$) [δ: 1.43 (t 3H J=7.2 Hz), 2.33 (s 6H), 4.45 (q 2H J=7.2 Hz), 4.86 (s 2H), 5.29 (d 1H J=10.8), 5.79 (d 1H J=17.7), 6.74 (dd 1H J=10.8 17.7), 7.26–2.46 (m 4H), 7.71 (s 1H)]

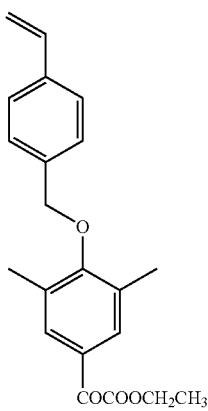

13.54 g of the aforementioned monomer and 6.25 g of styrene were dissolved in 30.2 g of 1-methoxy-2-propanol. 0.50 g of a polymerization initiator V-65 manufactured by Wako Pure Chemical Industries, Ltd. was added to the mixture. The resulting mixture was added dropwise to 10 g of 1-methoxy-2-propanol at 70° C. over 2 hours in a nitrogen atmosphere. The mixture was further stirred for 2 hours. Then, the mixture was poured into 500 ml of water, which was then subjected to filtration and dried. The resulting mixture was subjected to alkali hydrolysis in the same manner as in the method described in the Synthesis example (I-10) of Example 4, to obtain the following polymer (G).

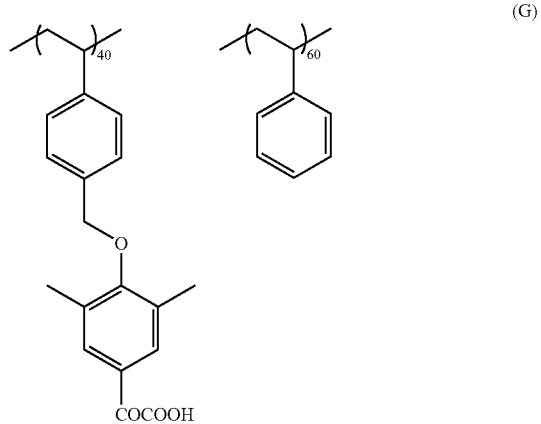

(G)

Using the polymer (G) and a triphenylsulfonium-bromo salt as a sulfonium salt, salt exchange was carried out in the same method as was used in obtaining the macromolecular compound (I-1) in the aforementioned Synthesis example 1, to obtain 22.6 g of a macromolecular compound (I-8). The molecular weight of the macromolecular compound was measured, to find that Mw=24,000. The results of elemental analysis are as follows: [Found (actual value): C, 85.2; H, 9.0; O, 4.2. Calc. (theoretical value): C, 84.8; H, 8.9; O, 4.3.].

(Applied Example)

In order to clarify the usefulness of the novel macromolecular compound of the invention, various applied examples using polymerizable compositions containing the macromolecular compound will be described hereinbelow.

(Applied Example A)

The following polymerizable composition coating solution was applied, by coating, to a polyethylene terephthalate film (thickness: 0.1 mm) as a support and dried at 110° C. for 25 seconds to obtain a coating film having a coating amount of 1.5 g/m².

| | |
|---|---|
| Allylmethacrylate/methylmethacrylate (50/50) Mw = 80,000 | 1.1 g |
| Pentaerythritol tetraacrylate | 1.0 g |
| Macromolecular compound (I-1) of the invention | 0.5 g |
| Fluorine type nonionic surfactant (Megafack F-176, manufactured by Dainippon Ink and Chemicals, Incorporated) | 0.01 g |
| Methyl ethyl ketone | 10 g |
| 2-Propanol | 9 g |

The above coating film was heated at 200° C. for 2 minutes to obtain a cured film.

The resulting cured film was measured using an instrument in which an AFM (interatomic force microscope) SPA 300 manufactured by Seiko Instruments Inc. was equipped with a forced instrument Triboscope manufactured by HYS-ITRON. The higher value represents the higher hardness. As a result, the hardness of the film was 1.3 GPa. For comparison, a polymerizable composition using the following sulfonium salt as a polymerization initiator component, in place of the macromolecular compound (I-1) of the invention, was formed as a film in the same manner to measure the hardness, to find that the hardness is 0.9 GPa. It is found from this results that the polymerizable composition using the macromolecular compound of the invention has excellent film hardenability.

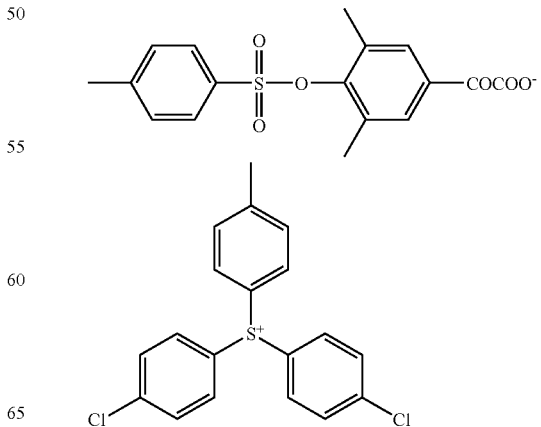

[Production of a Substrate]

An aluminum plate (Material 1050) 0.3 mm in thickness was washed with trichloroethylene to degrease. Then, the surface of the aluminum plate was roughned using a nylon brush and a 400 mesh pumice-water suspension, for etching. After washed with water, the plate was dipped in 20% nitric acid for 20 seconds and then washed with water. The etched amount of the roughened surface at this stage was about 3 g/m$^2$.

Next, the plate was treated with 7% sulfuric acid as an electrolyte at a current density of 15 A/dm$^2$ to form 3 g/m$^2$ of a d.c. electrode oxide film, then washed with water and dried to produce a substrate (A) as a support.

The support was coated with the following polymerizable composition and dried at 115° C. for 25 seconds to form a coating film having a coating amount of 1.4 g/m$^2$, thereby obtaining an image forming material.

| | |
|---|---|
| Allylmethacrylate/methylmethacrylate/methacrylic acid (55/30/15) Mw = 100,000 | 1.0 g |
| Dipentaerythritol hexaacrylate | 1.0 g |
| Macromolecular compound (I-3) of the invention | 0.3 g |
| Fluorine type nonionic surfactant (Megafack F-177, manufactured by Dainippon Ink and Chemicals, Incorporated) | 0.02 g |
| Dye prepared by using a 1-naphthalenesulfonic acid anion as the counter anion of Victoria Pure Blue BOH | 0.04 g |
| Methanol | 4 g |
| Cyclohexanone | 10 g |
| 1-Methoxy-2-propanol | 9 g |

A Fuji Step Guide (gray scale whose transmission optical density changes discontinuously in the condition of ΔD=0.15) manufactured by Fuji Photo Film Co., Ltd. was tightly brought into contact with the image forming material obtained in this manner. The image forming material was irradiated with light from a ultraviolet radiator (ultra-high pressure mercury lamp 500 W1 lamp, irradiation distance: 30 cm) manufactured by Ushio Inc. for 15 seconds. The image forming material was then subjected to development using a developer DN-3C (diluted with water in a ratio of 1:2) manufactured by Fuji Photo Film Co., Ltd. at 30° C. The number of steps of the step guide, at which step there had been no change in image density before and after exposure, was counted. The higher the number of steps of the step guide was, the higher the sensitivity. The number of steps of the step guide was 9 (steps). A polymer as shown below was used in place of the macromolecular compound (I-3) of the invention in the aforementioned polymerizable composition, to obtain an image forming material in the same manner as above. The resulting image forming material was evaluated, with the result that the number of steps of the step guide was 5. It is found from these results that the use of the macromolecular compound having a polymerization initiation function according to the invention enables highly sensitive recording.

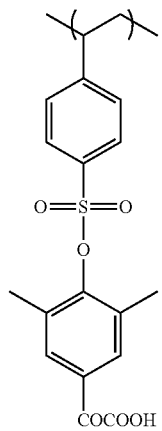

(Applied Example C)

An image forming material was obtained in the same manner as in the aforementioned Applied Example B, except that the dye shown below was added to the coating solution of the polymerizable composition and (I-7) was used in place of the macromolecular compound (I-3) of the present invention in the Applied Example B.

(I)

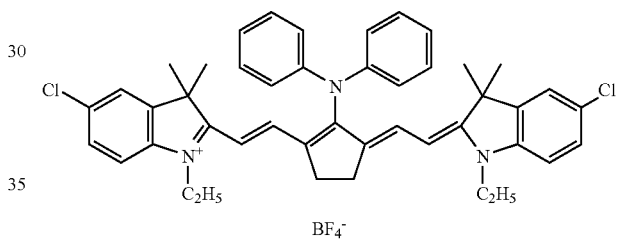

The image forming material obtained in this manner was exposed to light by using Trendsetter 3244 V manufactured by Creo in the condition of 6.5 W and 150 rpm, to measure the hardness of the coating film in the exposed region according to the method described in the aforementioned Applied Example A, to find that the hardness was 1.2 GPa. For comparison, a polymerizable composition using the following sulfonium salt as a polymerization initiator component in place of the macromolecular compound (I-7) of the invention was formed as a film, in the same manner, to measure the hardness of the cured film, to find that the hardness was 0.8 GPa. It is found from this results that the polymerizable composition using the macromolecular compound of the invention has excellent film hardenability.

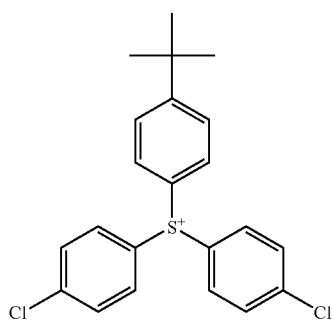

-continued

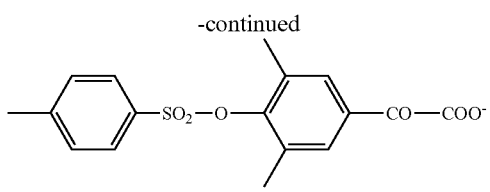

It is found from each of the above Applied Examples that the polymerizable composition using the macromolecular compound of the invention has high curability, enables the formation of a highly hard film and can be cured with high sensitivity and is therefore useful as a polymerization initiation component of polymerizable compositions which are preferably applicable to various image forming materials.

To state in short, the polymerizable composition of the invention has such an effect that it has high curability and is useful for the recording layer of a negative type planographic printing plate precursor, and further, the planographic printing plate precursor of the invention which uses the polymerizable composition as a recording layer has high printing durability and enables highly sensitive recording.

What is claimed is:

1. A polymerizable composition comprising:
   (1) a compound for generating a radical using light or heat;
   (2) a polymerizable compound; and
   (3) an infrared absorber, wherein;
   the molecular weight of the compound (1) generating a radical is at least 1,000 and no more than 50,000,
   wherein the radical generating compound (1) comprises a macromolecular compound, which includes, at a side chain thereof, a structure represented by the following general formula (I), $Z^-M^+$   General formula (I)

wherein $Z^-$ represents $COCOO^-$, $COO^-$, $SO_3^-$ or $SO_2$—$N^-$—R where R represents a monovalent organic group and $M^+$ represents an onium cation.

2. A polymerizable composition according to claim 1, wherein the macromolecular compound, which includes a structure represented by the general formula (I), has a structural unit represented by the following general formula (II):

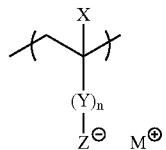

(II)

wherein X represents a hydrogen atom, a monovalent organic group, a hydroxyl group, a urethane group, a urea group, a halogen atom, an amino group, an amide group, a sulfonyl group or a sulfonate group, Y represents a divalent organic connecting group, n denotes 0 or 1, $Z^-$ represents $COCOO^-$, $COO^-$, $SO_3^-$ or $SO_2$—$N^-$—R where R represents a monovalent organic group and $M^+$ represents an onium cation.

3. A polymerizable composition according to claim 1, wherein $Z^-$ of the macromolecular compound represents $COCOO^-$.

4. A polymerizable composition according to claim 1, wherein $M^+$ of the macromolecular compound is selected from sulfonium, iodonium, diazonium and azinium.

5. A polymerizable composition according to claim 1, wherein the amount of the component (I) in the polymenzable composition is in a range of 0.5 to 50% by mass as a solid.

6. A planographic printing plate precursor comprising:
   a support; and
   a recording layer disposed on the support, wherein;
   the recording layer includes the polymerizable composition of claim 1.

7. A planographic printing plate precursor according to claim 6, wherein the polymerizable composition further includes (C) a compound having a maximum absorption wavelength at 700 to 1200 nm.

* * * * *